United States Patent [19]

Hattori

[11] Patent Number: 5,442,578
[45] Date of Patent: Aug. 15, 1995

[54] CALCULATING CIRCUIT FOR ERROR CORRECTION

[75] Inventor: Masayuki Hattori, Kanagawa, Japan

[73] Assignee: Sony Corporation, Tokyo, Japan

[21] Appl. No.: 989,035

[22] Filed: Dec. 10, 1992

[30] Foreign Application Priority Data

Dec. 12, 1991 [JP] Japan .................................. 3-350753
Dec. 12, 1991 [JP] Japan .................................. 3-350759

[51] Int. Cl.⁶ ........................ G06F 7/00; G06F 15/00
[52] U.S. Cl. ................................. 364/746.1; 371/37.1
[58] Field of Search ................... 371/37.1; 364/746.1, 364/761, 754, 765

[56] References Cited

U.S. PATENT DOCUMENTS

| | | | |
|---|---|---|---|
| 4,975,867 | 12/1990 | Weng | 364/746.1 |
| 4,989,171 | 1/1991 | Hollmann | 364/746.1 |
| 4,994,995 | 2/1991 | Anderson et al. | 364/746.1 |

OTHER PUBLICATIONS

Howard M. Shao, et al. "A VSLI Design of a Pipeline Reed Solomon Decoder" IEEE Trans on Computers vol. C-34, May 1985.
UK Patent Application GB 2 259 378 A (Hattori).

*Primary Examiner*—Paul P. Gordon
*Assistant Examiner*—Emmanuel L. Moise
*Attorney, Agent, or Firm*—Jay H. Maioli

[57] ABSTRACT

A Euclidean mutual division circuit that has $(2t+1)$ calculation units and $(2t+3)$ registers for error correction where t is the number of symbols that can be error-corrected. The division unit and each calculation unit conduct Euclidean mutual divisions of either a normal-connection, a cross-connection, or a shift-connection division as directed by a control unit. The final calculation unit outputs a value to a division unit which divides it by another value, then the result of the division is returned to each of the calculation units. Registers that store the inputs for the Euclidean mutual division method include A-side and B-side registers. A-side registers store the coefficients of polynomials $Qi(X)$ and $\lambda i(X)$, and B-side registers store those of $Ri(X)$ and $\mu i(X)$. The Euclidean mutual division circuit has a reduced circuit scale for high-speed operation and for increased throughput.

6 Claims, 32 Drawing Sheets

[Step 1] [Coefficient of Degree 3 of $R_0(X): \alpha^8 \neq 0 \quad d(R_0) < d(Q_0)$ ∴ Crossed]

[Step 2] [$d(R_1) \not< d(Q_1)$ ∴ Not Crossed]

F I G. 5
(PRIOR ART)     [Step 3]   $\begin{bmatrix} d(R2) < d(Q2) \\ \text{Coefficent of Degree 2 of} \\ R2(X): \alpha^6 \neq 0 \\ \therefore \text{Crossed} \end{bmatrix}$
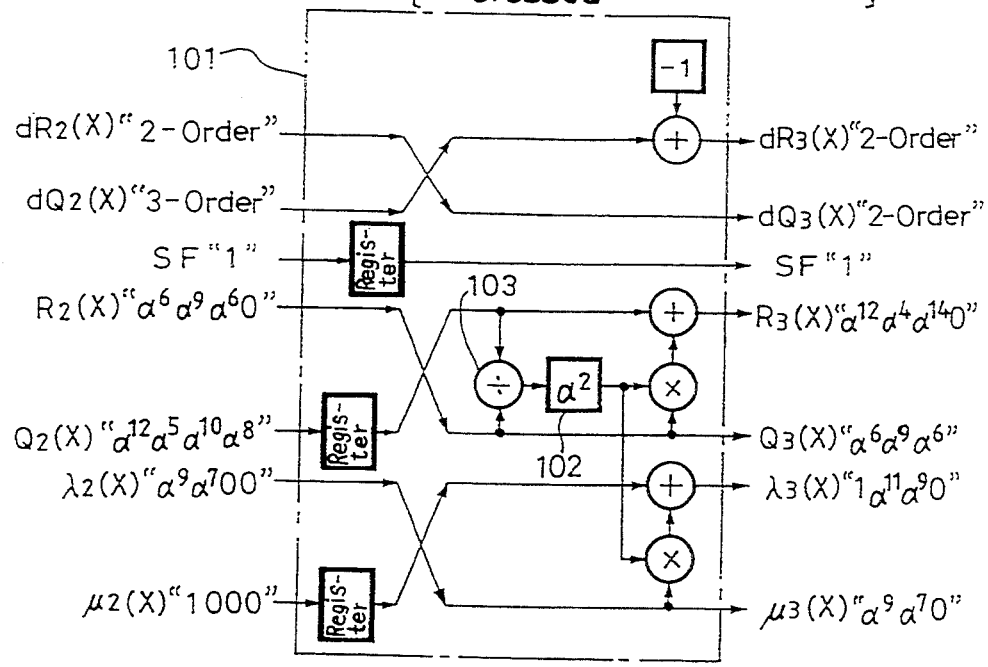
F I G. 6
(PRIOR ART)     [Step 4]   $\begin{bmatrix} d(R3) \not< d(Q3) \\ \therefore \text{Not Crossed} \end{bmatrix}$
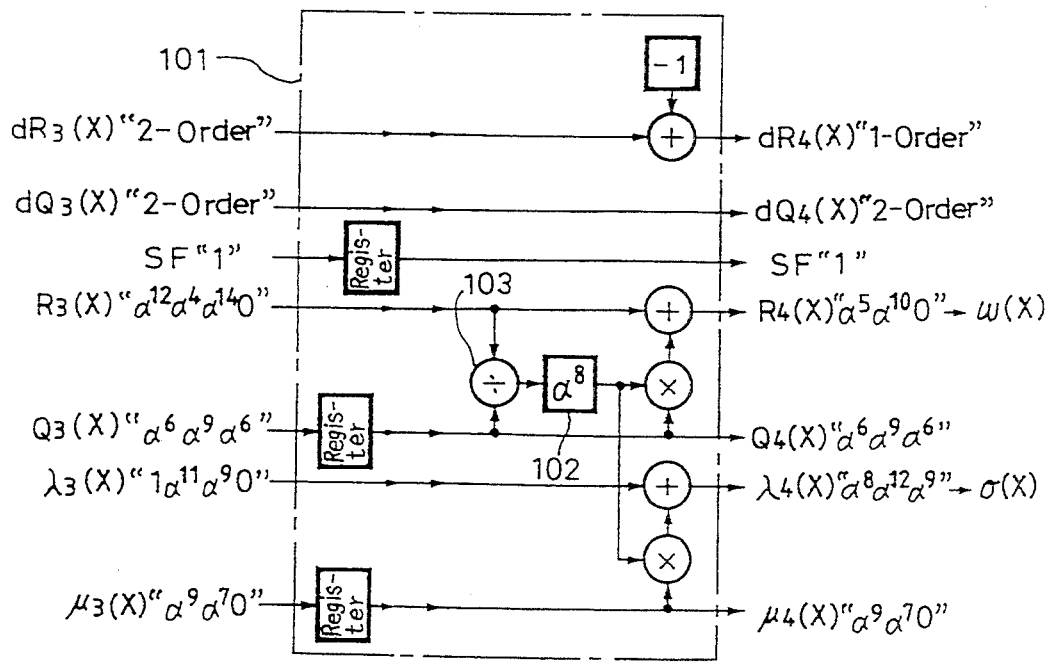

[Initialized → Step 1]

$\begin{bmatrix} DR < DQ, \text{ and Degree} \\ \text{of } DR \text{ of } R(X) \text{ is} \\ \text{not } 0 \\ \therefore \text{ Cross Mode} \end{bmatrix}$ · Calculation Unit $135_1 \sim 135_3$
  $A' = A \cdot S + B$
  $B' = A$ · Calculation Unit $135_4$
  $A' = B$
  $B' = A$ · Calculation Unit $135_5$
  $A' = B$
  $B' = B \cdot S + A$

[Step—Step2]
[DR 4 DQ]
[∴ Normal Mode]

Calculation Units
$135_1 \sim 135_3$
$A' = B \cdot S + A$
$B' = B$

Calculation Units
$135_4 \sim 135_5$
$A' = A$
$B' = A \cdot S + B$

[Step 2 → Step 3]

$\begin{bmatrix} DR < DQ, \text{ And Degree of} \\ DR \text{ of } R(X) \text{ Is Not } 0 \\ \therefore \text{Cross Mode} \end{bmatrix}$

- Calculation Units $135_1 \sim 135_2$
  $A' = A \cdot S + B$
  $B' = A$

- Calculation Unit $135_3$
  $A' = B$
  $B' = A$

- Calculation Units $135_4 \sim 135_5$
  $A' = B$
  $B' = B \cdot S + A$

[Step 3 → Step 4]
[DR ≮ DQ
∴ Normal Mode]

· Calculation Units $135_1 \sim 135_2$
  $A' = B \cdot S + A$
  $B' = B$

· Calculation Units $135_3 \sim 135_5$
  $A' = A$
  $B' = A \cdot S + B$

[After Step 4]
[DR < t
∴ Finished]

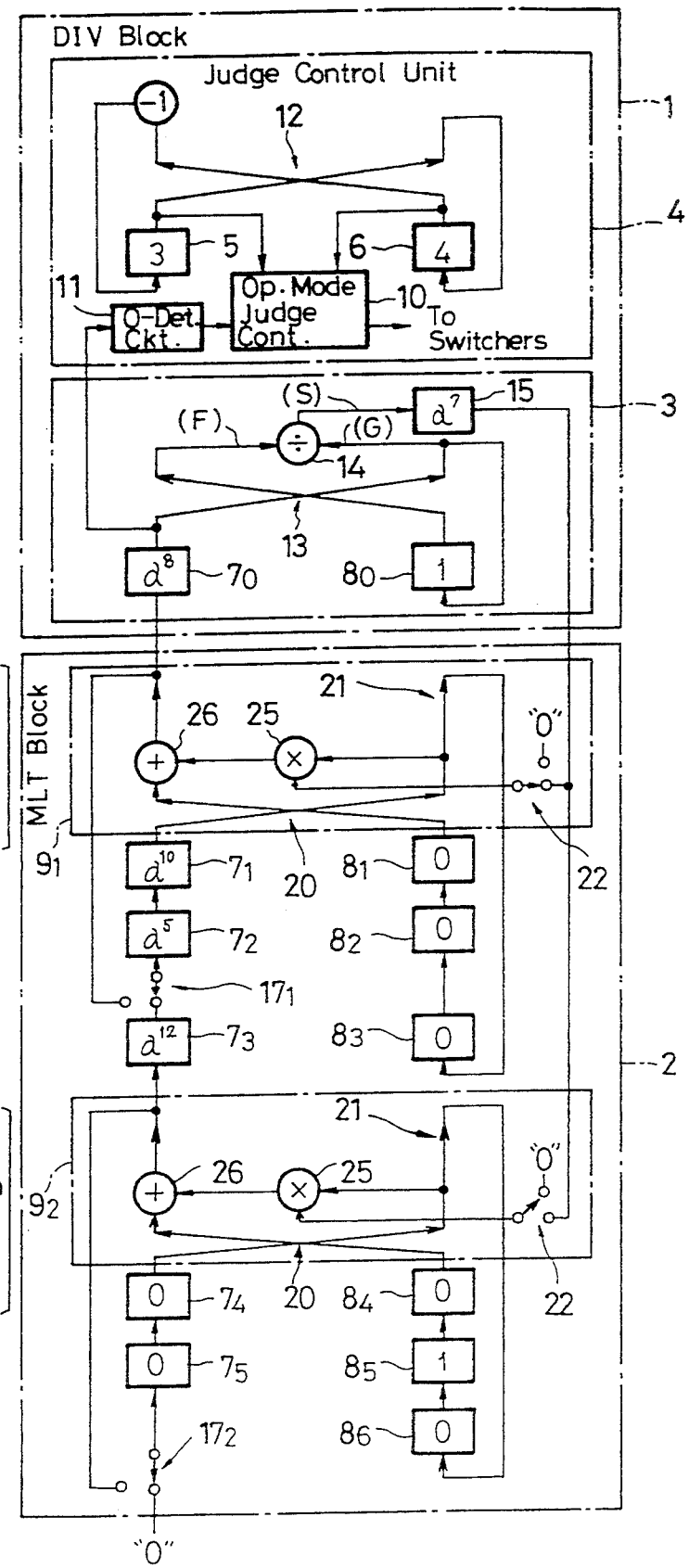

FIG.23

[1st Step]
[1st Clock Cycle]
$\begin{bmatrix} DR<DQ, \text{ And Coefficient} \\ \text{of Degree DR of R(X)} \\ \text{Is Not 0} \\ \therefore \text{Cross Mode} \end{bmatrix}$

[· Calcucation Unit $9_1$]
$\begin{bmatrix} \text{· Coefficients Stored in} \\ \text{Registers } 7_1, 8_1 \text{ Are} \\ \text{Calcucated in Calculation} \\ \text{Mode 1} \\ \text{· A'= A} \times \text{S + B} \\ \text{· B'= A} \end{bmatrix}$

[· Calculation Unit $9_2$]
$\begin{bmatrix} \text{· Coefficients Stored in} \\ \text{Registers } 7_4, 8_4 \text{ Are} \\ \text{Calculated in Calculation} \\ \text{Mode 2} \\ \text{· A'= B} \\ \text{· B'= A} \end{bmatrix}$

[1st Step]
[2nd Clock Cycle]
[Cross Mode]

[·Calculation Unit 91]
[·Coefficients Stored in Registers 72, 82 are Calculated in Calculation Mode 1
· A' = A × S + B
· B' = A]

[·Calculation Unit 92]
[·Coefficients Stored in Registers 75, 85 are Calculated in Calculation Mode 3
· A' = B
· B' = B × S + A]

[1st Step]
[3rd Clock Cycle]
[Cross Mode]

[· Calculation Unit $9_1$]

- Coefficients Stored in Registers $7_3, 8_3$ are Calculated in Calculation Mode 1
- $A' = A \times S + B$
- $B' = A$

[· Calculation Unit $9_2$]

- Coefficient Stored in Register $8_6$ is Not Calculated
- $A' = B$
- $B' = A$

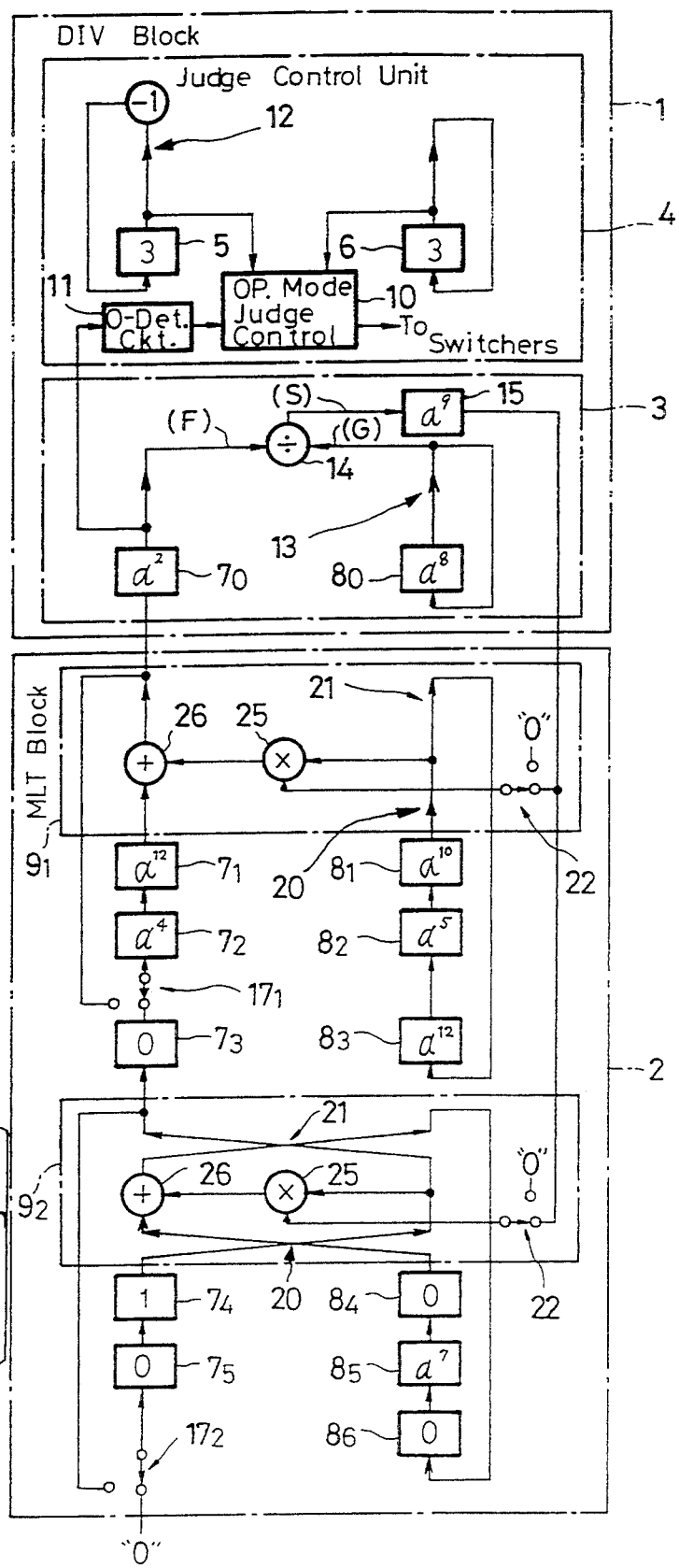

FIG.26

[2nd Step]
[1st Clock Cycle]
$\begin{bmatrix} DR \geq DQ \\ \therefore \text{Normal Mode} \end{bmatrix}$

[·Calculation Unit $9_1$]
$\begin{bmatrix} \text{·Coefficients Stored in} \\ \text{Registers } 7_4, 8_4 \text{ are} \\ \text{Calculated in Calculation} \\ \text{Mode 4} \\ \cdot A' = B \times S + A \\ \cdot B' = B \end{bmatrix}$

[·Calculation Unit $9_2$]
$\begin{bmatrix} \text{·Coefficients Stored in} \\ \text{Registers } 7_4, 8_4 \text{ are} \\ \text{Calculated in Calculation} \\ \text{Mode 6} \\ \cdot A' = A \\ \cdot B' = A \times S + B \end{bmatrix}$

[2nd Step]
[2nd Clock Cycle]
[Normal Mode]

- Calculation Unit $9_1$
- Coefficients Stored in Registers $7_2$, $8_2$ Are Calculated in Calculation Mode 4
  - $A' = B \times S + A$
  - $B' = B$

- Calculation Unit $9_2$
- Coefficients Stored in Registers $7_5$, $8_5$ Are Calculated in Calculation Mode 6
  - $A' = A$
  - $B' = A \times S + B$

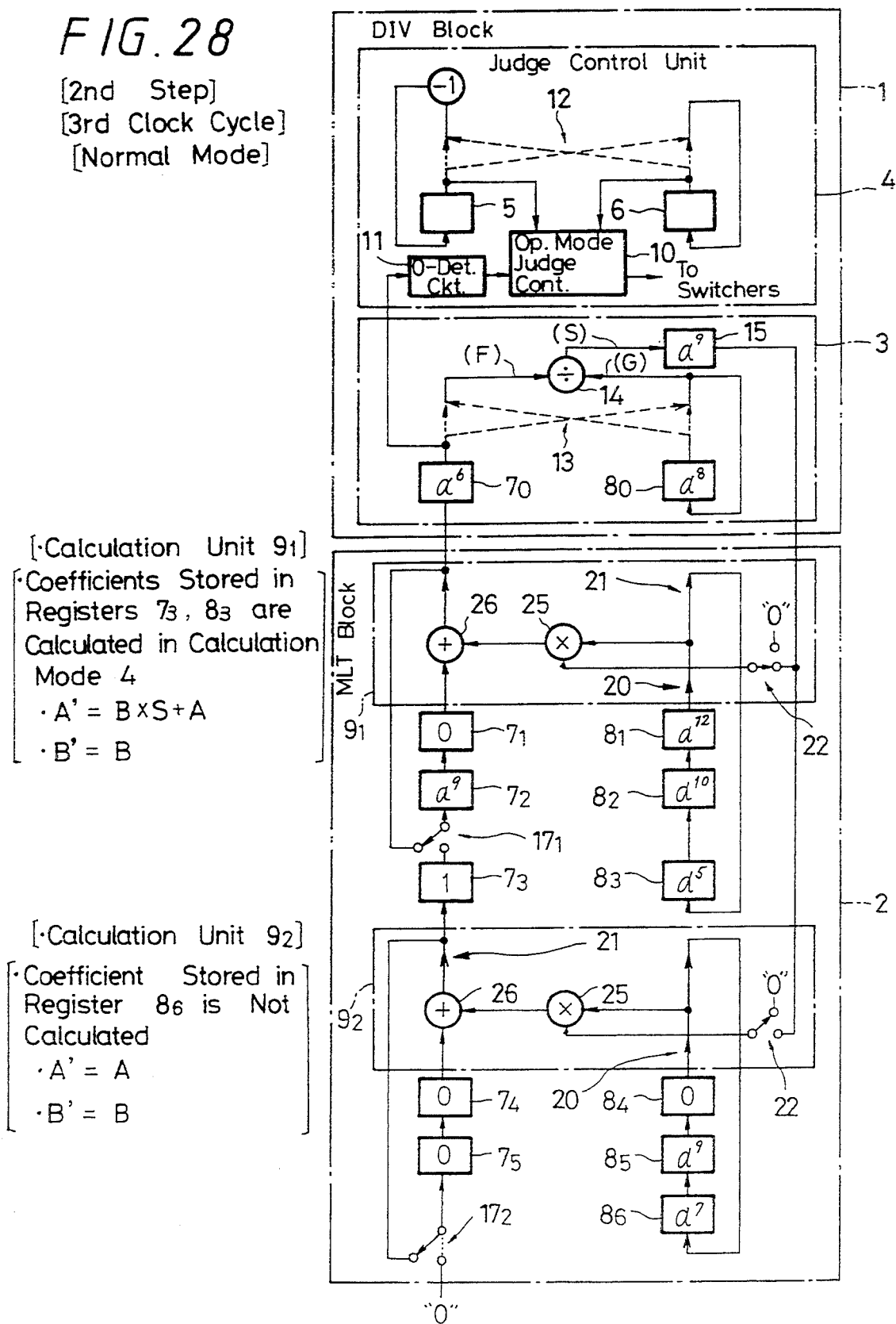

FIG. 29

[3rd Step]
[1st Clock Cycle]

$\begin{bmatrix} DR<DQ, \text{ And Coefficient} \\ \text{of Degree DR of R(X)} \\ \text{Is Not 0} \\ \therefore \text{Cross Mode} \end{bmatrix}$

[Calculation Unit $9_1$]
- Coefficients Stored in Registers $7_1, 8_1$ are Calculated in Calcucation Mode 1
- $A' = A \times S + B$
- $B' = A$

[Calculation Unit $9_2$]
- Coefficients Stored in Registers $7_4, 8_4$ are Calculated in Calculation Mode 3
- $A' = B$
- $B' = B \times S + A$

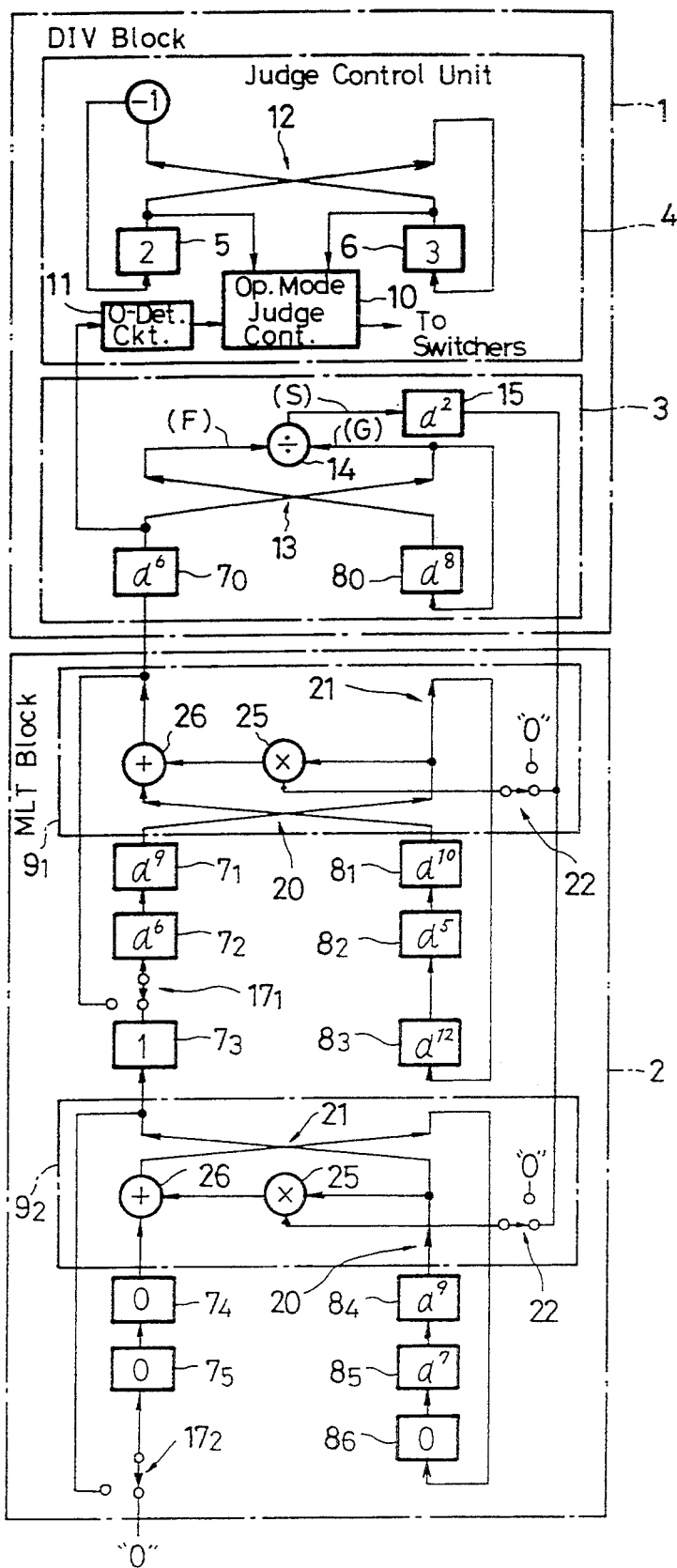

[3Rd Step]
[2Nd Clock Cycle]
[∴ Cross Mode]

[Calculation Unit $9_1$]

⎡Coefficients Stored in⎤
⎢Registers $7_2, 8_2$ are⎥
⎢Calculated in        ⎥
⎢Calculation Mode 1   ⎥
⎢· $A' = A \times S + B$⎥
⎣· $B' = A$           ⎦

[Calcucation Unit $9_2$]

⎡Coefficients Stored in⎤
⎢Registers $7_5, 8_5$ are⎥
⎢Calculated in        ⎥
⎢Calculation Mode 3   ⎥
⎢· $A' = B$           ⎥
⎣· $B' = B \times S + A$⎦

[3rd Step]
[3rd Clock Cycle]
[∴ Closs Mode]

[·Calculation Unit $9_1$]
[·Coefficients Stored in Registers $7_3, 8_3$ are Calculated in Calculation Mode 2
 ○ A'= B
 · B'= A]

[·Calculation Unit $9_2$]
[·Coefficients Stored in Registers $8_6$ is Not Calculated
 · A'= A
 · B'= B]

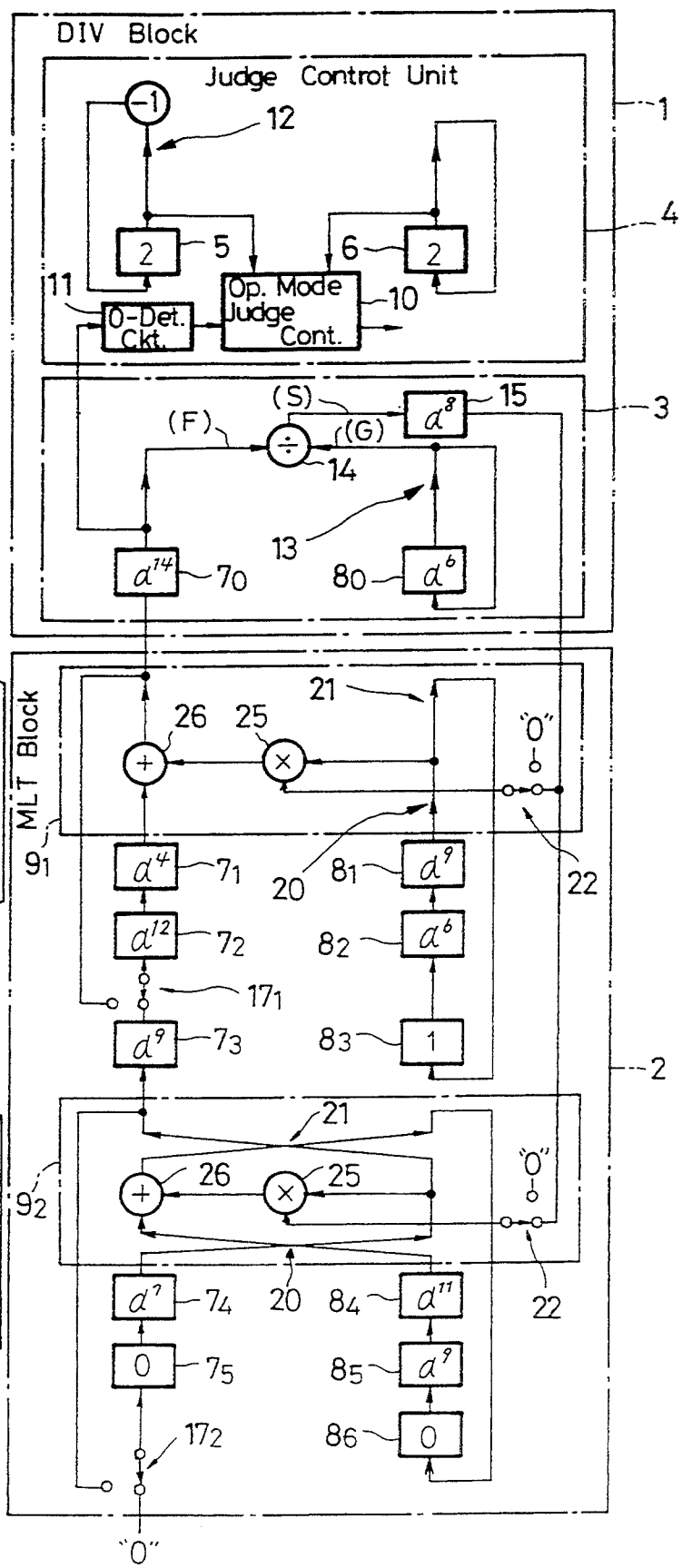

FIG. 32
[4th Step]
[1st Clock Cycle]
$$\begin{bmatrix} DR \geqq DQ \\ \therefore \text{Normal Mode} \end{bmatrix}$$

[Calculation Unit $9_1$]
$$\begin{bmatrix} \text{Coefficients Stored in} \\ \text{Registers } 7_1, 8_1, \text{ are} \\ \text{Calculated in Calculation} \\ \text{Mode 4} \\ \cdot A' = B \times S + A \\ \cdot B' = B \end{bmatrix}$$

[Calculation Unit $9_2$]
$$\begin{bmatrix} \text{Coefficients Stored in} \\ \text{Registers in } 7_4, 8_4 \text{ are} \\ \text{Calculated in Calculation} \\ \text{Mode 6} \\ \cdot A' = A \\ \cdot B' = A \times S + B \end{bmatrix}$$

[4th Step]
[2nd Clock Cycle]
[Normal Mode]

[· Calculation Unit $9_1$]
- Coefficients Stored in Registers $7_2, 8_2$ are Calculated in Calculation Mode 4
- $A' = B \times S + A$
- $B' = B$

[· Calculation Unit $9_2$]
- Coefficients Stored in Registers $7_5, 8_5$ are Calculated in Calcucation Mode 6
- $A' = A$
- $B' = A \times S + B$

[4th Step]
[3rd Clock Cycle]
[Normal Mode]

[Calculation Unit $9_1$]
[Coefficients Stored in Registers $7_3$, $8_3$ Are Calculated in Calcucation Mode 6
· A' = A
· B' = A×S + B]

[Calculation Unit $9_2$]
[Coefficient Stored in Register $8_6$ is Not Calculated
· A' = A
· B' = B]

[After Finished]
[δ(X), ω(X) are Determined in Registers $7_0, 7_1, 8_3, 8_4, 8_5$]

CALCULATING CIRCUIT FOR ERROR CORRECTION

BACKGROUND OF THE INVENTION

1. Field of the Invention

The present invention relates to a calculating circuit for error correction, and more particularly to a multiple division circuit for carrying out Euclidean mutual division.

2. Description of the Prior Art

In the implementation of an error-correcting system using an error-correcting code represented by a Bose-Chaundhuri-Hocquenghem (BCH) code or a Reed-Solomon code, a means for determining an error locator polynomial from a syndrome generated from a received signal plays the most important role (see "7R-C601-018(4740) Hardware implementation of a high-speed multiple error-correcting circuit using the Reed-Solomon code (1)").

One well known process for determining such an error locator polynomial uses an Euclidean mutual division algorithm (see "7R-C601-020(4788) Hardware implementation of a high-speed multiple error-correcting circuit using the Reed-Solomon code (2)").

The Euclidean mutual division method is generally known as an algorithm for obtaining the most common divisors of two polynomials. In the error-correcting code, an error locator polynomial can be calculated from a syndrome by the skillful application of a calculation using the Euclidean mutual division method.

The calculation using the Euclidean mutual division method is advantageous in that it can be composed of a systolic-array architecture which can be realized by cascading a plurality of relatively simple calculation units (hereinafter referred to as "mutual division units").

Howard M. Shao, et. al. have proposed an example in which the Euclidean mutual division algorithm is implemented by a systolic-array architecture (see Howard M. Shao, et. al. "A VSLI Design of a Pipeline Reed-Solomon Decoder" IEEE Trans. on Computers Vol. C-34, May 1985). This method will hereinafter be referred to as a "method A". The method A however has defects in that its algorithm is not perfect and that each unit needs two multipliers for a finite field. Thus, when a system that needs high-speed real-time processing is to be constructed based on this method A, its circuit scale is increased.

We have previously proposed a method as an improvement of the method A as disclosed in U.S. patent application Ser. No. 07/623,235 filed Dec. 6, 1990. This proposed method will hereinafter be referred to as a "method B". The method B employs a revised Euclidean mutual division method (2) as disclosed in the above article by Howard M. Shao et. al., and replaces two finite field multipliers in the mutual division unit with a multiplier for a finite field and a divider for a finite field. Furthermore, in the method B, the finite field dividers used in a plurality of cascaded mutual division units are shared by a single divider for a finite field. The circuit arrangement used to implement the method B is therefore reduced in circuit scale.

We also have proposed an improved method (hereinafter referred to as a "method C") which is entirely different from the method B and employs only one additional circuit for sharing the divider and only one degree control circuit, as disclosed in Japanese patent application No. 3-254,183 filed Sep. 6, 1991. According to the method C, a circuit for sharing the divider and a control circuit therefor are not required because data to be divided can be extracted from one location at all times. In addition, a circuit for judging operation from the degree of a polynomial and a control circuit are realized by single circuits, respectively. Therefore, the method C can be implemented by a circuit arrangement of reduced circuit scale.

Now, the execution of only one calculation by one calculation unit in one step according to the revised Euclidean mutual division method (2) will be considered below. That is, the number of calculation units that are essentially required except when two or more calculations are carried out by one calculation unit through multiplexing such as time-division multiplexing will be considered below.

The numbers of calculation units required by the respective methods A, B, C are 8t, 4t, 4t−1, respectively. The numbers of calculation units required by the methods B and C are reduced to half the number of calculation units required by the method A. This is because one divider, rather than two multipliers, is used by each of the units, thereby reducing the number of multipliers required by respective calculation units to one.

While the number of calculations (multiplications) needed by the algorithm itself of the revised Euclidean mutual division method (2) is only 2t for one step, the circuit arrangement which implements the methods B and C requires as many calculation units as twice the number that is essentially required by the algorithm, and hence is wasteful. Similarly, the number of registers required to store the coefficients of polynomials is about twice the number that is essentially required by the algorithm.

Error-Correcting Procedure

An error-correcting procedure will be described below.

An error-correcting system having a code length n which can error-correct t symbols using a finite field $GF(2^m)$ will be considered. It is assumed that a jth error location as counted from the starting end of the code, which is selected to be the 0th position, is expressed by $\alpha^j$. If the code contains a total of m errors, then the entire errors of the code can be described by an error location $X_i$ (i=1, ..., m) and an error pattern $Y_i$ (i=1, ..., m). Therefore, if there are m (m≦2t) errors in total, then m sets of ($X_i$, $Y_i$) are required.

A polynomial known as an error locator polynomial $\sigma(X)$ is determined using the error location $X_i$ (i=1, ..., m). The error locator polynomial ($\sigma(X)$ becomes 0 if the error position $X=X_i^{-1}$ (i=1, ..., m). The error locator polynomial $\sigma(X)$ is expressed by the following equation (1):

$$\sigma(X) = \prod_{k=1}^{m} (1 - XX_k). \tag{1}$$

The coefficients of the error locator polynomial $\sigma(X)$ are expressed as follows:

$$\sigma(X) = 1 + \sigma_1 X + \sigma_1 X + \sigma_2 X^2 \ldots + \sigma_m X^m \tag{2}$$

Using the error locator polynomial $\sigma(X)$ and a syndrome polynomial $S(X)$, an error evaluator polynomial $\omega(X)$ is defined by:

$$\omega(X) = S(X)\sigma(X) \pmod{X^{2t}} \quad (3)$$

The error-correcting process will next be described below successively with respect to the following steps:

STEP 1

2t syndromes S, expressed by the following equation (4):

$$S = [S_1, S_2, \ldots, S_{2t}]^T \quad (4)$$

are determined as the product of a received signal r and a parity-check matrix H, and hence are given as follows:

$$X = Hr \quad (5)$$

Then, a polynomial called a syndrome polynomial $S(X)$ having the syndromes S thus determined as the polynomial coefficients is defined as follows:

$$S(X) = \sum_{j=1}^{2t} S_j X^{j-1} = \sum_{j=1}^{2t} \sum_{i=1}^{m} Y_i X_i^j X^{j-1}. \quad (6)$$

STEP 2

An error locator polynomial $\sigma(X)$ and an error evaluator polynomial $\omega(X)$ are determined from the syndrome polynomial $S(X)$, using the algorithm of the Euclidean mutual division method.

STEP 3

The error location $X = X_i^{-1} (i=1, \ldots, m)$ is searched. Using the coefficients of the error locator polynomial $\sigma(X)$ that have been determined in the step 2, all elements $X = \alpha^0 \ldots \alpha^{n-1}$ contained in the finite field $GF(2^m)$ are substituted in the error locator polynomial $\sigma(X)$, and the location where $\sigma(X) = 0$ is determined as the error location $X_i (i=1, \ldots, m)$.

STEP 4

Once the error location $X_i (i=1, \ldots, m)$ is determined, the error pattern $Y_i (i=1, \ldots, m)$ is calculated using the error evaluator polynomial $\omega(X)$ as follows:

$$Y_i = \frac{\omega(X_i^{-1})}{\sigma'(X_i^{-1})}. \quad (7)$$

STEP 5

The received signal is corrected using the error location $X_i (i=1, \ldots, m)$ and the error pattern $Y_i (i=1, \ldots, m)$ The error correction is carried out in the steps 1 through 5 described above. For more details, reference should be made to the article "7R-C601-018(4740) Hardware implementation of a high-speed multiple error-correcting circuit using the Reed-Solomon code (1)" the article "7R-C601-020(4788) Hardware implementation of a high-speed multiple error-correcting circuit using the Reed-Solomon code (2)", and an article "7R-C601-021 (4817) Hardware implementation of a high-speed multiple error-correcting circuit using the Reed-Solomon code (3)".

Deriving an Error Locator Polynomial Using the Euclidean Mutual Division Method

A process of deriving an error locator polynomial will be described below. This process corresponds to the step 2 in the above error-correcting process. A method of determining the error locator polynomial $\sigma(X)$ from the syndrome polynomial $S(X)$ using the algorithm of the Euclidean mutual division method is known as follows:

Method of Deriving an Error Locator Polynomial

It is assumed that $r_{-1}(X) = X^{2t}$ and $r_0(X) = S(X)$. Since the degree of $S(X)$ is $2t-1$, deg $(r_0(X)) <$ deg $(r_{-1}(X))$. Using $r_{-1}(X)$ and $r_0(X)$, a division to determine a quotient which is a polynomial $q_i(X)$ is repeated. The division is the same calculation as the Euclidean mutual division method, and is stopped when the following condition is satisfied:

$$r - 1 = q_1(X)r_0(X) + r_1(X), \, deg(r_1(X)) < deg(r_0(X))$$
$$r_0 = q_2(X)r_1(X) + r_2(X), \, deg(r_2(X)) < deg(r_1(X))$$
$$\vdots$$
$$r_{j-2} = q_j(X)r_{j-1}(X) + r_j(X), \, deg(r_j(X)) < deg(r_{j-1}(X))$$

where $deg(r_j(X)) \leq t-1$. At this time, $r_j(X)$ can be expressed according to the equation given below by substituting the initially defined equations $r_{-1}(X) = X^{2t}$ and $r_0(X) = S(X)$ successively in the equations $r_1(X), r_2(X), \ldots, r_{j-1}(X)$ from below which have been obtained in the above division process:

$$r_j(X) = S(X)A(X) + X^{2t}B(X)$$

$r_j(X)$ and $A(X)$ obtained at this time become $\omega(X)$ and $\sigma(X)$, respectively.

In order to achieve the above process through hardware, it is of importance to consider how divisions are successively carried out to determine $q_j(X), r_j(X)$ and also how a process of inversely carrying out successive substitutions is performed in order to determine $\sigma(X)$ from the equations $r_1(X), r_2(X), \ldots, r_{j-1}(X)$ that have been obtained.

In the Euclidean mutual division method, the degree of a residue as a result of a division may sometimes drop by two or more. Any hardware arrangement for implementing the Euclidean mutual division method must operate without fail in such an instance.

The above procedure can be achieved using a systematic algorithm, given below, by rewriting the above normal Euclidean mutual division algorithm such that the degree is reduced one by one. The systematic algorithm is a modification made by the applicant of the algorithm proposed in the literature Howard M. Shao, et. al. "A VSLI Design of a Pipeline Reed-Solomon Decoder" IEEE Trans. on Computers Vol. C-34, May 1985, and corresponds to a slight improvement of the revised Euclidean mutual division method (2) described in the article "7R-C601-020(4788) Hardware implementation of a high-speed multiple error-correcting circuit using the Reed-Solomon code (2)".

Revised Euclidean Mutual Division Method (2)

(Initial Condition)

$$R_o(X)=S(X), Q_o(X)=X^{2t}$$

$$\lambda_o(X)=1, \mu_o(X)=0$$

$$dR_o=2t-1, dQ_0=2t \quad (10)$$

(Repetition)
In an ith step, $$l_{i-1}(X)=dR_{i-1}-dQ_{i-1}$$

the coefficient of degree $dR_{i-1}$ of $R_{i-1}(X)$ is $a_{i-1}$ and the $(dQ_{i-1})$th coefficient of $Q_{i-1}(X)$ is $b_{i-1}$. . . (11).

[1] In case $l_{i-1} \geq 0$ (normal mode), $$R_i(X)=R_{i-1}(X)+(a_{i-1}/b_{i-1})Q_{i-1}(X).X^{l_{i-1}}$$

$$\lambda_i(X)=\lambda_{i-1}(X)+(a_{i-1}/b_{i-1})\mu_{i-1}(X).X^{l_{i-1}}$$

$$Q_i(X)=Q_{i-1}(X)$$

$$\mu_i(X)=\mu_{i-1}(X)$$

$$dR_i=dR_{i-1}-1$$

$$dQ_i=dQ_{i-1} \quad (12)$$

[2] In case $l_{i-1}<0$, $a_{i-1}\neq 0$ (cross mode), $$R_i(X)=Q_{i-1}(X)+(a_{i-1}/b_{i-1})R_{i-1}(X).X^{-l_{i-1}}$$

$$\lambda_i(X)=\mu_{i-1}(X)+(a_{i-1}/b_{i-1})\lambda_{i-1}(X).X^{-l_{i-1}}$$

$$Q_i(X)=R_{i-1}(X)$$

$$\mu_i(X)=\lambda_{i-1}(X)$$

$$dR_i=dQ_{i-1}-1$$

$$dQ_i=dR_{i-1} \quad (13)$$

[3] In case $l_{i-1}<0$, $a_{i-1}=0$ (shift mode), $$R_i(X)=R_{i-1}(X)$$

$$\lambda_i(X)=\lambda_{i-1}(X)$$

$$Q_i(X)=Q_{i-1}(X)$$

$$\mu_i(X)=\mu_{i-1}(X)$$

$$dR_i=dR_{i-1}-1$$

$$dQ_i=dQ_{i-1} \quad (14)$$

(Stop Condition)
The process is stopped when it is repeated 2t times.

$$i=2t \quad (15)$$

(Result)

$$\sigma(X)=\rho_{2t}(X)$$

$$\omega(X)=R_{2t}(X) \quad (16)$$

If the calculation is necessarily repeated by 2t steps as the stop condition, $dR_{2t}$ which is finally obtained is indicative of the degree of $\omega(X)$. Naturally, the degree of $\sigma(X)$ is $R_{2t}(X)+1$. According to this algorithm, $\sigma(X)$ and $\omega(X)$ can be determined after the calculations in the 2t steps.

As described in the article "7R-C601-020(4788) Hardware implementation of a high-speed multiple error-correcting circuit using the Reed-Solomon code (2)", $dR_{2t}$ eventually represents the degree of $R_{2t}(X)$, i.e., $\omega(X)$. When calculations are carried out in the normal and cross modes, $dR_i$ and $dQ_i$ in the calculating process are indicative of the degrees of $R_i(X)$ and $Q_i(X)$, respectively. However, they do not represent degree in the shift mode in which the high-order coefficient of $R_i(X)$ is 0. This is caused by the fact that even when the degree of a residue of one division drops by two or more in the Euclidean mutual division method, $dR_i$ decreases one by one according to the algorithm of the revised Euclidean mutual division method (2). For a detailed example, reference should be made to the article "7R-C601-020(4788) Hardware implementation of a high-speed multiple error-correcting circuit using the Reed-Solomon code (2)".

Hardware Implementation of the Conventional Euclidean Mutual Division Algorithm

An example in which the algorithm of the Euclidean mutual division method is hardware-implemented using a systolic-array architecture is disclosed in the literature Howard M. Shao, et. al. "A VSLI Design of a Pipeline Reed-Solomon Decoder" IEEE Trans. on Computers Vol. C-34, May 1985 (method A).

However, the disclosed hardware does not cope with the reduction by two or more of the degree of a residue in the division according to the Euclidean mutual division method, and does not fully realize the Euclidean mutual division algorithm.

The method A requires two finite-field multipliers in each unit, and hence results in a large circuit scale when a system capable of high-speed real-time processing is to be constructed.

The method B referred to above has been proposed by the inventor as an improvement of the method A. According to the method B, two finite-field multipliers in a mutual division unit are replace with one multiplier for a finite field and one divider for a finite field, and finite-field dividers in a plurality of cascaded mutual division units are shared by one divider for a finite field. In this manner, a circuit arrangement for carrying out the method B is reduced in circuit scale.

The method B employs a calculation unit (referred to as a "mutual division unit") 101 as shown in FIG. 1 of the accompanying drawings. The mutual division unit 101 carries out one step of the revised Euclidean mutual division method (2) described above. The four polynomials $R_{i-1}(X)$, $Q_{i-1}(X)$, $\lambda_{i-1}(X)$, and $\mu_{i-1}(X)$ as inputs in the steps of the Euclidean mutual division method are input successively from the coefficient of degree $dQ_{i-1}$. SF represents a flag indicative of the first coefficient. At the same time, $dR_{i-1}$ and $dQ_{i-1}$ are input to the mutual division unit 101.

The mutual division unit 101 includes data path switchers indicated by the dotted lines. When calculations are carried out in the cross mode, the data path switchers select crossed data. In the other modes, the data path switches select data which are not crossed. Specifically, when the coefficient of degree $dR_{i-1}$ is input, i.e., when the SF flag is input, it is determined whether the coefficient $a_{i-1}$ of degree $dR_{i-1}$ of $R_{i-1}(X)$ is 0 or not, and only if $a_{i-1}\neq 0$, $dR_{i-1}<dQ_{i-1}$, the data are crossed by the data path switchers.

As a consequence, in the cross mode, $a_{i-1}/b_{i-1}$ is held in a register 102, and in the other modes, $b_{i-1}/a_{i-1}$ is held in the register 102, with calculations effected on all the coefficients of polynomials. Each time input data passes once through the mutual division unit, the mutual division unit executes one step of the revised Euclidean mutual division method (2). In the case where 2t mutual division units are cascaded, and inputs expressed by:

$$R_o(X) = S(X), \ Q_o(X) = X^{2t}$$

$$\lambda_o(X) = 1, \ \mu_o(X) = 0$$

$$dR_o = 2t - 1, \ dQ_0 = 2t \tag{17}$$

are supplied, as shown in FIG. 2 of the accompanying drawings, the (2t)th mutual division unit 101 produces outputs $\sigma(X)$, $\omega(X)$.

Using an example shown in the article "7R-C601-020(4788) Hardware implementation of a high-speed multiple error-correcting circuit using the Reed-Solomon code (2)", operation will be described by way of example with reference to FIGS. 3 through 6 of the accompanying drawings. Calculations are carried out in, the cross mode in FIGS. 3 and 5, and in the normal mode in FIGS. 4 and 6. As shown in FIG. 6, it can be seen that $\sigma(X)$, $\omega(X)$ are determined as a result of the passage of data through the mutual division unit 101 four times.

As is apparent from the algorithm, if the number of errors that are actually occurring is less than t, then the two polynomials $\sigma(X)$, $\omega(X)$ are shifted toward high-order locations and output as if they are polynomials of degree 2t after calculations in 2t steps. Therefore, the degrees may be brought into conformity by observing the value of $dR_{2t}$ or the stop condition in the revised Euclidean mutual division method (2) may be changed to $dR_i < t$. FIGS. 3 through 6 show principles of the mutual division unit only, with no consideration given to the time delays of components, etc. For detailed implementation, reference should be made to the article "7R-C601-021(4817) Hardware implementation of a high-speed multiple error-correcting circuit using the Reed-Solomon code (3)".

According to the method B, in view of the fact that it is not necessary for finite-field dividers 103 of the respective mutual division units 101 to operate at the same time, mutual division units 101a, which are the same as the mutual division units 101 except that the finite-field multiplier 103 is removed, are connected in cascade, as shown in FIG. 7 of the accompanying drawings, and $R_{i-1}(X)$, $Q_{i-1}(X)$ from each of the mutual division units 101a are successively selected by a selector switch 105 and divided by a finite-field divider 106, with the quotients fed back to the corresponding mutual division units 101a. The single finite-field divider 106 is thus shared by the mutual division units 101a on a time-division multiplexing basis, resulting in a reduction in the overall gate scale.

However, since the finite-field divider 106 is shared by the mutual division units 101a, a required control circuit is complex in arrangement and its operation speed is not high.

While the finite-field divider 106 is shared, each of the mutual division units 101a requires a circuit for detecting the degrees of polynomials and also detecting when the coefficient of degree $dR_{i-1}$ of $R_{i-1}(X)$ is 0, and also a control circuit such as a data switcher or the like. Consequently, the circuit scale is relatively large.

In the circuit arrangement shown in FIG. 7, it is necessary to input syndromes $S_{2t}, S_{2t-1}, \ldots, S_1$ which are the coefficients of the syndrome polynomial S(X) successively from the high-order coefficient. Since, however, the syndromes $S_{2t}, S_{2-1}, \ldots, S_1$ are simultaneously determined, a conversion circuit for inputting the simultaneously determined syndromes successively from the high-order coefficient is required.

To solve the above problems, a new method referred to as the method C has been proposed in the literature Howard M. Shao, et. al. "A VSLI Design of a Pipeline Reed-Solomon Decoder" IEEE Trans. on Computers Vol. C-34, May 1985.

According to the method C, a circuit for sharing the infinite-field divider 106 and a control circuit therefor are not required because data to be divided can be extracted from one location at all times, unlike the conventional methods. In addition, a circuit for judging operation from the degree of a polynomial and a control circuit are realized by single circuits, respectively. Therefore, the method C can be implemented by a circuit arrangement of reduced circuit scale.

The circuit arrangement which implements the method C is shown in FIG. 8 of the accompanying drawings. As shown in FIG. 8, the circuit arrangement comprises a block (A) 111, a plurality of blocks (B) 112, and a connection switching determination block 113. The block (A) 111 comprises a single unit irrespective of the number t of errors. In the case of a t-symbol error-correcting system, there are required (2t−1) blocks (B) 112.

The block (A) 111 and the clocks (B) 112 include vertical separate groups of registers for storing the coefficients of $R_i(X)$, $Q_i(X)$, $\lambda_i(X)$, $\mu_i(X)$, respectively. The coefficients are stored in the groups of registers successively from the high-order coefficient according to the degree indicated by $dR_i$, $dQ_i$.

As initial values, the coefficients of $R_0(X) = S(X)$ are stored successively in registers $RR_{2t-i}, \ldots, RR_0$. Similarly, the coefficients of $Q_0(X) = X^{2t}$ are stored successively from the high-order coefficient in registers $RQ_{2t-1}, \ldots, RQ_0$. Registers $R\lambda_{2t}, \ldots, R\lambda_0$ store 0. With respect to registers $R\mu_{2t-1}, \ldots, R\mu_0$, the low-order register $R\mu_0$ stores 1, and the other registers store 0.

0 is input at all times from the low-order block of the final block (B) 112 to the input terminal.

Whether the coefficient stored in the register $RR_{2t-1}$ for storing the coefficient of degree $dR_i$ of $R_i(X)$ in the block (A) 111 is detected by a 0-detecting circuit 115 in the connection switching determination circuit 113.

The connection switching determination circuit 113 has registers DR, DQ for storing $dR_i$, $dQ_i$, respectively. The registers DR, DQ store 2t−1, 2t as initial values, respectively.

A circuit for setting initial values is required in addition to the circuit arrangement shown in FIG. 8. However, such a circuit is omitted from illustration as it is not essential and is a simple circuit.

Operation of the circuit arrangement shown in FIG. 8 will be described below.

The initial values stored in the registers DR, DQ are compared by a comparator 116. If DR<DQ and the register $RR_{2t-1}$·0 as detected by the 0-detecting circuit 115, the data path switchers as indicated by the dotted lines are operated to select crossed data. Otherwise, the data path switchers select data that are not crossed. All the data path switchers in the circuit arrangement are simultaneously caused to select data.

After the switching of the data path switchers, the coefficient of degree $dR_{i-1}$ of $R_{i-1}(X)$ and the coefficient of degree $dQ_{i-1}$ of $Q_{i-1}(X)$ are input through the data path switcher to a finite-field divider 117. The finite-field divider 117 effects a division E/F on its inputs E, F, and outputs a result S.

Using the result S from the finite-field divider 117, multipliers 119, 120 and adders 121, 122 in the block (A) 111 and the blocks (B) 112 carry out calculations. The coefficients from degree $dR_i$ to degree 0 of a polynomial $R_i(X)$ are stored in the registers $RR_{2t-1}$ through $RR_0$ successively from the high-order coefficient. Similarly, the coefficients from degree $dQ_i$ to degree 0 of a polynomial $Q_i(X)$ are stored in the registers $RQ_{2t}$ through $RQ_0$ successively. The coefficients of polynomials $\lambda_i(X)$, $\mu_i(X)$ are stored in the registers $R\lambda_{2t}$ through $R\lambda_0$ and the registers $R\mu_{2t-1}$ through $R\mu_0$ successively from the high-order coefficient. According to the method C, however, all the coefficients are stored in the registers DR, DQ, $RR_{2t-1}$ through $RR_0$, $RQ_{2t}$ through $RQ_0$, $R\lambda_{2t}$ through $R\lambda_0$, and $R\mu_{2t-1}$ through $R\mu_0$. As a result, while all the coefficients of polynomials are serially calculated in one mutual division unit 101 in one step of the revised Euclidean mutual division method (2) according to the method B, each coefficient is calculated in all the calculation units (in the block (A) 111 and the blocks (B) 112) in one step of the revised Euclidean mutual division method (2) according to the method C. Therefore, the method C is greatly simplified though the amount of calculations needed remains unchanged.

As described above with reference to FIG. 8, the coefficient of degree $dR_i$ of $R_i(X)$ and the coefficient of degree $dQ_i$ of $Q_i(X)$, which are inputs to the finite-field divider 117, are stored in the registers $RR_{2t-1}$, $RQ_{2t-1}$ in the block (A) 111. Consequently, the inputs to the finite-field divider 117 are always supplied directly behind the data path switcher for $R_i(X)$, $Q_i(X)$ in the block (A) 111. Inasmuch as it is possible to input data from the same location at all times to the finite-field divider 117 according to the method B, any additional circuit for sharing the finite-field divider 117 is not required, resulting in a reduction in the overall circuit scale.

According to the method B, the division units 101 are required to have circuits, independent of each other, for determining the magnitudes of $dR_i$, $dQ_i$ and detecting whether the coefficient of degree $dR_i$ of $R_i(X)$ is 0 or not to control the respective data path switchers. According to the method C, however, such a process is carried out only by the connection switching determination block 103. Therefore, the circuit scale can be reduced.

Although two multipliers are required in each mutual division unit 101 and hence a total of 4t multipliers are required if the number of correctable symbols is t according to the method B, the number of required multipliers is reduced to 4t−1 according to the method C.

In setting initial values, the coefficients $S_1, S_2, \ldots, S_{2t}$ of the input signal $R_0(X)$, i.e., the syndrome polynomial, are required to be serially input successively from the high-order coefficient according to the method B. According to the method C, however, 2t coefficients of the syndrome polynomial are simultaneously input for initialization.

Syndromes can essentially be determined simultaneously as they are obtained as results of matrix calculations. According to the method B, it is necessary to convert the simultaneously determined syndromes into serial data and input them. According to the method C, since the simultaneously determined coefficients of a syndrome polynomial can be directly input, any circuit for converting them into serial data is not required. Furthermore, a time spent until a result is obtained by the serial data conversion (throughput time) is prevented from increasing.

According to the method C, there are various methods of initializing the registers DR, DQ, $RR_{2t-1}$ through $RR_0$, $RQ_{2t}$ through $RQ_0$, $R\lambda_{2t}$ through $R\lambda_0$, and $R\mu_{2t-1}$ through $R\mu_0$. If selectors are connected to the input terminals of the registers DR, DQ, $RR_{2t-1}$ through $RR_0$, $RQ_{2t}$ through $RQ_0$, $R\lambda_{2t}$ through $R\lambda_0$, and $R\mu_{2t-1}$ through $R\mu_0$, then it is possible to initialize all the registers at the same time. Alternatively, the registers can be successively initialized by serially inputting initial values of respective polynomials as inputs to low-order registers for respective polynomials.

Now, the execution of only one calculation by one calculation unit in one step according to the revised Euclidean mutual division method (2) will be considered below. That is, the number of calculation units that are essentially required except when two or more calculations are carried out by one calculation unit through multiplexing such as time-division multiplexing will be considered below.

The numbers of calculation units required by the respective methods A, B, C are 8t, 4t, 4t−1, respectively, where t is the number of correctable symbols.

In this case, therefore, $$R_1(X) = Q_0(X) + (1/\alpha^8)R_0(X)X \qquad (21)$$
$$= X^4 + \alpha^7(\alpha^8X^3 + \alpha^{10}X^2 + \alpha^5X + \alpha^{12})X$$
$$= \alpha^2X^3 + \alpha^{12}X^2 + \alpha^4X$$

$$\lambda_1(X) = \mu_0(X) + (1/\alpha^8)\lambda_0(X)X$$
$$= 0 + \alpha^7 \cdot 1 \cdot X$$
$$= \alpha^7X$$

$$Q_1(X) = R_0(X)$$
$$= \alpha^8X^3 + \alpha^{10}X^2 + \alpha^5X + \alpha^{12}$$

$$\mu_1(X) = \lambda_0(X)$$
$$= 1$$

$$dR_1 = dQ_0 - 1 = 4 - 1 = 3$$
$$dQ_1 = dR_0 = 3.$$

[STEP 2]

$$dR_1 - dQ_1 = 3 - 3 = 0 \geq 0 \rightarrow) \text{ normal mode} \qquad (22)$$

In this case, therefore, $$R_2(X) = R_1(X) + (\alpha^2/\alpha^8)Q_1(X)$$
$$= \alpha^2X^3 + \alpha^{12}X^2 + \alpha^4X + \alpha^9(\alpha^8X^3 + \alpha^{10}X^2 + \alpha^5X + \alpha^{12})$$
$$= \alpha^6X^2 + \alpha^9X + \alpha^6$$

$$\lambda_2(X) = \lambda_1(X) + (\alpha^2/\alpha^8)\mu_1(X)$$
$$= \alpha^7X + \alpha^9 \cdot 1$$
$$= \alpha^7X + \alpha^9$$

$$Q_2(X) = Q_1(X)$$
$$= \alpha^8X^3 + \alpha^{10}X^2 + \alpha^5X + \alpha^{12}$$

$$\mu_2(X) = \mu_1(X)$$
$$= 1$$

The calculations in these steps are carried out as shown in FIGS. 3 through 6 according to the method B, and as shown in FIGS. 9 through 13 according to the method C.

Multiplications are required in determining $R_i(X)$, $\lambda_i(X)$. With respect to the number of multiplications in each of the steps, the calculation expressed by:

$$R_1(X) = Q_0(X) + (1/\alpha^8) R_0(X) \cdot X \qquad (28)$$

is carried out to determine $R_1(X)$ in step 1. Actually, the coefficients of $R_0(X)$ and the result $\alpha^7$ of the division are multiplied. The polynomial $R_0(X)$ has four coefficients as it is a polynomial of degree three. Since the coefficient of greatest degree is used for division, it is not required to be calculated. As a result, the following three calculations are carried out:

$$\alpha^7 \cdot \alpha^{10},\ \alpha^7 \cdot \alpha^5,\ \alpha^7 \cdot \alpha^{12} \qquad (29)$$

With respect to $\lambda_0(X)$, the calculation expressed by:

$$\lambda_1(X) = \mu_0(X) + (1/\alpha^8) \lambda_0(X) \cdot X \qquad (30)$$

is carried out. Since $\lambda_0(X)$ is a polynomial of degree 0, only one coefficient is calculated as follows:

$$\alpha^7 \cdot 1 \qquad (31)$$

Therefore, it can be understood that a total of four calculations are carried out in the step 1.

With respect to the number of calculations in step 2, the following three multiplications are performed to calculate $R_2(X)$ using the result $\alpha^9$ of division:

$$\alpha^9 \cdot \alpha^{10},\ \alpha^9 \cdot \alpha^5,\ \alpha^9 \cdot \alpha^{12} \qquad (32)$$

To calculate $\lambda_2(X)$, the following one calculation is carried out:

$$\alpha^9 \cdot 1 \qquad (33)$$

Therefore, a total of four calculations are also carried out in step 2.

In the step 3, two multiplications expressed by:

$$\alpha^2 \cdot \alpha^9,\ \alpha^2 \cdot \alpha^6 \qquad (34)$$

are carried out to calculate $R_3(X)$. In the calculation unit for $\lambda_3(X)$, the following two calculations:

$$\alpha^2 \cdot \alpha^7,\ \alpha^2 \cdot \alpha^9 \qquad (35)$$

are carried out. Therefore, a total of four calculations are also carried out in step 3.

In the final step 3, two multiplications expressed by:

$$\alpha^8 \cdot \alpha^9,\ \alpha^8 \cdot \alpha^6 \qquad (36)$$

are carried out to calculate $R_4(X)$. In the calculation unit for $\lambda_4(X)$, the following two calculations:

$$\alpha^8 \cdot \alpha^7,\ \alpha^8 \cdot \alpha^9 \qquad (37)$$

are carried out. Therefore, a total of four calculations are also carried out in step 4.

Consequently, the total number of calculations that are actually required in each of the steps is always 4. This naturally occurs because as the Euclidean mutual division method progresses, the degrees of $R_i(X)$, $Q_i(X)$ decrease and the degrees of $\lambda_i(X)$, $\mu_i(X)$ increase.

Generally, when $R_i(X)$ is calculated in the ith step of the revised Euclidean mutual division method, it is necessary to multiply the coefficients except for the high-order coefficient of $R_{i-1}(X)$ in the cross mode and of $Q_{i-1}(X)$ in the normal mode.

When calculations are carried out, $dR_{i-1}$, $dQ_{i-1}$ represent the degrees of $R_{i-1}(X)$, $Q_{i-1}(X)$. Since calculations are performed in the cross mode when $dR_{i-1} \geq dQ_{i-1}$ and in the normal mode when $dR_{i-1} \geq dQ_{i-1}$, the degree of a polynomial required to be multiplied to calculate $R_i(X)$ is the smaller one of $dR_{i-1}$, and $dQ_{i-1}$, i.e., $\min(dR_{i-1}, dQ_{i-1})$. At this time, the number of coefficients of the polynomial itself is greater than the degree of the polynominal by 1. The high-order coefficient is not required to be calculated as it is used for division. Consequently, $\min(dR_{i-1}, dQ_{i-1})$ calculations are required to calculate $R_i(X)$.

Calculations for $\lambda_i(X)$ are performed by $\lambda_{i-1}(X)$, $\mu_{i-1}(X)$. To calculate $\lambda_i(X)$, all coefficients of $\lambda_{i-1}(X)$ are required to be multiplied in the cross mode, and all coefficients of $\mu_{i-1}(X)$ are required to be multiplied in the normal mode.

In the normal and cross modes in which calculations are actually carried out other than the shift mode, when the following conditions are satisfied:

$$d\lambda_i + dQ_i = b\ 2t$$

$$d\mu_i < d\lambda_i$$

$$dR_{i-1} < dQ_{i-1} \qquad (38)$$

where $d\lambda_i$ is the degree of $\lambda_i(X)$ and $d\mu_i$ is the degree of $\mu_i(X)$ in the calculations in the ith step, the calculations are always carried out in the cross mode, and the coefficients other than the high-order coefficient (of degree $dR_{i-1}$) of a polynomial $R_{i-1}(X)$ of degree $dR_{i-1}$ are multiplied for the calculation of $R_i(X)$. Accordingly, $dR_{i-1}$ calculations are necessary. For the calculation of $\lambda_i(X)$, all $(d\lambda_{i-1}+1)$ coefficients of $\lambda_{i-1}(X)$ are required to be multiplied.

Therefore, the number $N_{cross}$ of all multiplications in the cross mode is expressed by:

$$\begin{aligned} N_{cross} &= dR_{i-1} + d\lambda_{i-1} + 1 < dQ_{i-1} + d\lambda_{i-1} + 1 \\ &= 2t + 1. \end{aligned} \qquad (39)$$

As a consequence, the number $N_{cross}$ of entire multiplications in the cross mode is 2t or smaller.

In the normal mode when $dR_{i-1} \leq dQ_{i-1}$, the coefficients other than the high-order coefficient (of degree $dQ_{i-1}$) of a polynomial $Q_{i-1}(X)$ of degree $dQ_{i-1}$ are required to be multiplied for the calculation of $R_i(X)$, and $dQ_{i-1}$ multiplications are needed. Likewise, to calculate $\lambda_i(X)$, all $(dR_{i-1}+1)$ coefficients of $\mu_{i-1}(X)$ are required to be multiplied.

Therefore, the number $N_{normal}$ of all multiplications in the normal mode is expressed by:

$$\begin{aligned} N_{normal} &= dQ_{i-1} + d\mu_{i-1} + 1 < dQ_{i-1} + d\lambda_{i-1} + 1 \\ &= 2t + 1. \end{aligned} \qquad (40)$$

As a consequence, the number $N_{cross}$ of entire multiplications in the normal mode is also 2t or smaller.

As described above, the total number of multiplications in each step required by the algorithm itself is always 2t or less. Thus, the number of calculation units that are essentially needed is only 2t.

In the above example, the number of calculation units should therefore be 4. Actual systems which implement the methods A, B, C, however, require a number of calculation units that are more than twice 2t, and hence are of a very wasteful circuit arrangement.

The number of coefficients that need to be held for calculations will be considered below.

$dR_i$, $dQ_i$, $d\lambda_i$, $d\mu_i$ represent the respective degrees of $R_i(X)$, $Q_i(X)$, $\lambda_i(X)$, $\mu_i(X)$ in actual calculation steps in the normal and cross modes. These degrees have the following relationship:

$$dR_i + d\mu_i < dQ_i + d\lambda_i = 2t \quad (41)$$

As can be seen from the above, the sum of the degrees of $Q_i(X)$, $\lambda_i(X)$ is 2t at all times, and the sum of the degrees of $R_i(X)$, $\mu_i(X)$ is $2t-1$ or less.

Therefore, the number of registers required to store the coefficients of $Q_i(X)$, $\lambda_i(X)$ may be $2t+2$, and the number of registers required to store the coefficients of $R_i(X)$, $\mu_i(X)$ may be $2t+1$. The total number of registers required may thus be $4t+3$.

However, the system which implements the method C employs $(8t+1)$ registers and hence is a highly wasteful arrangement.

As described above, in either one of the methods A, B, C, the number of multiplications per step and the number of registers are more than twice the numbers that are required by the algorithm. The systems which implement the methods A, B, C are of a highly wasteful circuit arrangement.

The calculations in the above example will be described once more for an easier understanding. According to the method C, the calculations carried out as shown in FIGS. 9 through 13 are indicated by the following tables:

TABLE 1-1

[STEP 1]
Cross mode dR = 3, dQ = 4

| $R_i$ | $Q_i$ | Calculation of R | Calculation of Q | $\lambda_i$ | $\mu_i$ | Calculation of $\lambda$ | Calculation of $\mu$ |
|---|---|---|---|---|---|---|---|
| $\alpha^8$ | 1 | $S = Q/R = \alpha^7$ | — | 0 | 0 | $\lambda = \mu$ | $\lambda = \mu$ |
| $\alpha^{10}$ | 0 | $R = Q + \alpha^7 \times R$ | $Q = R$ | 0 | 0 | $\lambda = \mu$ | $\lambda = \mu$ |
| $\alpha^5$ | 0 | $R = Q + \alpha^7 \times R$ | $Q = R$ | 0 | 0 | $\lambda = \mu$ | $\lambda = \mu$ |
| $\alpha^{12}$ | 0 | $R = Q + \alpha^7 \times R$ | $Q = R$ | 1 | 0 | $\lambda = \mu + \alpha^7 \times \lambda$ | $\lambda = \mu$ |

TABLE 1-2

[STEP 2]
Normal mode dR = 3, dQ = 3

| $R_i$ | $Q_i$ | Calculation of R | Calculation of Q | $\lambda_i$ | $\mu_i$ | Calculation of $\lambda$ | Calculation of $\mu$ |
|---|---|---|---|---|---|---|---|
| $\alpha^2$ | $\alpha^8$ | $S = R/Q = \alpha^9$ | — | 0 | 0 | $\lambda = \lambda$ | $\mu = \mu$ |
| $\alpha^{12}$ | $\alpha^{10}$ | $R = R + \alpha^9 \times R$ | $Q = Q$ | 0 | 0 | $\lambda = \lambda$ | $\mu = \mu$ |
| $\alpha^4$ | $\alpha^5$ | $R = R + \alpha^9 \times Q$ | $Q = Q$ | $\alpha^7$ | 0 | $\lambda = \lambda$ | $\mu = \mu$ |
| 0 | $\alpha^{12}$ | $R = R + \alpha^9 \times Q$ | $Q = Q$ | 1 | 1 | $\lambda = \mu + \alpha^9 \times \mu$ | $\mu = \mu$ |

TABLE 1-3

[STEP 3]
Cross mode dR = 2, dQ = 3

| $R_i$ | $Q_i$ | Calculation of R | Calculation of Q | $\lambda_i$ | $\mu_i$ | Calculation of $\lambda$ | Calculation of $\mu$ |
|---|---|---|---|---|---|---|---|
| $\alpha^6$ | $\alpha^8$ | $S = Q/R = \alpha^2$ | — | 0 | 0 | $\lambda = \mu$ | $\mu = \lambda$ |
| $\alpha^9$ | $\alpha^{10}$ | $R = Q + \alpha^2 \times R$ | $Q = R$ | $\alpha^7$ | 0 | $\lambda = \mu + \alpha^2 \times \lambda$ | $\mu = \lambda$ |
| $\alpha^6$ | $\alpha^5$ | $R = Q + \alpha^2 \times R$ | $Q = R$ | $\alpha^9$ | 0 | $\lambda = \mu + \alpha^2 \times \lambda$ | $\mu = \lambda$ |
| 0 | $\alpha^{12}$ | $R = Q$ | $Q = R$ | 0 | 1 | $\lambda = \mu$ | $\mu = \lambda$ |

TABLE 1-4

[STEP 4]
Normal mode dR = 2, dQ = 2

| $R_i$ | $Q_i$ | Calculation of R | Calculation of Q | $\lambda_i$ | $\mu_i$ | Calculation of $\lambda$ | Calculation of $\mu$ |
|---|---|---|---|---|---|---|---|
| $\alpha^{14}$ | $\alpha^6$ | $S = R/Q = \alpha^8$ | — | $\alpha^9$ | 0 | $\lambda = \lambda$ | $\mu = \mu$ |
| $\alpha^4$ | $\alpha^9$ | $R = R + \alpha^8 \times Q$ | $Q = Q$ | $\alpha^{11}$ | $\alpha^7$ | $\lambda = \lambda + \alpha^8 \times \mu$ | $\mu = \mu$ |
| $\alpha^{12}$ | $\alpha^6$ | $R = R + \alpha^8 \times Q$ | $Q = Q$ | 1 | $\alpha^9$ | $\lambda = \lambda + \alpha^8 \times \mu$ | $\mu = \mu$ |
| 0 | 0 | $R = R$ | $Q = Q$ | 0 | 0 | $\lambda = \lambda$ | $\mu = \mu$ |

As is apparent from the above tables, according to the method C, only four multiplications are carried out in each step, and the remaining calculation units are not in operation. The locations where $\lambda_i(X)$, $\mu_i(X)$ are stored are apparently shifted toward high-order locations as the calculations progress, and hence the locations where the calculation units are used vary in each step. Therefore, the number of calculation units cannot be reduced according to the method C.

OBJECTS AND SUMMARY OF THE INVENTION

It is an object of the present invention to provide an Euclidean mutual division circuit having $(2t+1)$ calculation units, the number of which is greater, by 1, than the minimum number $2t$ of calculations per step of the Euclidean mutual division method, and a minimum number of $(4t+3)$ registers, for accomplishing an algorithm thereby to greatly reduce a circuit scale and to operate at high speed for an increased throughput.

Another object of the present invention is to provide an Euclidean mutual division circuit having fewer calculation units than $(2t+1)$ which are used in a time-division multiplexing process for carrying out $(2t+1)$ calculations per step which are required of the Euclidean mutual division method.

According to the present invention, there is provided an Euclidean mutual division circuit comprising a plurality of calculation devices each composed of two registers for storing $R_i(X)$, $Q_i(X)$, $\lambda_i(X)$, $\mu_i(X)$ and a calculation unit, the calculation devices being cascaded in a number corresponding to one more than the minimum number of calculations per step of a Euclidean mutual division for receiving a result of division and a value output from a preceding stage, the calculation devices being responsive to a switching command for effecting either a normal connection calculation or a cross-connection calculation, a division unit having two registers for storing $R_i(X)$, $Q_i(X)$, $\lambda_i(X)$, $\mu_i(X)$ and a divider, for receiving a value output from a final stage of the calculation devices, for effecting either a normal-connection division or a cross-connection division in response to the switching command, and supplying the result of division to each of the calculation devices, and a control unit for generating a switching command indicative of either a normal connection or a cross connection based on a predetermined initial value and a value stored in a register in the division unit, and supplying the generated switching command to the calculation devices and the division unit.

The control unit generates a switching command for indicating a normal connection or a cross connection based on a comparison of a predetermined initial value and a value stored in a register in the division unit. At the same time, the calculation devices receive a result of division and a value output from a preceding stage and is responsive to a switching command for effecting either a normal connection calculation or a cross-connection calculation. The division unit receives a value output from a final stage of the calculation devices, effects either a normal-connection division or a cross-connection division in response to the switching command, and supplies the result of division to each of the calculation devices for effecting Euclidean mutual division.

According to the present invention, there is also provided an Euclidean mutual division circuit comprising a block (heretofore "MLT block") having a group of A-side registers divided depending on a degree of multiplexing for storing coefficients of $R_i(X)$, $Q_i(X)$, a group of B-side registers divided depending on the degree of multiplexing for storing coefficients of $\lambda_i(X)$, $\mu_i(X)$, and a number of calculation units as great as $(2t+1)$ divided by the degree of multiplexing, the MLT block being capable of receiving a result of division and values output from the A- and B-side registers, and responsive to a switching command for effecting either a normal connection calculation or a cross-connection calculation or a shift-connection calculation in each clock cycle in each step, a division unit having a register for storing $R_i(X)$, $Q_i(X)$, a register for storing $\lambda_i(X)$, $\mu_i(X)$, and a divider for dividing coefficients stored in the registers, for receiving a value output from a final stage of the MLT block, effecting either a normal-connection division or a cross-connection division in response to the switching command, and supplying the result of division to each of the calculation units until each step is finished, and a determination and control unit for generating a switching command indicative of either a normal connection or a cross connection or a shift connection based on a comparison of a predetermined value and a value stored in a register in the division unit, and supplying the generated switching command to the MLT block and the division unit.

The determination and control unit generates a switching command for indicating a normal connection or a cross connection or a shift connection based on a predetermined value set in each step and a value stored in a register in the division unit. The division unit receives a value output from a final stage of the MLT block, and is responsive to a switching command for effecting either a normal connection calculation or a cross-connection calculation. The result of the calculation is supplied to each of the calculation units until each step is finished. Concurrent with this, in each clock cycle in each step, each of the calculation units of the MLT block receives a result of division and values output from the A- and B-side registers, and is responsive to a switching command for effecting either a normal connection calculation or a cross-connection calculation or a shift-connection calculation, for carrying out Euclidean mutual divisions.

The above and other objects, features, and advantages of the present invention will become apparent from the following description of illustrative embodiments thereof to be read in conjunction with the accompanying drawings, in which like reference numerals represent the same or similar objects.

BRIEF DESCRIPTION OF THE DRAWINGS

FIGS. 4–6 are block diagrams showing the manner in which the Euclidean mutual division circuit shown in FIG. 2 operates;

FIG. 23–35 are block diagrams showing the manner in which the Euclidean mutual division circuit shown in FIG. 21 operates.

DETAILED DESCRIPTION OF THE PREFERRED EMBODIMENTS

A method (hereinafter referred to as a "method D") according to a first embodiment of the present invention is proposed which can perform an algorithm with $(2t+1)$ calculation units, the number of which is greater, by 1, than the minimum number $2t$ of calculations per step of the Euclidean mutual division method, and a minimum number of $(4t+3)$ registers.

The method D is of great advantage because it can accomplish the Euclidean mutual division algorithm with calculation units much fewer than those required by the conventionally proposed methods A, B, and C.

Figure 14:
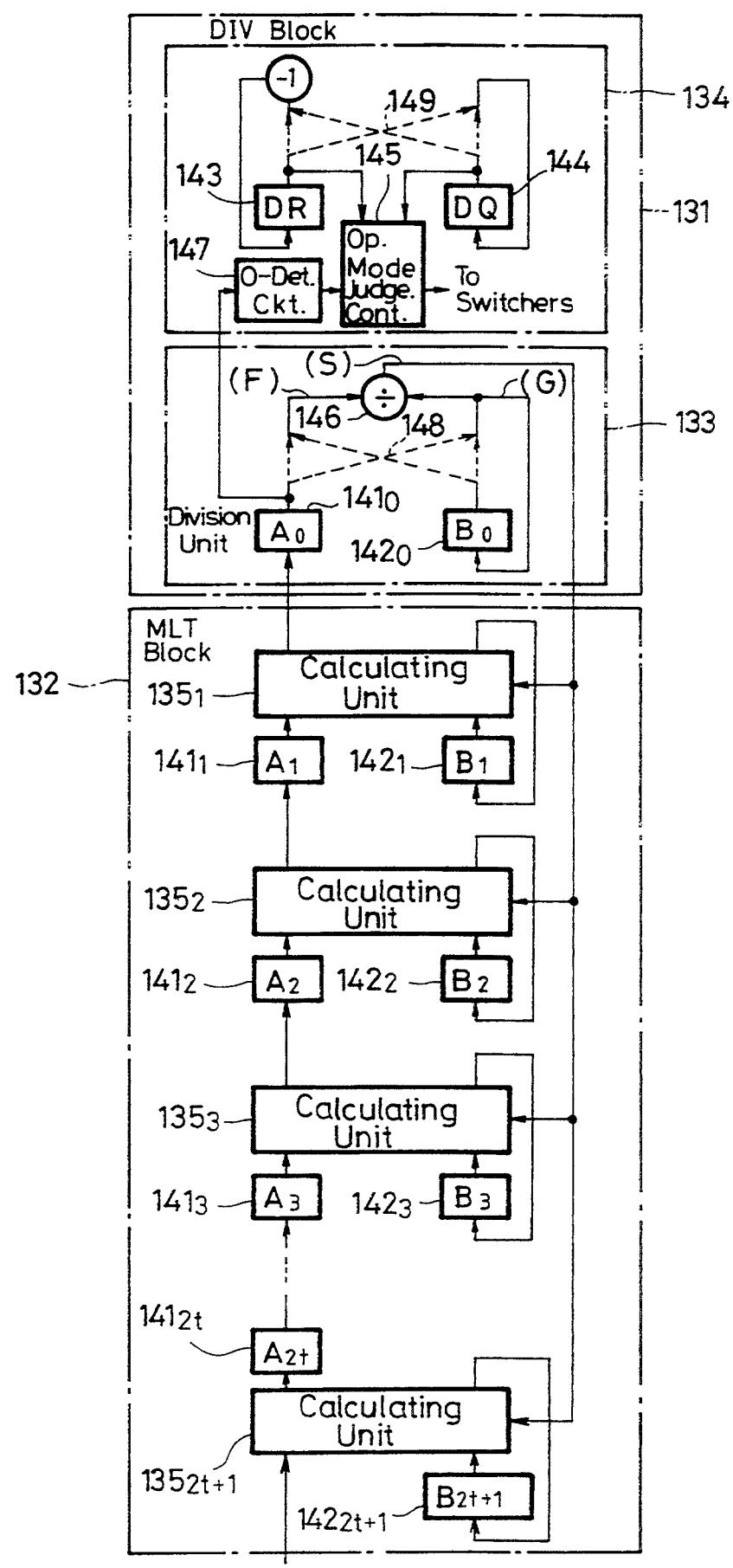
FIG. 14 is a block diagram of an Euclidean mutual division circuit according to a first embodiment of the present invention.

An Euclidean mutual division circuit for carrying out the method D is schematically shown in FIG. 14. As shown in FIG. 14, the Euclidean mutual division circuit basically comprises a DIV block 131 and an MLT block 132.

The DIV block 131 comprises a single division unit 133 for a high-order coefficient, the division unit 133 having a finite-field divider 146, and a control unit 134 for detecting the magnitudes of $dR_i$, $dQ_i$ and also detecting whether the coefficient of degree $dR_i$ of $R_i(X)$ is equal to zero to generate a signal for controlling data path switchers in the DIV block 131 and the MLT block 132.

If calculation units are not used in a multiplexing fashion for effecting calculations on a plurality of coefficients, then the MLT block 132 requires $(2t+1)$ calculation units $135_1$ through $135_{2t+1}$ when it is implemented as a system capable of error-correcting t symbols.

Figure 15:
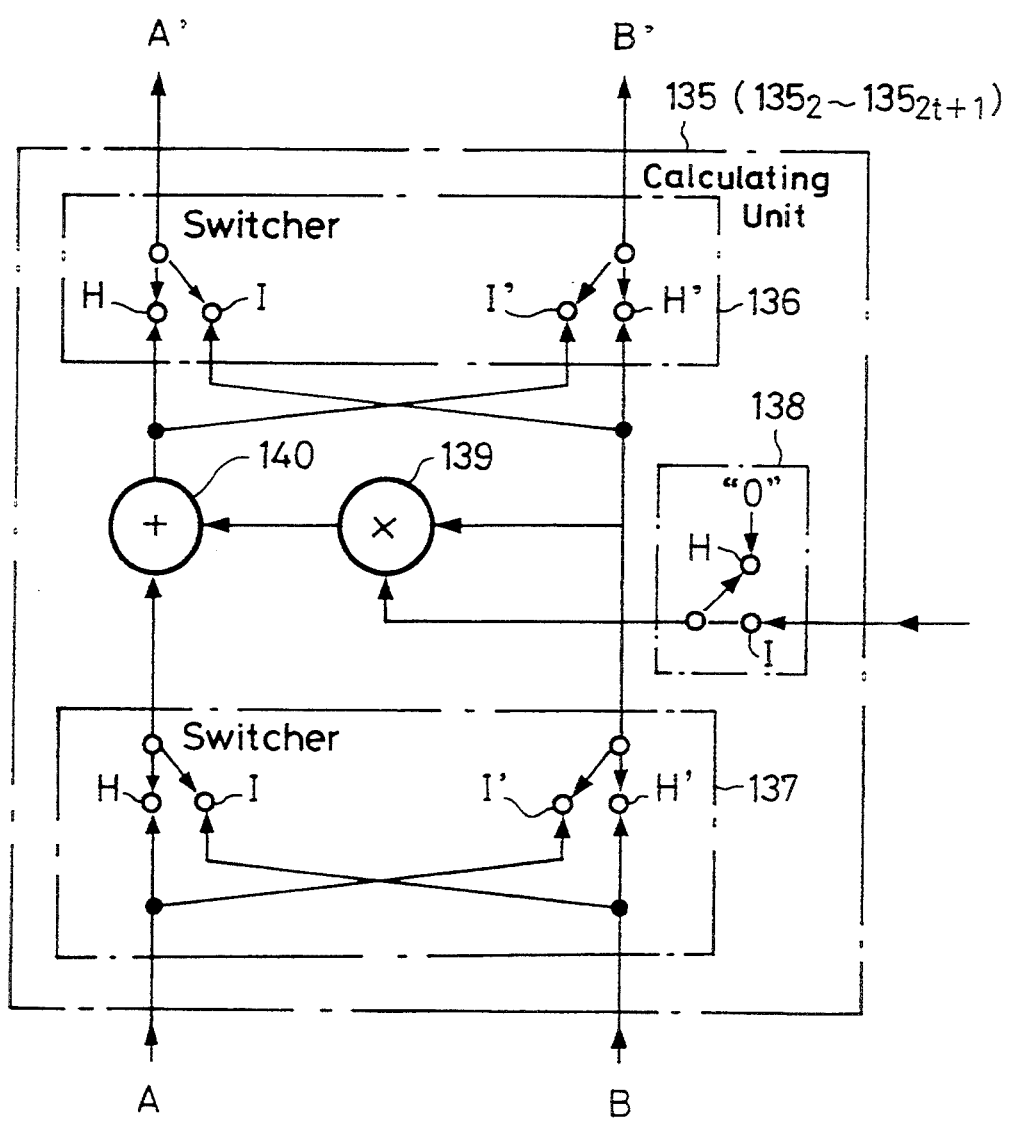
FIG. 15 is a detailed circuit diagram of each calculation unit in the Euclidean mutual division circuit shown in FIG. 14.

As shown in FIG. 15, each of the calculation units $135_1$ through $135_{2t+1}$ comprises three data path switchers 136, 137, 138, a multiplier 139, and an adder 140, for calculating a given finite field.

The DIV block 131 and the MLT block 132 have a lefthand group of registers $141_0$ through $141_{2t}$, which are referred to as A-side registers, and a righthand group of registers $142_0$ through $142_{2t+1}$, which are referred to as B-side registers. The A-side registers $141_0$ through $141_{2t}$ in the DIV block 131 and the MLT block 132 are reduced to $(2t+1)$ registers, and the B-side registers $142_0$ through $142_{2t+1}$ in the DIV block 131 and the MLT block 132 are reduced to $(2t+2)$ registers, the total number of the registers being thus reduced to $4t+3$. The number of calculation units $135_1$ through $135_{2t+1}$ is reduced to $2t+1$.

The DIV block 131 has a register 143 for DR and a register 144 for DQ, the registers 143, 144 being indicative of the degrees of coefficients stored in the register $141_0$ for $A_0$ and the register $142_0$ for $B_0$. When actual calculations are carried out in cross and normal modes (described later on), the registers 143, 144 indicate the degrees of $R_i(X)$, $Q_i(X)$.

Figure 19:
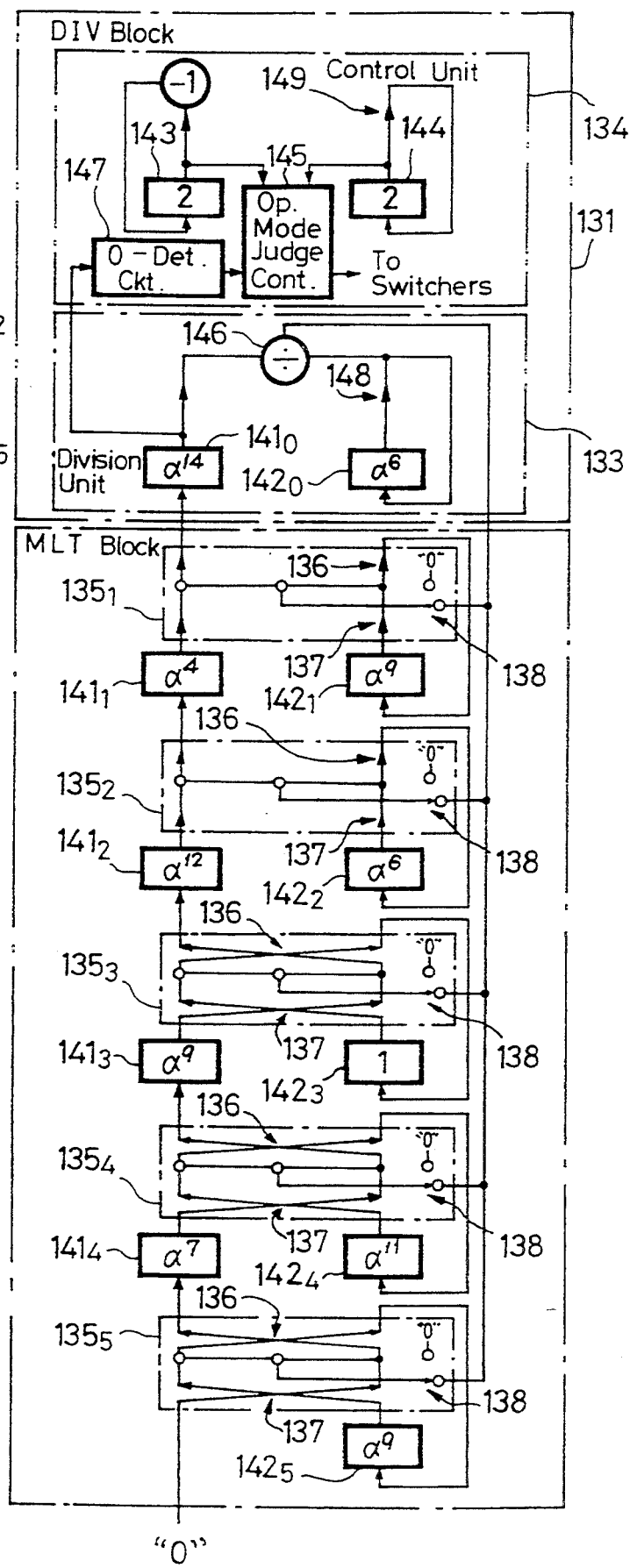

The control unit 134 in the DIV block 131 has an operation mode determination and control circuit 145 for determining an operation mode from the results of comparison of DR, DQ stored in the registers 143, 144 and the result of detection as to whether $A_0$ is 0 from the register $141_0$. Based on the determined operation mode and the value of DR, the calculation units $135_1$ through $135_{2t+1}$ in the MLT block 132 are controlled independently of each other. No A-side register is required on the input side of the final calculation unit $135_{2t+1}$. The circuit shown in FIG. 19 is conceptual, and the A-side register which is shown on the input side of each of the calculation units $135_1$ through $135_{2t}$ is omitted from the final calculation unit $135_{2t+1}$. The final calculation unit $135_{2t+1}$ may be made simpler in circuit arrangement as the input applied to the A-side thereof is always 0.

A process of storing coefficients of each polynomial to be calculated will be described below.

According to the method D, storage locations for the coefficients of $Q_i(X)$, $\lambda_i(X)$ and storage locations for the coefficients of $R_i(X)$, $\mu_i(X)$ are used respectively in common.

In the calculation in each step of the Euclidean mutual division method, the relationship expressed by:

$$dR_i + d\mu_i < dQ_i + d\lambda_i = 2t \tag{42}$$

is satisfied. This relationship indicates that the sum of the degrees of $Q_i(X)$, $\lambda_i(X)$ is always $2t$. Therefore, even if the degree of $\lambda_i(X)$ increases as the degree of $Q_i(X)$ decreases, the sum of the numbers of registers for storing the coefficients of polynomials is $2t+2$ at all times. Similarly, since the sum of the degrees of $R_i(X)$, $\mu_i(X)$ is $2t-1$ or smaller, the sum of the numbers of registers for storing the coefficients may be at most $2t+1$.

The registers $141_0$ through $141_{2t}$ shown in FIG. 14 are registers for storing the coefficients of $R_i(X)$ and $\mu_i(X)$.

In each calculation step, the coefficients of the polynomial $R_i(X)$ of degree $dR_i$ are stored in the A-side registers $141_0$ through $141_{2t}$ successively from the high-order coefficient (of degree $dR_i$).

Following the coefficient of degree 0 of $R_i(X)$, the coefficients of $\mu_i(X)$ are stored successively from the low-order coefficient (of degree 0). Therefore, the coefficients of $R_i(X)$ are stored successively from the high-order coefficient in the A-side registers $141_0$ through $141_{2t}$ successively from the high-order register $141_0$, and then the coefficients of $\mu_i(X)$ are stored successively from the low-order coefficients in the A-side registers $141_0$ through $141_{2t}$.

The registers $142_0$ through $142_{2t+1}$ shown in FIG. 14 are registers for storing the coefficients of $Q_i(X)$, $\lambda_i(X)$.

In each calculation step, the coefficients of the polynomial $Q_i(X)$ of degree $dQ_i$ are stored in the registers $142_0$ through $142_{2t+1}$ successively from the high-order coefficient (of degree $dQ_i$). Following the coefficient of degree 0 of $Q_i(X)$, the coefficients of $\lambda_i(X)$ are stored successively from the low-order coefficient (of degree 0).

Inasmuch as $dQ_i + d\lambda_i = 2t$ and the sum of the degrees is constant at all times, the coefficients of $Q_i(X)$ are stored in the B-side registers $142_0$ through $142_{2t+1}$ successively from the high-order register $142_0$, and then the coefficients of $\lambda_i(X)$ are stored in the B-side registers $142_0$ through $142_{2t+1}$ successively from the low-order register $142_{2t+1}$.

As described above, as the coefficient-storing registers $141_0$ through $141_{2t}$, $142_0$ through $142_{2t+1}$ are used in common, the entire circuit may be composed of (4t+3) registers.

In setting initial values, initial values for $dR_0$, $dQ_0$, $d\lambda_0$, $d\mu_0$ which indicate the respective degrees of $R_0(X)$, $Q_0(X)$, $\lambda_0(X)$, $\mu_0(X)$ are considered to be $2t-1$, $2t$, $0$, $-1$, respectively. The initial value for the degree $d\mu_0$ of $\mu_0(X)$ is selected to be $-1$ for the convenience of the algorithm.

Therefore, 2t coefficients (syndromes) of $R_0(X)=S(X)$ are stored in the registers $141_0$ through $141_{2t+1}$. Since the degree of $\mu_0(X)$ is $-1$ for the convenience of the algorithm, the number of coefficients of $\mu_0(X)$ is 0, i.e., there is no corresponding register, so that the register $141_{2t}$ is set to 0.

As regards initial values for the registers $142_0$ through $142_{2t}$, since $Q_0(X)=X_{2t},1$ is stored in the register $142_0$, and 0 is stored in the registers $142_1$ through $142_{2t}$. As $\lambda_0(X)=1$, 1 is stored in the register $141_{2t+1}$.

The initial values $2t-1$, $2t$ are stored in the registers 143, 144 which store DR and DQ, respectively. A circuit for setting initial values is required in addition to the circuit arrangement shown in FIG. 14. However, such a circuit is omitted from illustration as it is not essential and is a simple circuit.

Operation of the circuit arrangement shown in FIG. 14 will be described below.

After the registers have been set to initial values, the Euclidean mutual division method is carried out one step per clock pulse. The registers $141_0$, $141_1$, $141_2$, ..., $142_0$, ..., $142_{2t+1}$ hold results of calculations in each clock cycle.

Calculations in an ith step will be considered below. The values of $DR_{i-1}$, $DQ_{i-1}$ stored in the registers 143, 144 are compared by the operation mode determination and control circuit 145. If $DR_{i-1} < DQ_{i-1}$ and it is indicated by a 0-detecting circuit 147 that the register $141_0$ which stores the high-order coefficient of $R_{i-1}(X)$ holds 0, then the operation mode determination and control circuit 145 recognizes the cross mode. Otherwise, the operation mode determination and control circuit 145 recognizes the normal mode.

When the operation mode is determined, data path switchers 148 and 149 in the DIV block 131 switches to select crossed data or normal data depending on the determined operation mode. The value of the register $141_0$, i.e., the high-order coefficient (of degree $dR_{i-1}$) of $R_{i-1}(X)$, and the value of the register $142_0$, i.e., the high-order coefficient (of degree $dQ_{i-1}$) of $Q_{i-1}(X)$ pass through the data path switcher 148 to the finite-field divider 146. The finite-field divider 146 effects a division F/G on its inputs F and G, and outputs a result S.

Each of the calculation units $135_1$ through $135_{2t+1}$ in the MLT block 132 carries out calculations depending on the operation mode determined by the DIV block 131. A calculation unit having a number j effects calculations according to the following tables, with respect to a register having a register number (suffix) j among the registers $141_1$ through $141_{2t}$, $142_1$ through $142_{2t+1}$ which store coefficients to be calculated:

TABLE 2-1

Calculation table in the cross mode
Cross mode

| Calculation unit number | Calculation mode | Calculations | |
|---|---|---|---|
| $0 < j \leq dR_{i-1}$ | 1 | $A' = A \times S + B$ | $B' = A$ |
| $dR_{i-1} < j \leq dQ_{i-1}$ | 2 | $A' = B$ | $B' = A$ |
| $dQ_{i-1} < j$ | 3 | $A' = B$ | $B' = B \times S + A$ |

TABLE 2-2

Calculation table in the normal mode
Normal mode

| Calculation unit number | Calculation mode | Calculations | |
|---|---|---|---|
| $0 < j \leq dQ_{i-1}$ | 4 | $A' = B \times S + A$ | $B' = B$ |
| $dQ_{i-1} < j \leq dR_{i-1}$ | 5 | $A' = A$ | $B' = B$ |
| $dR_{i-1} < j$ | 6 | $A' = A$ | $B' = A \times S + B$ |

TABLE 2-3

Calculation table in the shift mode
Shift mode

| Calculation unit number | Calculation mode | Calculations | |
|---|---|---|---|
| All j | 5 | $A' = A$ | $B' = B$ |

The calculated $A'$ and $B'$ values are stored in the next registers, completing calculations in one step of the revised Euclidean mutual division method. The above calculating process is repeated 2t times to determine an error locator polynomial $\sigma(X)$ and an error evaluator polynomial $\omega(X)$.

Usually, according to the algorithm of the revised Euclidean mutual division method, the same calculations as those effected on the set of the polynomials $R_{i-1}(X)$, $Q_{i-1}(X)$ are effected on the set of the polynomials $\lambda_{i-1}(X)$, $\mu_{i-1}(X)$. According to the method D, the polynomials $R_{i-1}(X)$, $Q_{i-1}(X)$ are stored respectively in the A-side registers $141_0$ through $141_{2t}$, and the B-side registers $142_0$ through $142_{2t+1}$, and the polynomials $\lambda_{i-1}(X)$, $\mu_{i-1}(X)$ are stored inversely therein.

To carry out the same calculations on $R_{i-1}(X)$, $\lambda_{i-1}(X)$, the coefficients of $\lambda_{i-1}(X)$ which are stored inversely may be inverted, calculated, and the result may be stored inversely again.

Therefore, the polynomials $R_{i-1}(X)$, $Q_{i-1}(X)$ may be calculated a number of times corresponding to the number of coefficients of the polynomial whose degree is smaller in either the cross mode or the normal mode. No calculations are needed for those registers which store coefficients that are not next to each other of $R_{i-1}(X)$, $Q_{i-1}(X)$. This also holds true for $\lambda_{i-1}(X)$, $\mu_{i-1}(X)$.

For example, in the cross mode, since $dR_{i-1} < dQ_{i-1}$, the polynomials $R_{i-1}(X)$, $Q_{i-1}(X)$ are calculated only when the register number j is in the range of $0 < j < dR_{i-1}$.

When the register number j is in the range of $dR_{i-1} < j \leq dQ_{i-1}$, the coefficients of $R_{i-1}(X)$ are stored in the A-side registers $141_0$ through $141_{2t}$, and the coefficients of $\lambda_{i-1}(X)$ are stored in the B-side registers $142_0$ through $142_{2t+1}$. In this case, no calculations are necessary on the coefficients stored in the registers, but the stored coefficients may only be switched around.

Of the registers $141_0$ through $141_{2t}$, $142_0$ through $142_{2t+1}$, those A-side registers whose register number is in the range of $dQ_{i-1} < j$ store $\mu_{i-1}(X)$ and those B-side registers whose register number is in the same range store $\lambda_{i-1}(X)$. The values in the A- and B-side registers may be inverted, and the same calculations as those on $dR_{i-1}(X)$, $dQ_{i-1}(X)$ may be carried out thereon, and the results may be stored inversely again.

Consequently, the number of calculations per step is 2t at all times, and the calculations can be performed by the (2t+1) calculation units according to the method D.

While no calculations need to be carried out in the shift mode, the shift mode may be effected in the same manner as the normal mode in which the output S from the finite-field divider 146 is 0.

For example, it is possible to effect calculations according to the following tables:

TABLE 3-1

| | Calculation table in the cross mode Cross mode | | |
|---|---|---|---|
| Calculation unit number | Calculation mode | Calculations | |
| $0 < j \leq \min(dR_{i-1}, dQ_{i-1})$ | 1 | $A' = A \times S + B$ | $B' = A$ |
| $\min(dR_{i-1}, dQ_{i-1}) < j \leq \max(dR_{i-1}, dQ_{i-1})$ | 2 | $A' = B$ | $B' = A$ |
| $\max(dR_{i-1}, dQ_{i-1}) < j$ | 3 | $A' = B$ | $B' = B \times S + A$ |

TABLE 3-2

| | Calculation table in the normal and shift modes Normal mode | | |
|---|---|---|---|
| Calculation unit number | Calculation mode | Calculations | |
| $0 < j \leq \min(dR_{i-1}, dQ_{i-1})$ | 4 | $A' = B \times S + A$ | $B' = B$ |
| $\min(dR_{i-1}, dQ_{i-1}) < j \leq \max(dR_{i-1}, dQ_{i-1})$ | 5 | $A' = A$ | $B' = B$ |
| $\max(dR_{i-1}, dQ_{i-1}) < j$ | 6 | $A' = A$ | $B' = A \times S + B$ |

The calculation units $135_1$ through $135_{2t+1}$ may be of any specific arrangement insofar as it can perform at least the six calculations indicated in the tables 3-1, 3-2 above.

For example, each of the calculation units $135_1$ through $135_{2t+1}$ may be of a circuit arrangement as shown in FIG. 15. The circuit shown in FIG. 15 comprises three data path switchers 136, 137, 138, a multiplier 139, and an adder 140. The necessary calculations can be accomplished by controlling the data path switchers 136, 137, 138 according to the table given below. The same calculations may also be carried out by a control process other than the switcher control process in the table.

TABLE 4

| Calculation mode | Calculations | | Switcher 137 | Switcher 138 | Switcher 136 |
|---|---|---|---|---|---|
| | | Control of the data path switches | | | |
| 1 | $A' = A \times S + B$ | $B' = A$ | cross | through | normal |
| 2 | $A' = B$ | $B' = A$ | cross | clear | normal |
| 3 | $A' = B$ | $B' = B \times S + A$ | normal | through | cross |
| 4 | $A' = B \times S + A$ | $B' = B$ | normal | through | normal |
| 5 | $A' = A$ | $B' = B$ | normal | clear | normal |
| 6 | $A' = A$ | $B' = A \times S + B$ | cross | through | cross |

In the above table, "normal" for the data path switchers 137, 136 indicates switching to terminals I—I', and "cross" for the data path switchers 137, 136 indicates switching to terminals H—H' and "through" for the data path switcher 138 indicates switching to a terminal I, and "clear" for the data path switcher 138 indicates switching to a terminal H to input O.

Operation of the Euclidean mutual division circuit shown in FIG. 14, which is composed of the calculation units $135_1$ through $135_{2t+1}$ shown in FIG. 15, is shown by way of example in FIGS. 16 through 20. The illustrated example is the same as the example described above in which t=2 symbols are error-corrected using a finite field GF($2^4$) that is defined using an irreducible polynomial $g(X) = X^4 + X + 1$. It is assumed that all the registers $141_0$ through $141_4$, $142_0$ through $142_5$, 143 and 144 have been initialized.

Figure 16:
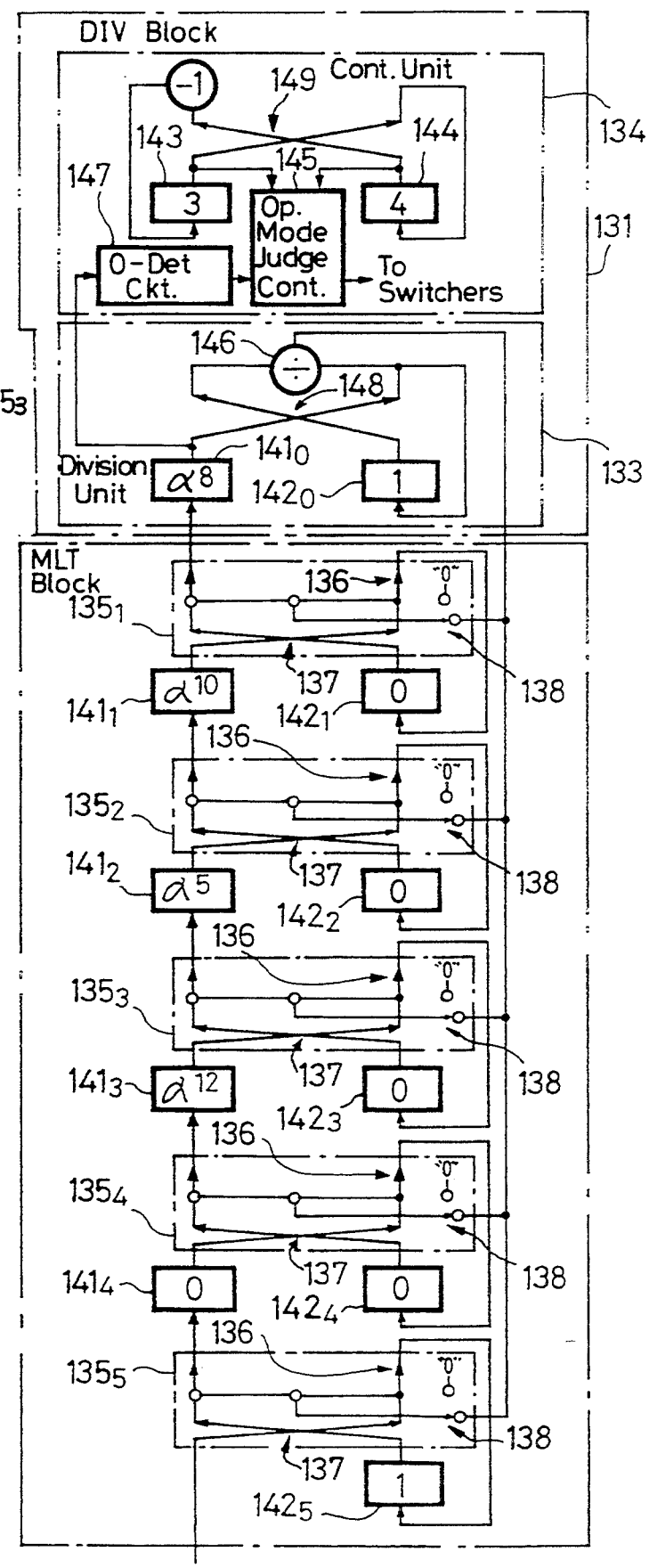
FIGS. 16–20 are block diagrams showing the manner in which the Euclidean mutual division circuit shown in FIG. 14 operates.

In a first step shown in FIG. 16, since the value ($dR_0$) of DR stored in the register 143 is 3, and the value ($dQ_0$) of DQ stored in the register 144 is 4, the condition DR<DQ is satisfied, and the coefficient of degree $dR_0$ of $R_0(X)$ stored in the register $141_0$ is $\alpha^8$ which is nonzero. Therefore, the operation mode is determined as the cross mode. The data path switcher 148 on the input side of the finite-field divider 146 is switched into the cross state, and the finite-field divider 146 carries out a calculation $1/\alpha^8$. The result $S = \alpha^7$ of division is output to the calculation units $135_1$ through $135_5$.

In FIG. 16, therefore, the cross mode of operation is carried out.

Consequently, the calculation units $135_1$ through $135_5$ in the MLT block 132 carries out calculations based on the calculation table 2-1 in the cross mode.

According to the table 2-1, the data stored in the registers $141_j$, $142_j$ whose register number is j are calculated in one of three different calculation modes depending on whether the register number j is in the range of $0 < j \leq dR_{i-1}$, $dR_{i-1} < j \leq dQ_{i-1}$, or $dQ_{i-1} < j$.

For example, in the first step shown in FIG. 16, since $dR_0 = 3$, $dQ_0 = 4$, the calculation units $135_1$ through $135_3$ corresponding to respective register numbers 1 through 3 carry out calculations indicated by $A' = A \times S + B$ and $B' = A$. For such calculations, the data path switcher 137 is in the cross state, the data path switcher 138 is in the through state, and the data path switcher 136 is in the normal state.

The calculation unit $135_4$ corresponding to a register number 4 carries out calculations indicated by $A' = B$ and $B' = A$. For such calculations, the data path switcher 137 is in the cross state, the data path switcher 138 in the clear state, and the data path switcher 136 in the normal state.

The calculation units $135_5$, $135_6$ corresponding to respective register numbers 5, 6 carry out calculations indicated by $A' = B$ and $B' = B \times S + A$. For such calculations, the data path switcher 137 is in the normal state, the data path switcher 138 is in the through state, and the data path switcher 136 is in the cross state.

In the first step, the data path switchers 136, 137, 138 in the calculation units $135_1$ through $135_5$ operate as shown in FIG. 16. The calculated results are stored in the registers $141_0$ through $141_4$, $142_0$ through $142_5$ in the next clock cycle as shown in FIG. 17.

Figure 1:
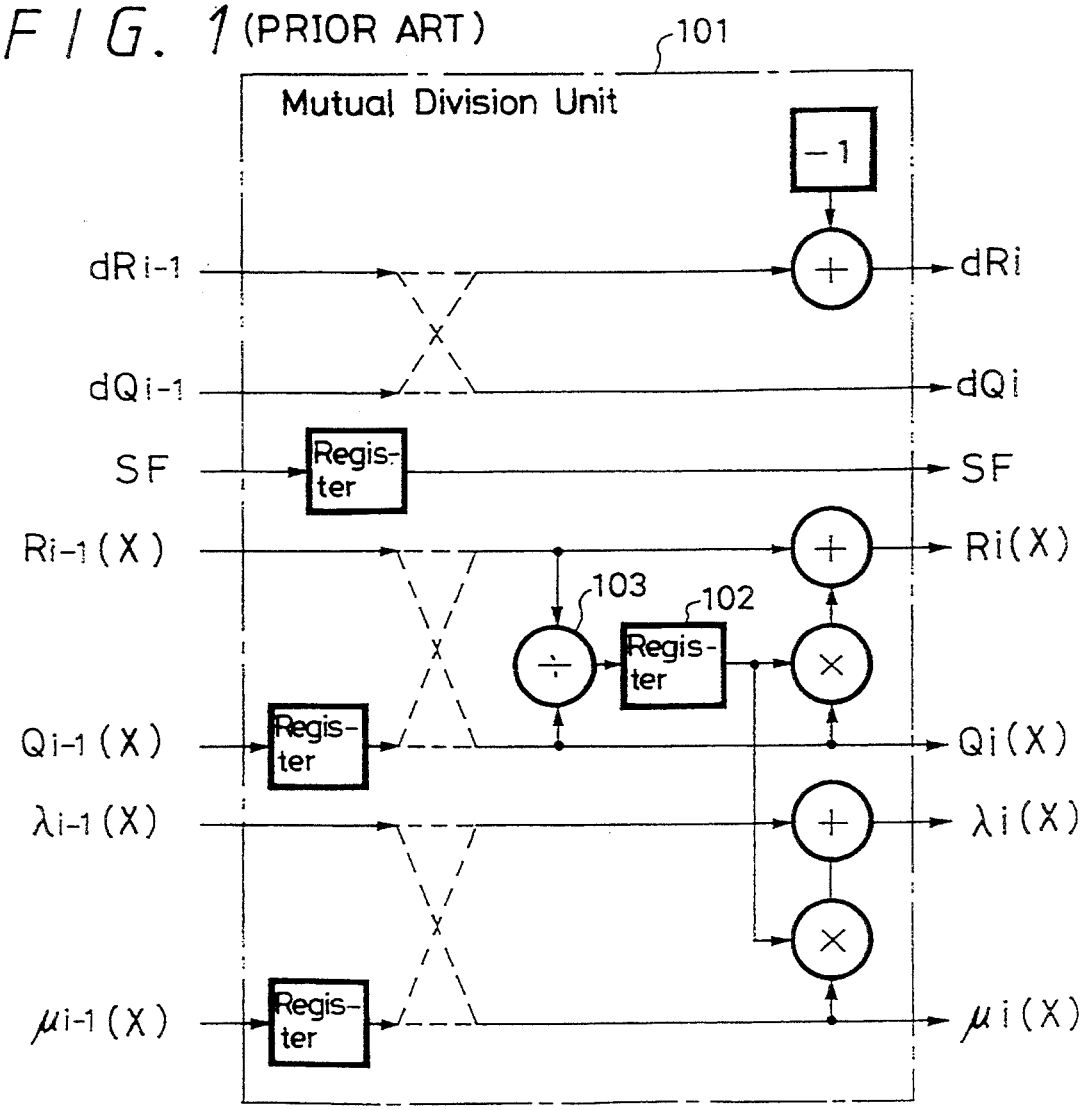
FIG. 1 is a block diagram of a mutual division unit for use in a conventional Euclidean mutual division circuit.
Figure 2:
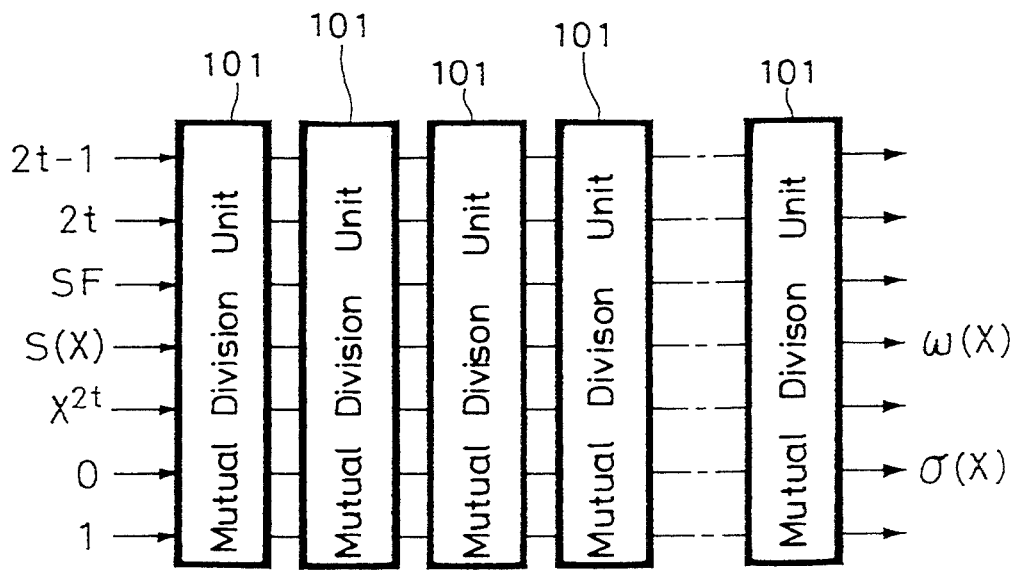
FIG. 2 is a block diagram of a conventional Euclidean mutual division circuit.
Figure 3:
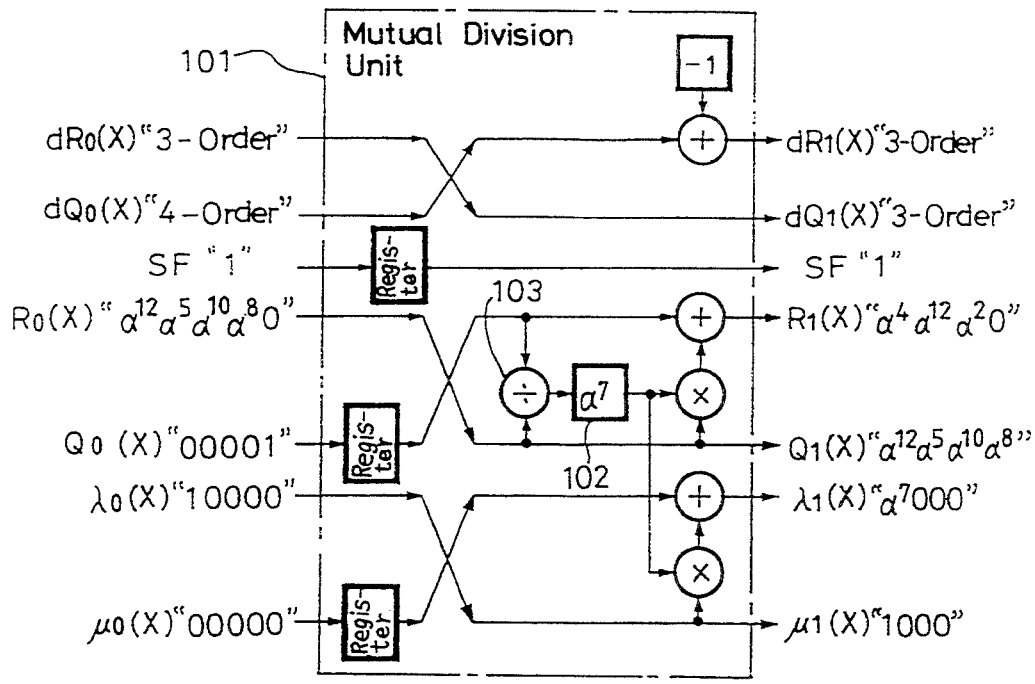
FIG. 3 is a block diagram showing the manner in which the Euclidean mutual division circuit shown in FIG. 2 operates.
Figure 4:
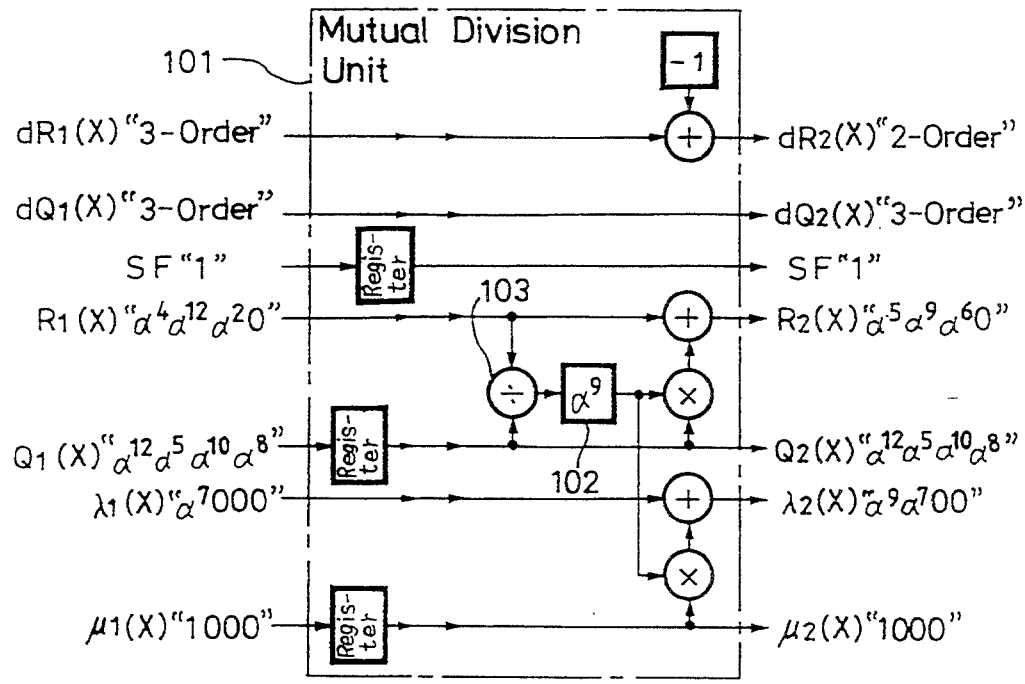
Figure 7:
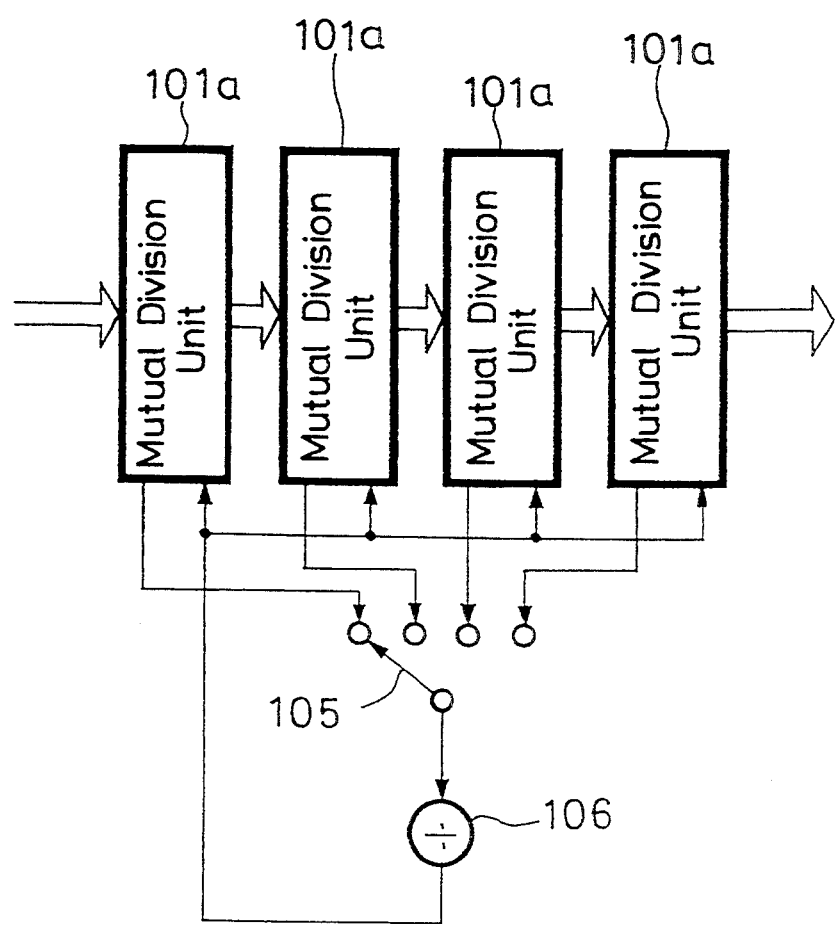
FIG. 7 is a block diagram of another conventional Euclidean mutual division circuit.
Figure 8:
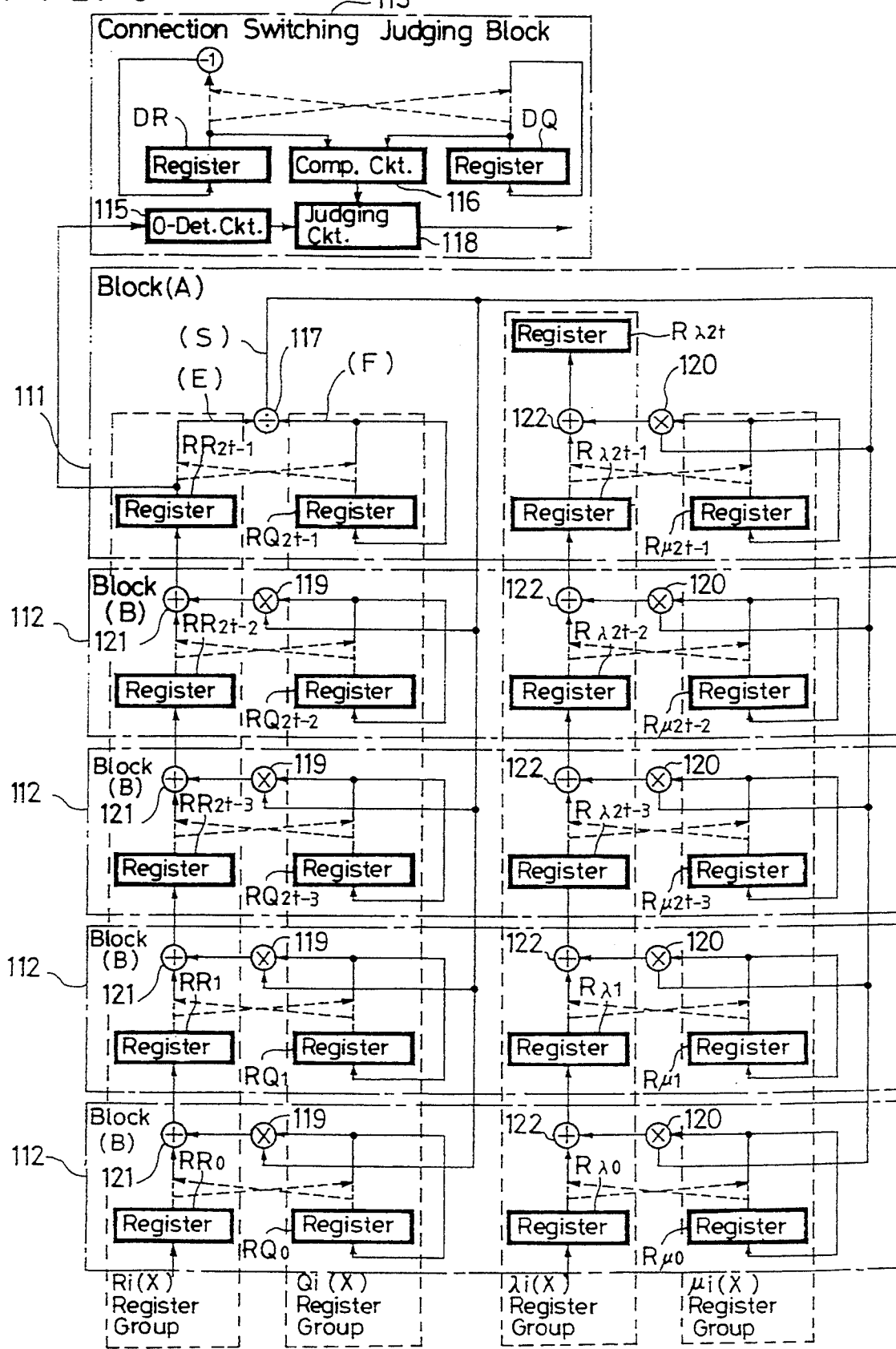
FIG. 8 is a block diagram of still another conventional Euclidean mutual division circuit.
Figure 9:
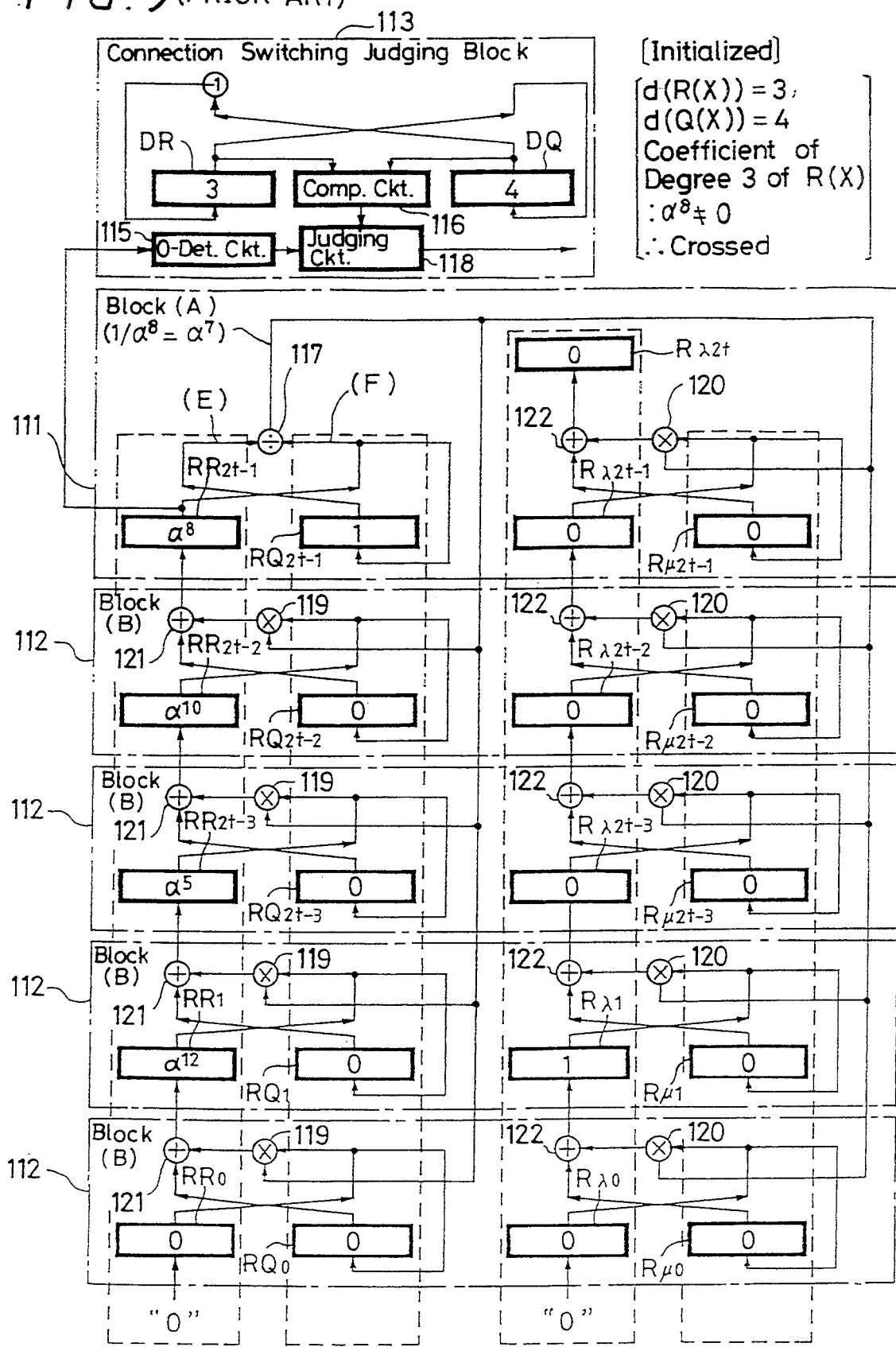
FIGS. 9–13 are block diagrams showing the manner in which the Euclidean mutual division circuit shown in FIG. 8 operates.
Figure 10:
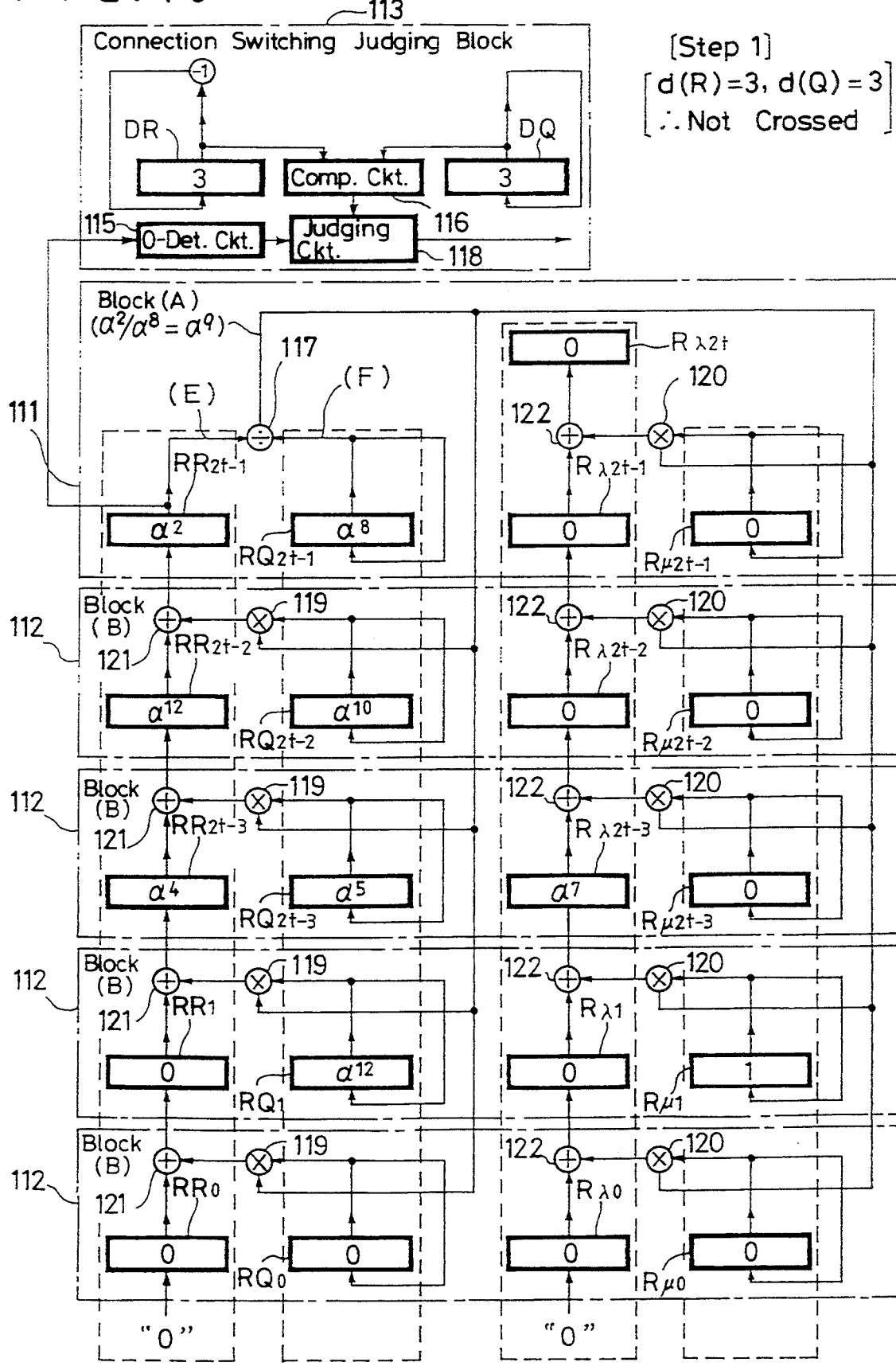
Figure 11:
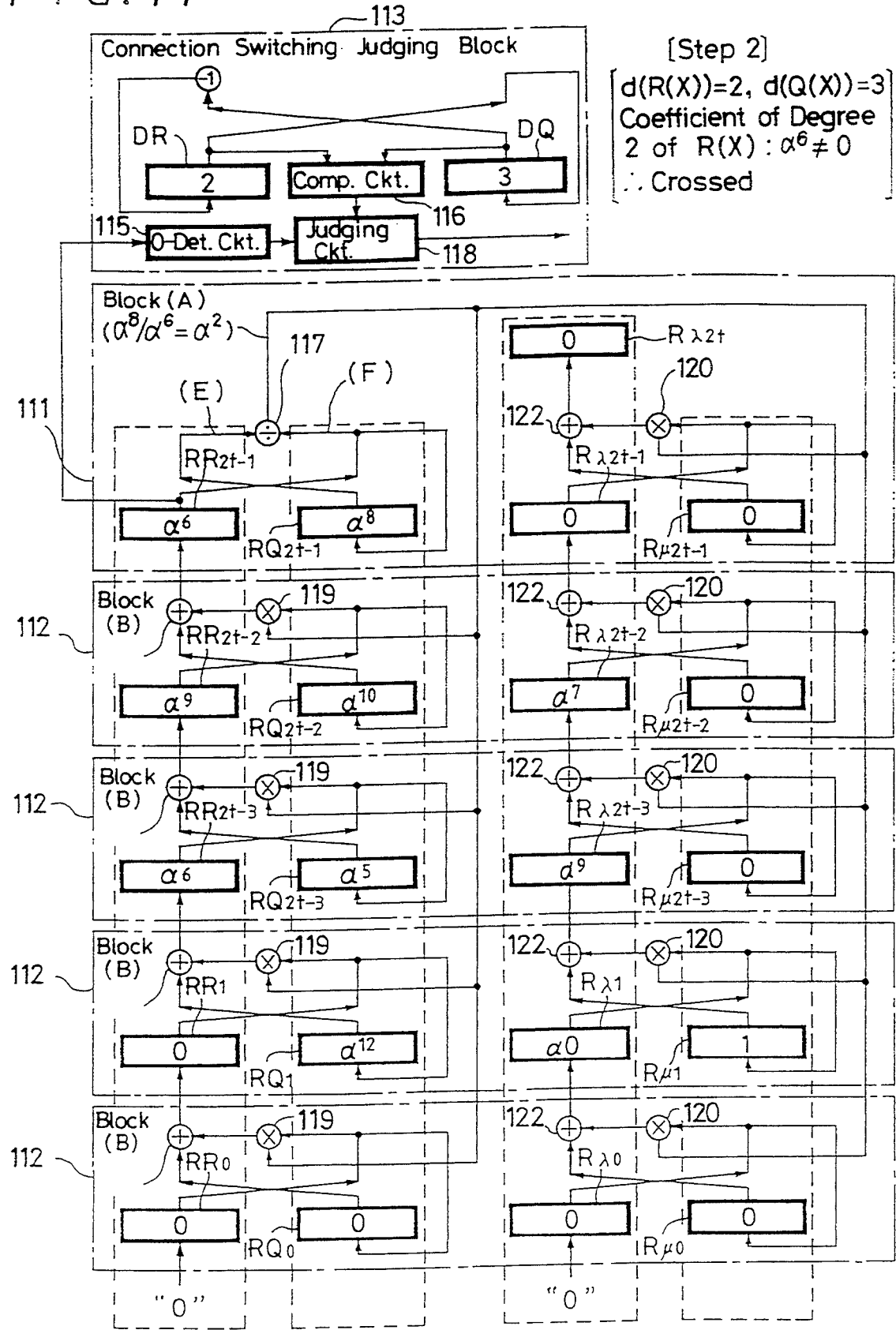
Figure 12:
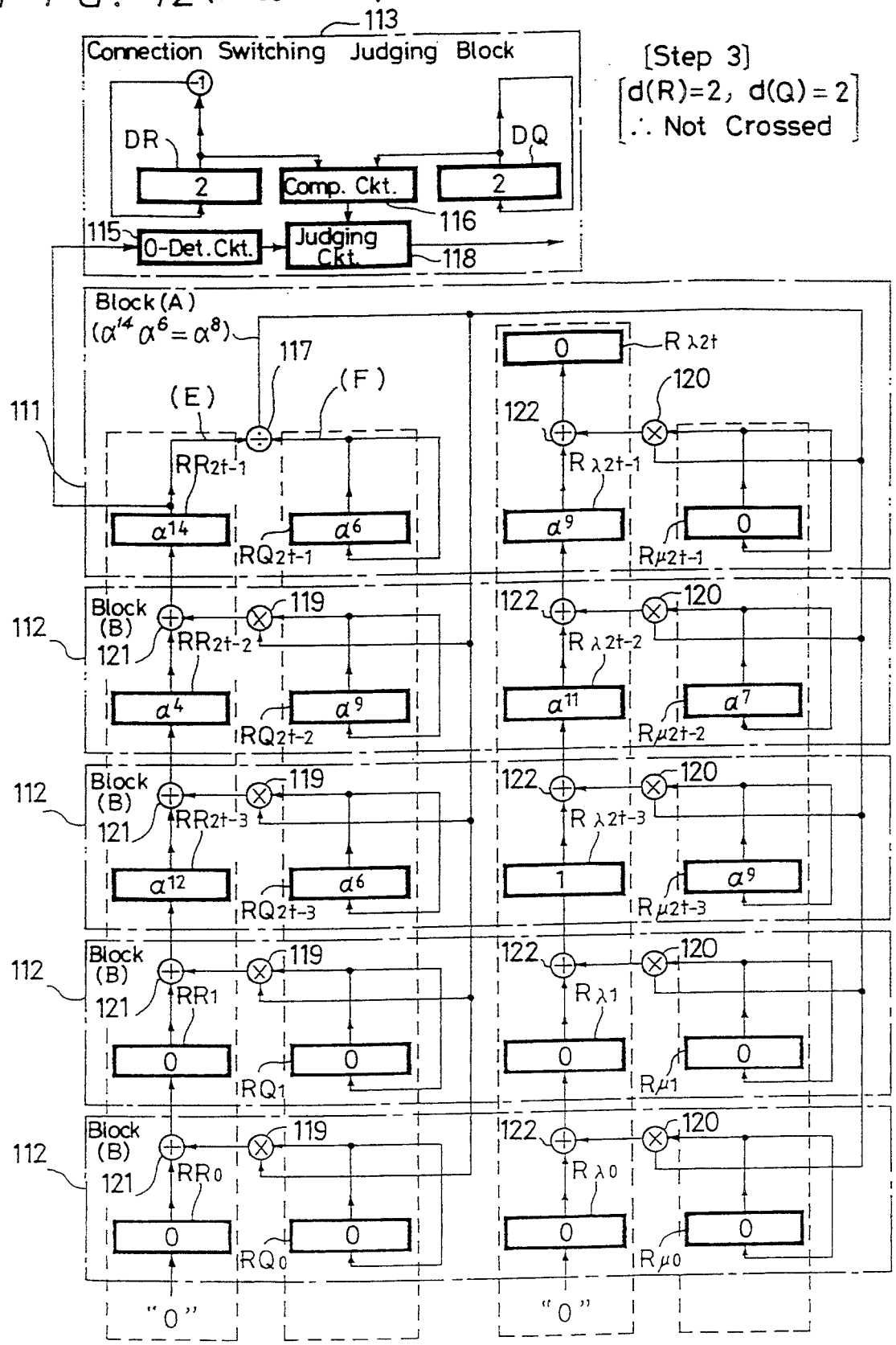
Figure 17:
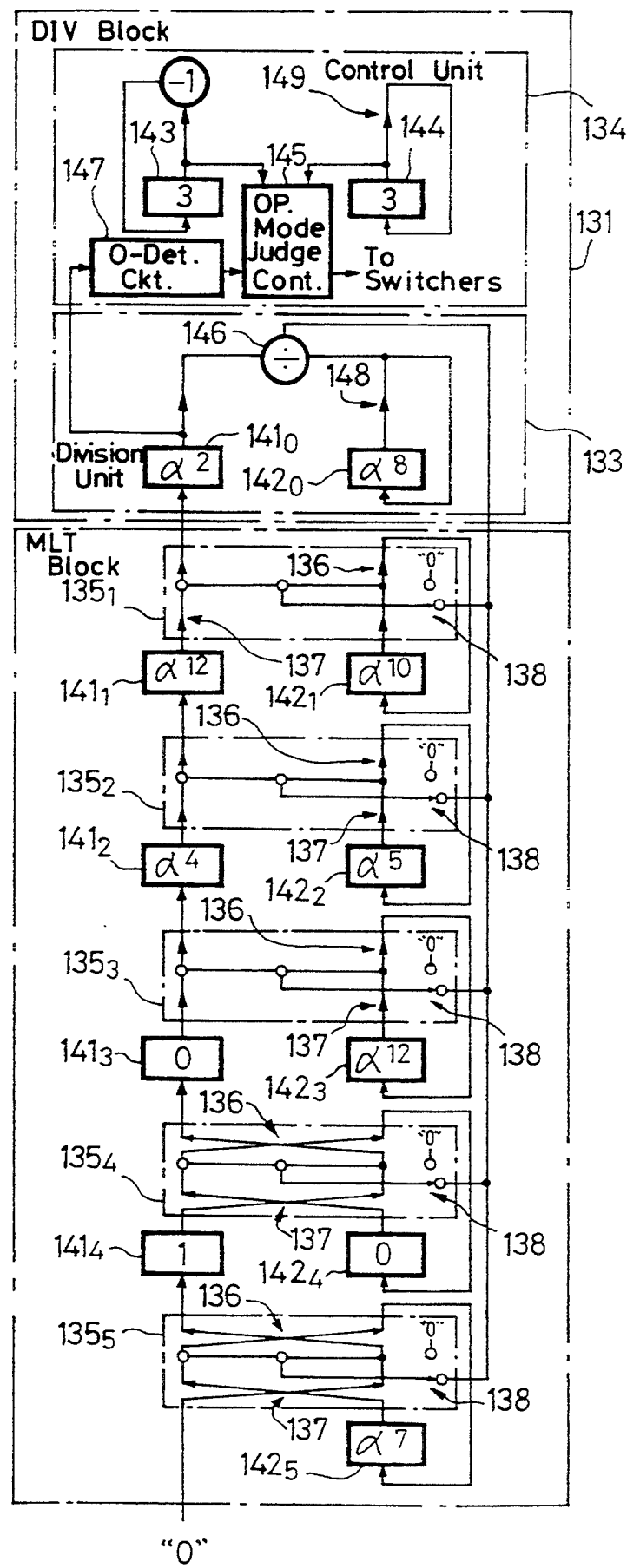

A comparison between FIG. 10 showing the results according to method C and FIG. 17 showing the results according to method D indicates that while the coefficients of $\lambda_1(X)$, $\mu_1(X)$ are stored behind $R_i(X)$, $Q_i(X)$ successively from the high-order coefficient in FIG. 10, the coefficients of $\lambda_1(X)$, $\mu_1(X)$ are stored in inverted locations, i.e., successively from the low-order coefficient in FIG. 17. In FIG. 17, therefore, since the coefficients whose value is 0 that are essentially unnecessary are not required to be stored, no wasteful calculations are carried out, and as a result, the number of calculation units is greatly reduced.

In a second step shown in FIG. 17, since the value $(dR_i)$ of DR stored in the register 143 is 3, and the value $(dQ_i)$ of DQ stored in the register 144 is 3, the condition $DR \geq DQ$ is satisfied. Therefore, the operation mode is determined as the normal mode. The data path switcher 148 on the input side of the finite-field divider 146 is switched into the normal state, and the finite-field divider 146 carries out a calculation $\alpha^2/\alpha^8$. The result $S = \alpha^9$ of division is output to the calculation units $135_1$ through $135_5$.

In FIG. 17, therefore, the cross mode of operation is carried out. Consequently, the calculation units $135_1$ through $135_5$ in the MLT block 132 carries out calculations based on the calculation table 2-2 in the normal mode.

In the second step shown in FIG. 17, the calculation units $135_1$ through $135_3$ corresponding to respective register numbers 1 through 3 carry out calculations indicated by $A' = B \times S + A$ and $B' = B$. For such calculations, the data path switcher 137 is in the normal state, the data path switcher 138 is in the through state, and the data path switcher 136 is in the normal state.

The calculation units $135_4$, $135_5$ corresponding to the registers $141_4$, $142_4$, $142_5$ having register numbers 4, 5 carry out calculations indicated by $A' = A$ and $B' = A \times S + B$. For such calculations, the data path switcher 137 is in the cross state, the data path switcher 138 is in the through state, and the data path switcher 136 is in the cross state.

Figure 18:
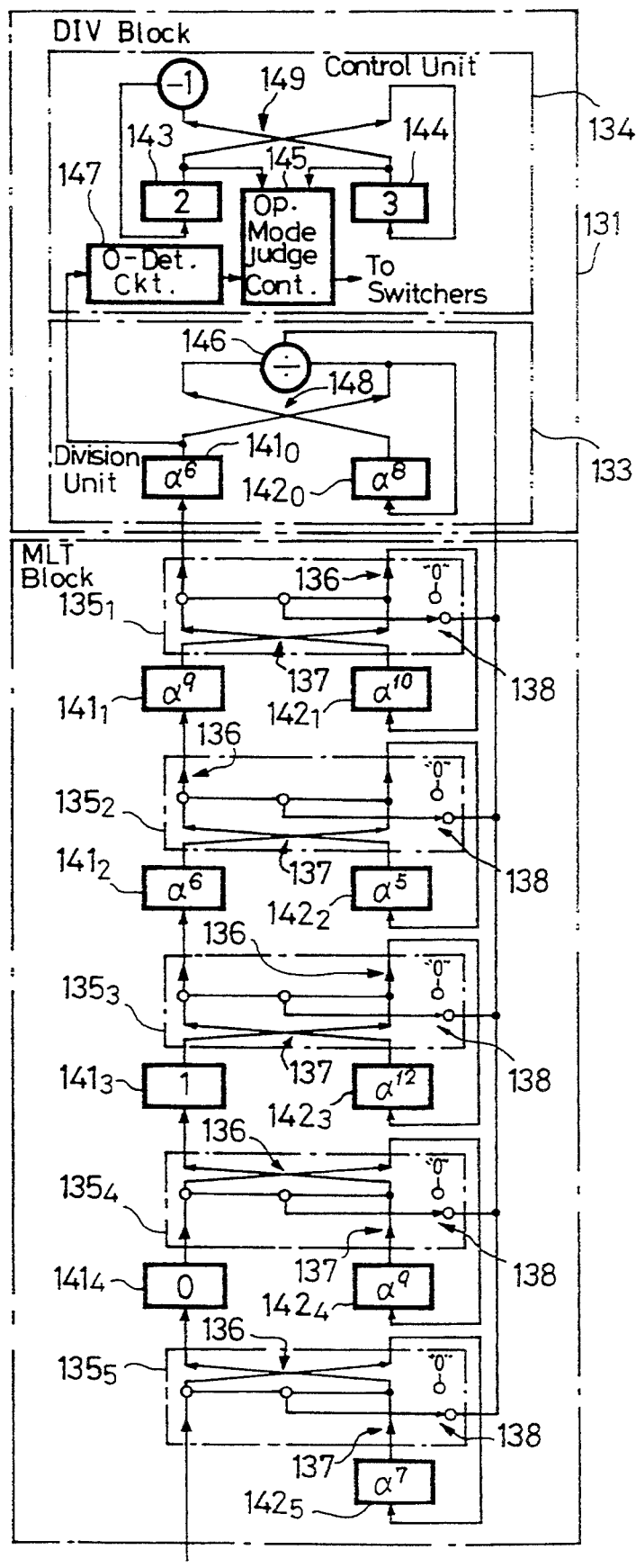

In the second step, the data path switchers 136, 137, 138 in the calculation units $135_1$ through $135_5$ operate as shown in FIG. 17. The calculated results are stored in the registers $141_0$ through $141_4$, $142_0$ through $142_5$ in the next clock cycle as shown in FIG. 18.

Figure 13:
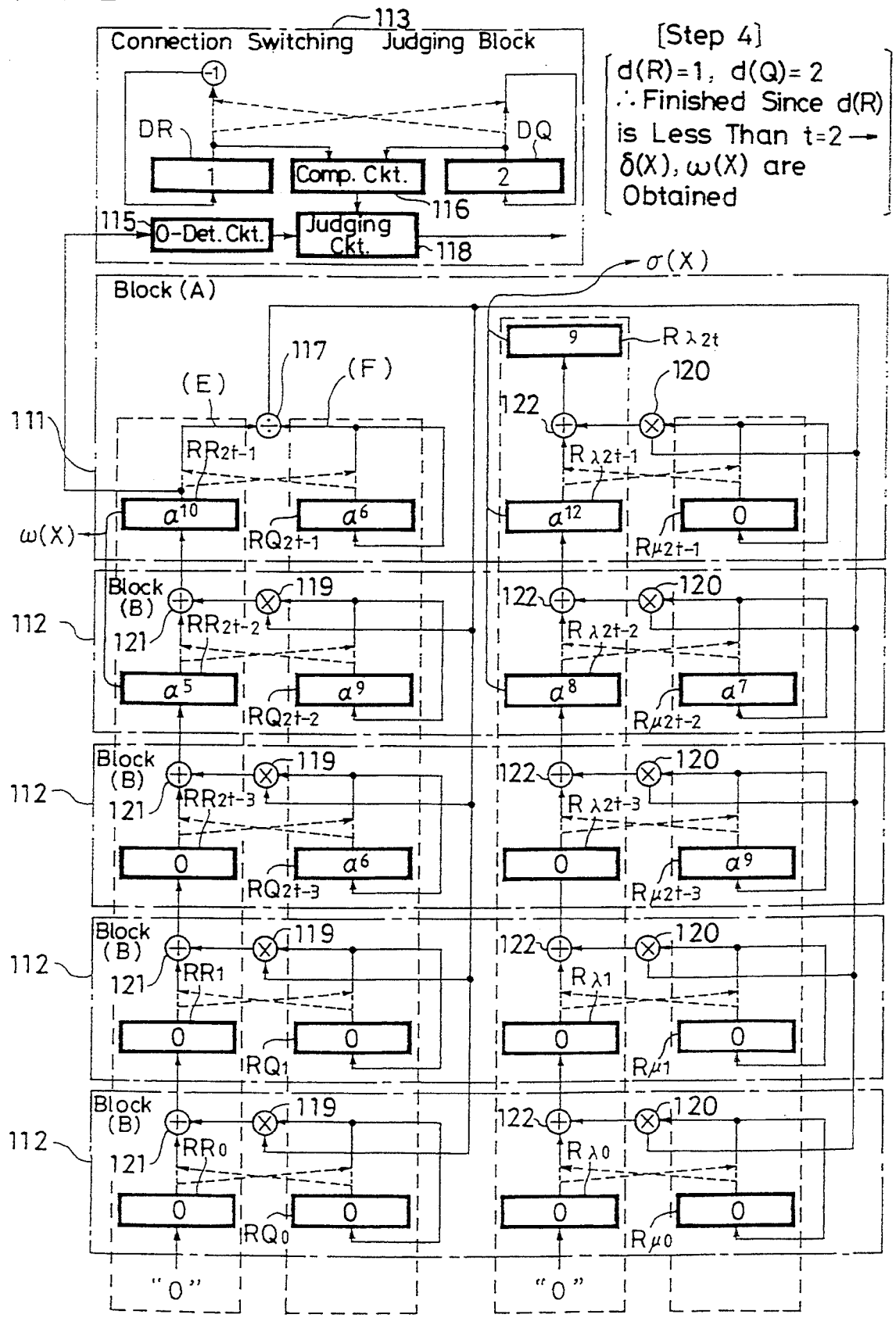
Figure 20:
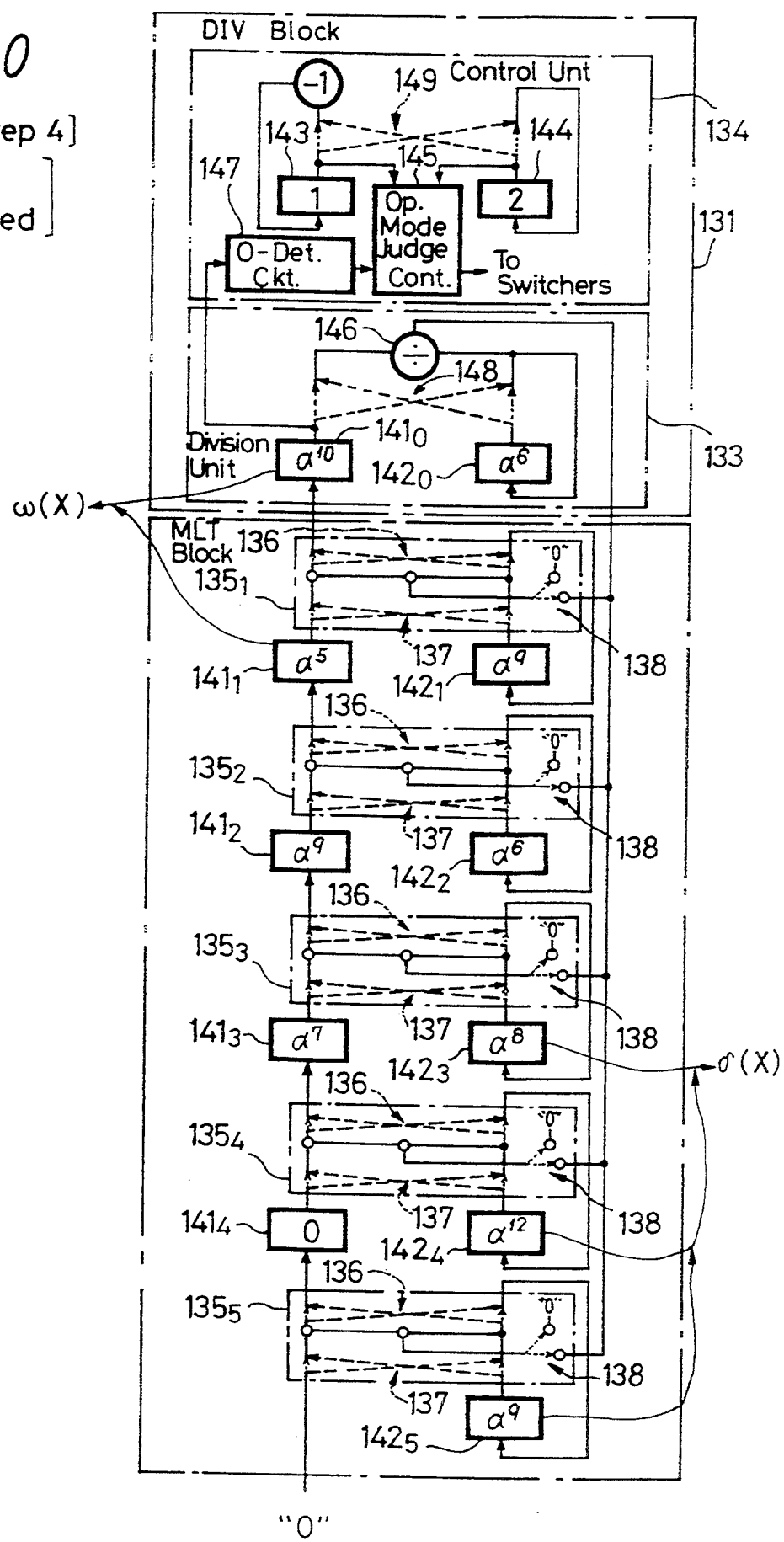

The first and third steps are effected in the cross mode, and the second and fourth steps are effected in the normal mode as shown in FIGS. 16 through 19, until finally the polynomials $\sigma(X)$, $\omega(X)$ are obtained as shown in FIG. 20. It should be noted that the locations and sequence of the obtained coefficients of $\sigma(X)$ are inverted relationship to those of the coefficients which are obtained according to method C as shown in FIG. 13.

The calculations corresponding to the operations shown in FIGS. 16 through 20, respectively, are summarized in the following tables:

| | | | [STEP 1] Cross mode dR = 3, dQ = 4 | |
|---|---|---|---|---|
| i | $A_i$ | $B_i$ | Calculations on A side | Calculations on B side |
| 0 | $\alpha^8$ | 1 | $S = B/A = \alpha^7$ | — |
| 1 | $\alpha^{10}$ | 0 | $A = B + \alpha^7 \times A$ | $B = A$ |
| 2 | $\alpha^5$ | 0 | $A = B + \alpha^7 \times A$ | $B = A$ |
| 3 | $\alpha^{12}$ | 0 | $A = B + \alpha^7 \times A$ | $B = A$ |
| 4 | 0 | 0 | $A = B$ | $B = A$ |
| 5 | 0 | 1 | $A = B$ | $B = A + \alpha^7 \times B$ |

| | | | [STEP 2] Normal mode dR = 3, dQ = 3 | |
|---|---|---|---|---|
| i | $A_i$ | $B_i$ | Calculations on A side | Calculations on B side |
| 0 | $\alpha^2$ | $\alpha^8$ | $S = A/B = \alpha^9$ | — |
| 1 | $\alpha^{12}$ | $\alpha^{10}$ | $A = A + \alpha^9 \times B$ | $B = B$ |
| 2 | $\alpha^4$ | $\alpha^5$ | $A = A + \alpha^9 \times B$ | $B = B$ |
| 3 | 0 | $\alpha^{12}$ | $A = A + \alpha^9 \times B$ | $B = B$ |
| 4 | 1 | 0 | $A = A$ | $B = B + \alpha^9 \times A$ |
| 5 | 0 | $\alpha^7$ | $A = A$ | $B = B + \alpha^9 \times A$ |

| | | | [STEP 3] Cross mode dR = 2, dQ = 3 | |
|---|---|---|---|---|
| i | $A_i$ | $B_i$ | Calculations on A side | Calculations on B side |
| 0 | $\alpha^6$ | $\alpha^8$ | $S = B/A = \alpha^2$ | — |
| 1 | $\alpha^9$ | $\alpha^{10}$ | $A = B + \alpha^2 \times A$ | $B = A$ |
| 2 | $\alpha^6$ | $\alpha^5$ | $A = B + \alpha^2 \times A$ | $B = A$ |
| 3 | 1 | $\alpha^{12}$ | $A = B$ | $B = A$ |
| 4 | 0 | $\alpha^9$ | $A = B$ | $B = A + \alpha^2 \times B$ |
| 5 | 0 | $\alpha^7$ | $A = B$ | $B = A + \alpha^2 \times B$ |

| | | | [STEP 4] Normal mode dR = 2, dQ = 2 | |
|---|---|---|---|---|
| i | $A_i$ | $B_i$ | Calculations on A side | Calculations on B side |
| 0 | $\alpha^{14}$ | $\alpha^6$ | $S = A/B = \alpha^8$ | — |
| 1 | $\alpha^4$ | $\alpha^9$ | $A = A + \alpha^8 \times B$ | $B = B$ |
| 2 | $\alpha^{12}$ | $\alpha^6$ | $A = A + \alpha^8 \times B$ | $B = B$ |
| 3 | $\alpha^9$ | 1 | $A = A$ | $B = B + \alpha^8 \times A$ |
| 4 | $\alpha^7$ | $\alpha^{11}$ | $A = A$ | $B = B + \alpha^8 \times A$ |
| 5 | 0 | $\alpha^9$ | $A = A$ | $B = B + \alpha^8 \times A$ |

As described above, although method D carries out the same calculations as those of method C in the steps, the coefficients of the polynomials are stored and the calculation units $135_1$ through $135_{2t+1}$ are arranged specially according to method D to reduce the number of registers for storing the polynomial coefficients and the number of calculations in each step to half those of method C.

According to method D, furthermore, the algorithm can be achieved by the $(2t+1)$ calculation units $135_1$ through $135_{2t+1}$ whose number is greater, by 1, than the minimum number 2t of calculations (multiplications) which are required in principle in each step of the Euclidean mutual division method, insofar as each of the calculation units $135_1$ through $135_{2t+1}$ is used only once in the calculations in one step of the Euclidean mutual division method.

The number of registers for storing the coefficients of polynomials required during the calculations is a minimum of $4t+3$ in principle. This is because the process of storing the polynomial coefficients according to method D is entirely different from the process of storing the polynomial coefficients according to method C as described above.

More specifically, method C requires registers for independently storing the coefficients of polynomials. Therefore, it is necessary to have $(8t+1)$ registers sufficient to store the coefficients even if each of the polynomials is of the greatest degree. The large number of registers results in an increase in the number of calculation units.

According to method D, as shown in FIG. 14, the A-side registers $141_0$ through $141_{2t}$ are used to store the coefficients of $R_i(X)$, $\mu_i(X)$. In each of the calculation steps, the high-order coefficient (of degree $dR_i$) of the polynomial $R_i(X)$ of degree $dR_i$ is stored in the register $141_0$, and the successive low-order coefficients of $R_i(X)$ are stored respectively in successive registers. Following the coefficient of degree 0 of $R_i(X)$, the low-order coefficient (of degree 0) of the polynomial $\mu_i(X)$ is stored in a corresponding register, and the successive high-order coefficients of $\mu_i(X)$ are stored respectively in successive registers. Therefore, the A-side registers $141_0$ through $141_{2t}$ store, successively from the register $141_0$, the coefficients of $R_i(X)$ successively from its high-order coefficient, and then the coefficients of $\mu_i(X)$ successively from its low-order coefficient.

The B-side registers $142_0$ through $142_{2t+1}$ are used to store the coefficients of $Q_i(X)$, $\lambda_i(X)$. In each of the calculation steps, the high-order coefficient (of degree $dQ_i$) of the polynomial $Q_i(X)$ of degree $dQ_i$ is stored in the register $142_0$, and the successive low-order coefficients of $Q_i(X)$ are stored respectively in successive registers. Following the coefficient of degree 0 of $Q_i(X)$, the low-order coefficient (of degree 0) of the polynomial $\lambda_i(X)$ is stored in a corresponding register, and the successive high-order coefficients of $\lambda_i(X)$ are stored respectively in successive registers.

At this time, the degrees of the polynomials satisfy the following relationship:

$$dR_i + d\mu_i < dQ_i + d\lambda_i = 2t \qquad (43)$$

Therefore, since the sum of $dQ_i$, $d\lambda_i$ is always 2t, the number of the B-side registers $142_0$ through $142_{2t+1}$ may be $2t+2$, and the number of the A-side registers $141_0$ through $141_{2t}$ may be $2t+1$, which is smaller than the number of the B-side registers by 1.

According to the method shown in FIG. 14, the polynomial $R_i(X)$ is shifted to the high-order position (i.e., multiplied by X) each time calculations are carried out in one step of the Euclidean mutual division method.

When the polynomials $\lambda_i(X)$, $\mu_i(X)$ are inversely stored according to the method D, since the coefficients of these polynomials are stored successively from the low-order coefficient, the polynomial $\mu_i(X)$ is shifted toward the low-order location as compared with the polynomial $\lambda_i(X)$, achieving the same result as if the polynomial $\lambda_i(X)$ is shifted toward the low-order location as compared with the polynomial $\mu_i(X)$. At this time, the calculation units are arranged to effect necessary calculations on the polynomials $R_i(X)$, $\lambda_i(X)$.

Each of the calculation units $135_1$ through $135_{2t+1}$ shown in FIG. 15 is slightly more complex in arrangement than those required by method C because the data path switchers 136, 138 are added. However, such an addition is very small, and the overall circuit scale can greatly be reduced as the number of calculation units and the number of coefficient-storing registers are reduce to half.

The calculation units $135_1$ through $135_{2t+1}$ may be of any specific arrangement insofar as it can perform the calculations indicated in the tables 2-1, 2-2, 2-3 above.

Consequently, there may be many various arrangements other than the arrangement shown in FIG. 15 for carrying out the same calculations. It is possible to employ a circuit arrangement which is more complex than the circuit arrangement shown in FIG. 15 for operation at higher speed.

According to method D, there are various methods of initializing the registers $141_0$ through $141_{2t}$, $142_0$ through $142_{2t+1}$, 143, 144. If selectors are connected to the input terminals of the registers $141_0$ through $141_{2t}$, $142_0$ through $142_{2t+1}$, 143, 144, then it is possible to initialize all the registers at the same time by shifting the selectors to initial value setting units and inputting values (initial values) set by the initial value setting units to the registers $141_0$ through $141_{2t}$, $142_0$ through $142_{2t+1}$, 143, 144.

Alternatively, the registers can be successively initialized by serially inputting initial values of respective polynomials as inputs to selectors connected to the input terminals of only low-order registers $141_{2t}$, $142_{2t+1}$ for respective polynomials.

Generally, the required operating speed of error-correcting circuits varies depending on the application in which it is used. In an application as a microprocessor peripheral which demands a low operation speed, an error-correcting circuit is required to have a minimum circuit scale while maintaining a certain operation speed. When used with a high-speed video signal processing device, an error-correcting circuit is required to process data which is continuously input.

The largest circuit scale of all error-correcting circuit arrangements is needed to implement a process for determining an error locator polynomial from syndromes. Either the method A or B or C or D employs the Euclidean mutual division method for performing such a process. The method D according to the first embodiment, which is better in principle than the methods A, B, C, achieve the algorithm with $(2t+1)$ calculation units whose number is greater, by 1, than the minimum number 2t of calculations which are required in principle in each step of the revised Euclidean mutual division method (2).

According to the method D, the calculations in one step are completed in one clock cycle. Therefore, desired $\sigma(X)$, $\omega(X)$ are obtained after 2t clock cycles.

In processing data that is continuously input, i.e., in highest-speed processing, the process for determining an error locator polynomial from syndromes may be effected during a period of time in which data of one code length is input. Usually, a code length n is sufficiently large compared with 2t. Therefore, if the circuit according to method D is used with respect to an error-correcting system for a sufficiently large code length n, the circuit for carrying out the Euclidean mutual division method will be idling during (n−2t) clock cycles, and hence the circuit is of a redundant arrangement.

In processing data that is not continuously input, the circuit arrangement according to method D is not required to obtain an answer in 2t clock cycles though the processing may be finished within a predetermined period of time.

In view of the above problems, it is necessary to reduce the circuit scale by repeatedly using a small number of calculation units within a required period of time.

It is particularly desirable to meet such a requirement by improving the method D which requires the smallest circuit scale in principle.

According to a second embodiment of the present invention, an Euclidean mutual division circuit has a reduced number of calculation units with an increased degree of multiplexing, resulting in a large reduction in the circuit arrangement, and high-speed operation for a greatly increased throughput.

In the second embodiment, the method D described above according to the first embodiment is improved to use a reduced number of calculation units efficiently repeatedly.

As described above, 2t calculations (multiplications) are effected on the coefficients of polynomials $R_{i-1}(X)$, $Q_{i-1}(X)$, $\mu_{i-1}(X)$, $\lambda_{i-1}(X)$ in one step of the revised Euclidean mutual division method (2).

According to the method D, the 2t calculations are performed by (2t+1) calculation units so that the calculations in one step are finished in one clock cycle. Thus, the (2t+1) calculation units carry out only one calculation with respect to the calculations in one step of the revised Euclidean mutual division method (2).

It is assumed that t=2 symbols are error-corrected using a finite field $GF(2^4)$ that is defined using an irreducible polynomial $g(X)=X^4+X+1$. The syndrome polynomial S (X) is defined as:

$$S(X)=\alpha^8 X^3+\alpha^{10}X^2+\alpha^5 X+\alpha^{12} \qquad (44)$$

This example is the same as the example used above.

TABLE 5-3

[STEP 3]
Cross mode dR = 2, dQ = 3

| i | $A_i$ | $B_i$ | Calculations on A side | Calculations on B side |
|---|---|---|---|---|
| 0 | $\alpha^6$ | $\alpha^8$ | $S = B/A = \alpha^2$ | — |
| 1 | $\alpha^9$ | $\alpha^{10}$ | $A = B + \alpha^2 \times A$ | $B = A$ |
| 2 | $\alpha^6$ | $\alpha^5$ | $A = B + \alpha^2 \times A$ | $B = A$ |
| 3 | 1 | $\alpha^{12}$ | $A = B$ | $B = A$ |
| 4 | 0 | $\alpha^9$ | $A = B$ | $B = A + \alpha^2 \times B$ |
| 5 | 0 | $\alpha^7$ | $A = B$ | $B = A + \alpha^2 \times B$ |

TABLE 5-4

[STEP 4]
Normal mode dR = 2, dQ = 2

| i | $A_i$ | $B_i$ | Calculations on A side | Calculations on B side |
|---|---|---|---|---|
| 0 | $\alpha^{14}$ | $\alpha^6$ | $S = A/B = \alpha^8$ | — |
| 1 | $\alpha^4$ | $\alpha^9$ | $A = A + \alpha^8 \times B$ | $B = B$ |
| 2 | $\alpha^{12}$ | $\alpha^6$ | $A = A + \alpha^8 \times B$ | $B = B$ |
| 3 | $\alpha^9$ | 1 | $A = A$ | $B = B + \alpha^8 \times A$ |
| 4 | $\alpha^7$ | $\alpha^{11}$ | $A = A$ | $B = B + \alpha^8 \times A$ |
| 5 | 0 | $\alpha^9$ | $A = A$ | $B = B + \alpha^8 \times A$ |

As is clear from the tables 5-3 and 5-4, according to method D, the coefficients stored in the registers whose register number i ranges from 1 to 2t+1, i.e., the coefficients ranging from 1 to 5, are calculated in the five calculation units $135_1$ through $135_5$.

In the method according to the second embodiment, one calculation unit is used in a time-division multiplexing fashion for carrying out calculations in one step of the revised Euclidean mutual division method (2) thereby to reduce the number of calculation units required. Consequently, although the number of calculation clock cycles is increased, it is possible to reduce the number of calculation units, and to reduce the overall circuit scale.

The degree $L_{opt}$ of multiplexing per calculation unit may be any integer ranging from 1 to 2t. Since if $L_{opt}=1$, then the number of calculation units required is the same as the number of calculation units according to method D, a circuit arrangement where the degree of multiplexing is 2 or more, i.e., $L_{opt} \geq 2$, will be considered below.

Figure 21:
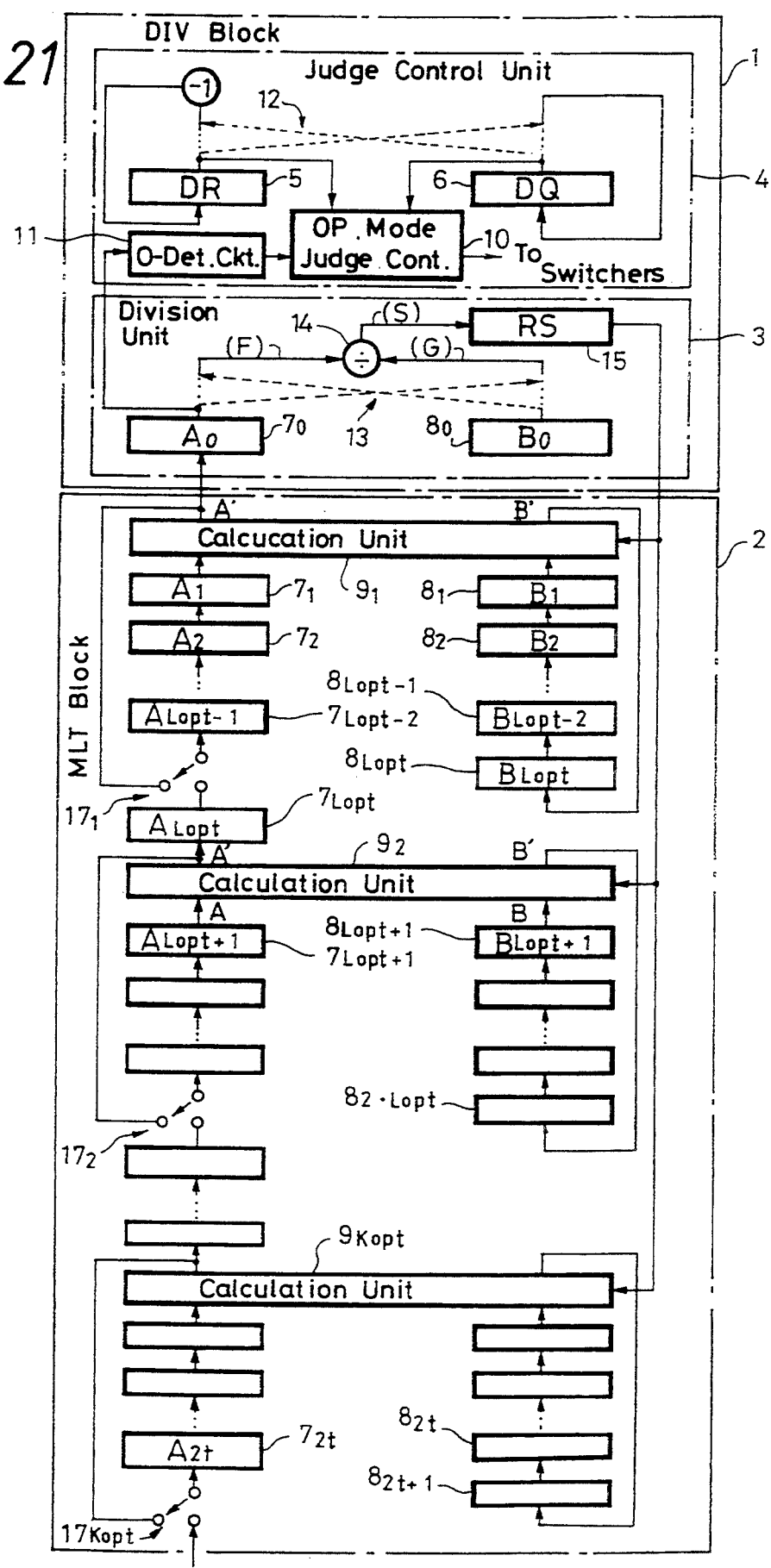
FIG. 21 is a block diagram of an Euclidean mutual division circuit according to a second embodiment of the present invention.

An Euclidean mutual division circuit according to the second embodiment is schematically shown in FIG. 21.

As with method D, the Euclidean mutual division circuit basically comprises a DIV block 1 and an MLT block 2. The DIV block 1 comprises a single division unit 3 for a high-order coefficient, and a determination and control unit 4 for detecting the magnitudes of $dR_i$, $dQ_i$ and also detecting whether the coefficient of degree 0 of $R_i(X)$ to generate a signal for controlling control modes of calculation units $9_1$ through $9_{Kopt}$ and data path switchers $17_1$ through $17_{Kopt}$.

Values stored in a register 5 for DR and a register 6 for DQ in the DIV block 1 are indicative of the degrees of coefficients of polynomials $R_i(X)$, $Q_i(X)$ stored in A- and B-side registers 70, 80. When actual calculations are carried out in cross and normal modes (described later on), these stored values indicate the degrees of $R_i(X)$, $Q_i(X)$.

The determination and control unit 4 in the DIV block 1 determines an operation mode from the results of comparison of DR, DQ stored in the registers 5, 6 and the result of detection as to whether the value is 0 from the register 70. Based on the determined operation mode and the value of DR from the register 5, the calculation units $9_1$ through $9_{Kopt}$ in the MLT block 2 are controlled independently of each other.

The MLT block 2 is composed of the calculation units $9_1$ through $9_{Kopt}$ each composed of a multiplier, an adder, and data path switchers, a plurality of data path switchers $17_1$ through $17_{Kopt}$, and a plurality of registers $7_1$ through $7_{2t}$, $8_1$ through $8_{2t+1}$ for storing coefficients. The overall system employs $K_{opt}$ calculation units.

The coefficients of polynomials to be calculated are stored in the same manner as with the method D. That is, storage locations for the coefficients of $Q_i(X)$, $\lambda_i(X)$ and storage locations for the coefficients of $R_i(X)$, $\mu_i(X)$ are used respectively in common.

To implement a system capable of error-correcting t symbols according to the second embodiment, there are required registers for storing the coefficients of polynomials $R_i(X)$, $Q_i(X)$, $\mu_i(X)$, $\lambda_i(X)$.

Of the registers $7_0$ through $7_{2t}$, $8_0$ through $8_{2t+1}$ shown in FIG. 21, the lefthand group of registers $7_0$ through $7_{2t}$ are referred to as A-side registers, and the righthand group of registers $8_0$ through $8_{2t+1}$ are referred to as B-side registers. In the DIV block 1 and the MLT block 2, there are a total of (2t+1) A-side registers and a total of (2t+2) B-side registers, the total number of the registers being 4t+3. Therefore, the total number of registers used is the same as the total number of registers according to the method D.

In the calculation in each step of the revised Euclidean mutual division method (2), the relationship expressed by:

$$dR_i + d\mu_i < dQ_i + d\lambda_i = 2t \qquad (45)$$

is satisfied. This relationship indicates that the sum of the degrees of $Q_i(X)$, $\lambda_i(X)$ is always 2t. Therefore, even if the degree of $\lambda_i(X)$ increases as the degree of $Q_i(X)$ decreases, the sum of the numbers of registers for storing the coefficients of polynomials is 2t+2 at all times. Similarly, since the sum of the degrees of $R_i(X)$, $\mu_i(X)$ is 2t−1 or smaller, the sum of the numbers of registers for storing the coefficients may be at most 2t+1.

The registers $7_0$ through $7_{2t}$ shown in FIG. 21 are registers for storing the coefficients of $R_i(X)$, $\mu_i(X)$.

In each calculation step of the revised Euclidean mutual division method (2), the coefficients of the polynomial $R_i(X)$ of degree $dR_i$ are stored in the registers $7_0$, $7_1$, $7_2$, . . . successively from the high-order coefficient (of degree $dR_i$).

Following the coefficient of degree 0 of $R_i(X)$, the coefficients of $\mu_i(X)$ are stored successively from the low-order coefficient (of degree 0). Therefore, the coefficients of $R_i(X)$ are stored successively from the high-order coefficient in the A-side registers $7_0$ through $7_{2t}$ successively from the high-order register, and then the coefficients of $\mu_i(X)$ are stored successively from the low-order coefficient in the A-side registers.

The registers $8_0$ through $8_{2t+1}$ shown in FIG. 21 are registers for storing the coefficients of $Q_i(X)$, $\lambda_i(X)$.

In each calculation step, the coefficients of the polynomial $Q_i(X)$ of degree $dQ_i$ are stored in the registers $8_0$, $8_1$, $8_2$, . . . successively from the high-order coefficient (of degree $dQ_i$). Following the coefficient of degree 0 of $Q_i(X)$, the coefficients of $\lambda_i(X)$ are stored successively from the low-order coefficient (of degree 0). Inasmuch as $dQ_i + d\lambda_i = 2t$ and the sum of the degrees is constant at all times, the coefficients of $Q_i(X)$ are stored in the B-side registers $8_0$ through $8_{2t+1}$ successively from the high-order register, and then the coefficients of $\lambda_i(X)$ are stored in the B-side registers successively from the low-order register.

A total number $K_{opt}$ of calculation units $9_1$ through $9_{Kopt}$ are provided one for $L_{opt}$ sets of registers. Each of the calculation units $9_1$ through $9_{Kopt}$ carries out (2t+1) calculations $L_{opt}$ times which are required in each of the steps shown in the above tables 5-3 and 5-4.

More specifically, the calculation unit $9_1$ having a calculation unit number 1 calculates the set of coefficients stored in the registers $7_1$ through $7_{Lopt}$, $8_1$ through $8_{Lopt}$ having register numbers 1 through $L_{opt}$ in $L_{opt}$ clock cycles per step of the Euclidean mutual division method (2). That is, it effects calculations on the set of coefficients stored in the registers $7_1$ through $7_{Lopt}$, $8_1$ through $8_{Lopt}$ having register numbers 1, 2, . . ., $L_{opt}$ in 1, 2, . . ., $L_{opt}$ clock cycles in one step.

Likewise, the calculation unit $9_2$ having a calculation unit number 1 affects calculations on the set of coefficients stored in the registers $7_{Lopt+1}$ through $7_{2.Lopt}$, $8_{Lopt+1}$ through $8_{2.Lopt}$ having register numbers $L_{opt+1}$, $L_{opt+2}$, . . ., $2.L_{opt}$ in 1, 2, . . ., $L_{opt}$ clock cycles.

The calculation units $9_1$ through $9_{Kopt}$ are connected in cascade in combination with the registers $7_0$ through $7_{2t}$, $8_0$ through $8_{2t+1}$, allowing the overall system to perform (2t+1) calculations per step in $L_{opt}$ clock cycles.

The entire system has $(2.L_{opt}.k_{opt}+1)$ registers $7_0$ through $7_{2t}$, $8_0$ through $8_{2t+1}$ for storing coefficients.

Depending on the selected degree $L_{opt}$ of multiplexing, the number of registers may be slightly larger than the number 4t+3 of registers which are essentially necessary. In this case, the value stored in the register $8_{2t+1}$ which is handled by the final calculation unit $9_{Kopt}$ is 0 at all times, and no calculation is necessary therefor. By slightly modifying the method of correcting the register for the final calculation unit $9_{Kopt}$, therefore, it is possible to reduce the number of registers to the minimum register number 4t+3.

[Initialization]

Setting the registers to initial values will be described below. Initial values for $dR_0$, $dQ_0$, $d\lambda_0$, $d\mu_0$ which indicate the respective degrees of $R_0(X)$, $Q_0(X)$, $\lambda_0(X)$, $\mu_0(X)$ are considered to be 2t−1, 2t, 0, −1, respectively. The initial value for the degree $d\mu_0$ of $\mu_0(X)$ is selected to be −1 for the convenience of the algorithm.

Therefore, 2t coefficients (syndromes) of $R_0(X)=S(X)$ are stored in the registers $7_0$ through $7_{2t+1}$. Since the degree of $\mu_0(X)$ is −1 for the convenience of the algorithm, the number of coefficients of $\mu_0(X)$ is 0, i.e., there is no corresponding register, so that the register $7_{2t}$ is set to 0.

As regards to the initial values for the registers $8_0$ through $8_{2t}$, since $Q_0(X)=X_{2t}$, 1 is stored in the register $8_0$, and 0 is stored in the registers $8_1$ through $8_{2t}$. As $\lambda_0(X)=1$, 1 is stored in the register $8_{2t+1}$.

Initial values 2t−1 and 2t which represent the degrees of $R_i(X)$, $Q_i(X)$ are stored in the registers 5, 6 which store $dR_i$, $dQ_i$, respectively. A circuit for setting initial values is required in addition to the circuit arrangement shown in FIG. 21. However, such a circuit is omitted from illustration as it is not essential and is a simple circuit.

[Operation]

The initial values in registers $7_i$ through $7_{LOPT}$ and $8_1$ through $8_{LOPT}$ are calculated in the first embodiment and then the values of the registers 5 and 6 are compared by an operation mode determination and control circuit 10. A 0-detecting circuit 11 detects whether the register $7_0$ which stores the coefficient ($A_0$) of degree DR of $R_{i-1}(X)$ is 0.

The operation mode determination and control circuit 10 recognizes a cross mode when DR <DQ and $A_0 \neq 0$, and a normal mode when DR >DQ. When DR<DQ and $A_0 \neq 0$, the register 5 does not indicate the degree of $R_{i-1}(X)$, and no calculations can be carried out in the cross mode, so that a shift mode is selected. The determined operation mode is maintained in the $L_{opt}$ clock cycles.

When the operation mode is determined, data path switchers 12, 13 in the DIV block 1 switches to select crossed data or normal data depending on the determined operation mode. The value of the register $7_0$, i.e., the high-order coefficient (of degree $dR_{i-1}$) of $R_{i-1}(X)$, and the value of the register $8_0$, i.e., the high-order coefficient (of degree $dQ_{i-1}$) of $Q_{i-1}(X)$ pass through the data path switcher 13 to a divider 14. The divider 14 effects a division F/G on its inputs F, G, and outputs a result S.

A register 15 holds the value S in the $L_{opt}$ clock cycles which are a calculation time in one step.

Each of the calculation units $9_1$ through $9_{Kopt}$ in the MLT block 2 carries out calculations depending on the operation mode determined by the DIV block 1. The calculations themselves are the same as those according to the method D. According to the method of the second embodiment, the set of coefficients stored in all the registers $7_0$ through $7_{2t}$, $8_0$ through $8_{2t+1}$ is calculated not in one clock cycle, but $L_{opt}$ clock cycles, in one step. Consequently, the same values as those produced upon completion of one clock cycle (i.e., one step) according to the method D are stored in the registers $7_0$ through $7_{2t}$, $8_0$ through $8_{2t+1}$ for the first time upon elapse of the $L_{opt}$ clock cycles.

Each of the calculation units $9_1$ through $9_{Kopt}$ has input terminals A, B and output terminals A', B'. In the ith step, the coefficients stored in the registers $7_j$, $8_j$ having a register number j are calculated as indicated by tables 6-1 through 6-3 given below. These calculations are identical to those according to the method D.

The coefficients are calculated successively from those stored in registers with younger register numbers in $L_{opt}$ clock cycles. For example, the calculation unit $9_1$ calculates the coefficients stored in the registers $7_1$, $8_1$ with a register number 1 in the first clock cycle in each step, and also calculates the coefficients stored in the registers $7_2$, $7_3$, ..., $7_{Lopt}$, $8_2$, $8_3$, ..., $8_{Lopt}$ with register numbers 2, 3, ..., $L_{opt}$ in the second, third, ..., $L_{opt}$ clock cycles.

The coefficients stored in the registers $7_0$ through $7_{2t}$, $8_0$ through $8_{2t+1}$ are shifted successively to registers with younger register numbers in successive clock cycles. Calculations in each clock cycle are performed on the coefficients stored in the high-order registers $7_1$, ..., $7_{(K-1).Lopt+1}$, $8_1$, ..., $8_{(K-1).Lopt+}$ that are handled by the calculation units $9_1$ through $9_{Kopt}$.

The calculated results output from the A side of the calculation units $9_1$ through $9_{Kopt}$ are stored in the A-side registers $7_0$, ..., $7_{(K-2).Lopt}$ only in the first clock cycle, and stored in the registers $7_{Lopt-1}$, ..., $7_{(K-1).Lopt-1}$ in the second through $L_{opt}$th clock cycles. The calculated results are shifted successively toward the high-order register in each clock cycle. The registers $7_{Lopt-1}$, ..., $7_{(K-1).Lopt-1}$ store data from the registers $7_{Lopt}$, ..., $7_{(K-1).Lopt}$ only in the first clock cycle, and store the outputs from the A side of the calculation units $9_1$ through $9_{Kopt}$ in the second through $L_{opt}$th clock cycles. The data path switchers $17_1$ through $17_{Kopt}$ serve to control the storage of the data.

The calculated results output from the B side of the calculation units $9_1$ through $9_{Kopt}$ are stored in the registers $8_{Lopt}$, $8_{2.Lopt}$, ..., $8_{(K-2).Lopt}$, and shifted successively.

The registers $7_0$, $8_0$ store the results of calculations in

TABLE 6-1

Calculation table in the cross mode
Cross mode

| Calculation unit number | Calculation mode | Calculations | |
|---|---|---|---|
| $0 < j \leq dR_{i-1}$ | 1 | A' = A × S + B | B' = A |
| $dR_{i-1} < j \leq dQ_{i-1}$ | 2 | A' = B | B' = A |
| $dQ_{i-1} < j$ | 3 | A' = B | B' = B × S + A |

TABLE 6-2

Calculation table in the normal mode
Normal mode

| Calculation unit number | Calculation mode | Calculations | |
|---|---|---|---|
| $0 < j \leq dQ_{i-1}$ | 4 | A' = B × S + A | B' = B |
| $dQ_{i-1} < j \leq dR_{i-1}$ | 5 | A' = A | B' = B |
| $dR_{i-1} < j$ | 6 | A' = A | B' = A × S + B |

TABLE 6-3

Calculation table in the shift mode
Shift mode

| Calculation unit number | Calculation mode | Calculations | |
|---|---|---|---|
| All j | 5 | A' = A | B' = B |

In one step, the calculations indicated in the above tables 6-1 through 6-3 are carried out in $L_{opt}$ clock cycles using the $K_{opt}$ calculation units $9_1$ through $9_{Kopt}$. The calculation unit 9K having a calculation unit number K effects calculations on the coefficients stored in the registers $7_{(K-1).Lopt+1}$ through $7_{K.Lopt}$, $8_{(K-1).Lopt+1}$ through $8_{K.Lopt}$ having register numbers $(K-1).L_{opt+1}$ through $K.L_{opt}$.

the first clock cycle, and hold the stored results during the second through $L_{opt}$th clock cycles.

The registers $7_{Lopt}$, $7_{2.Lopt}$, $7_{3.Lopt}$, ... disposed in the junctions between the calculation units $9_1$ through $9_{Kopt}$ store the results of calculations output from the calculation units $9_2$ through $9_{Kopt}$ only in the first clock cycle, and hold the stored result during the second through $L_{opt}$th clock cycles.

The calculation units $9_2$ through $9_{Kopt}$ operate in the same manner. In each clock cycle, the calculation units $9_2$ through $9_{Kopt}$ determine calculations to be executed, using the tables 6-1 through 6-3, from parameters including a calculation unit number K, a register number L storing data to be calculated, the value in the register DR, and an operation mode.

Using the above calculation process and the process of storing data in the registers $7_0$ through $7_{2t}$, $8_0$ through $8_{2t+1}$, the values obtained after the $L_{opt}$ clock cycles when the calculations in one step are finished are the same as the values stored in the registers when the calculations in one step are finished according to the method D.

By repeating the procedure for finishing the calculations in one step 2t times in the $L_{opt}$ clock cycles, desired $\sigma(X)$, $\omega(X)$ can be obtained.

The calculation units $9_1$ through $9_{Kopt}$ may be of the same arrangement as the calculation units according to the method D. That is, each of the calculation units $9_1$ through $9_{Kopt}$ may be composed of three data path switchers 20 through 22, a multiplier 25, and an adder 26 as shown in FIG. 22.

The detailed arrangement of the calculation units $9_1$ through $9_{Kopt}$, the calculations in the shift mode, and the process for storing data in the registers may be identical to those which have been described above with respect to the method D.

Figure 22:
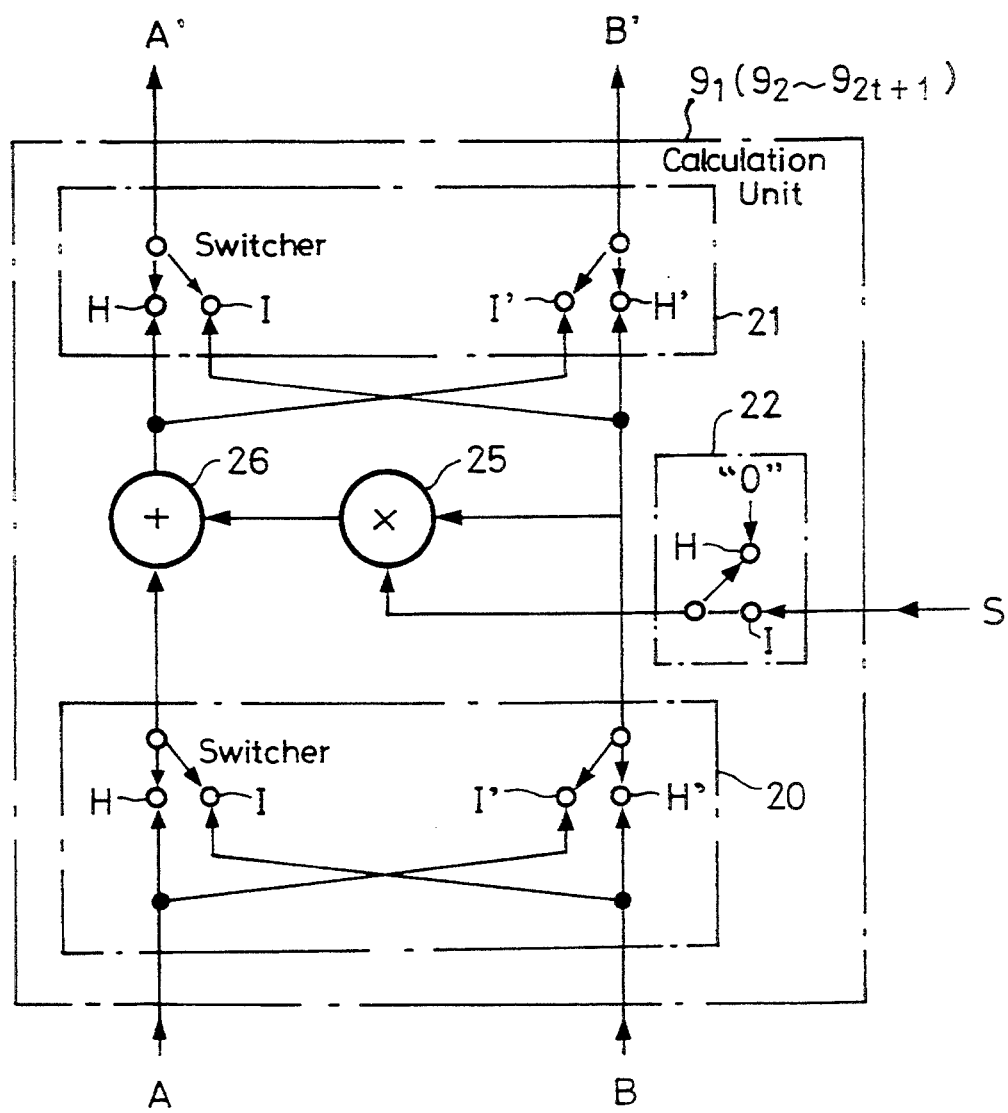
FIG. 22 is a detailed circuit diagram of each calculation unit in the Euclidean mutual division circuit shown in FIG. 21.

Operation of the Euclidean mutual division circuit shown in FIG. 21, which is composed of the calculation units $9_1$ through $9_{Kopt}$ shown in FIG. 22, is shown by way of example in FIGS. 23 through 35. The illustrated example is the same as the example described above in which t=2 symbols are error-corrected using a finite field GF($2^4$) that is defined using an irreducible polynomial $g(X)=X^4+X+1$.

In this example, the degree $L_{opt}$ of multiplexing is set to 3. Therefore, with the calculations in one step being carried out in 3 clock cycles, the calculations in 2t = 4 steps are completed in $2t \cdot L_{opt}=12$ clock cycles.

The number $K_{opt}$ of calculation units is given by:

$$K_{opt} = [2t/K_{opt}] + 1 \quad (46)$$
$$= [2 \cdot 2/3] + 1$$
$$= 2.$$

It is assumed that all the registers $7_0$ through $7_5$, $8_0$ through $8_6$ shown in FIG. 23 have been initialized.

Figure 24:
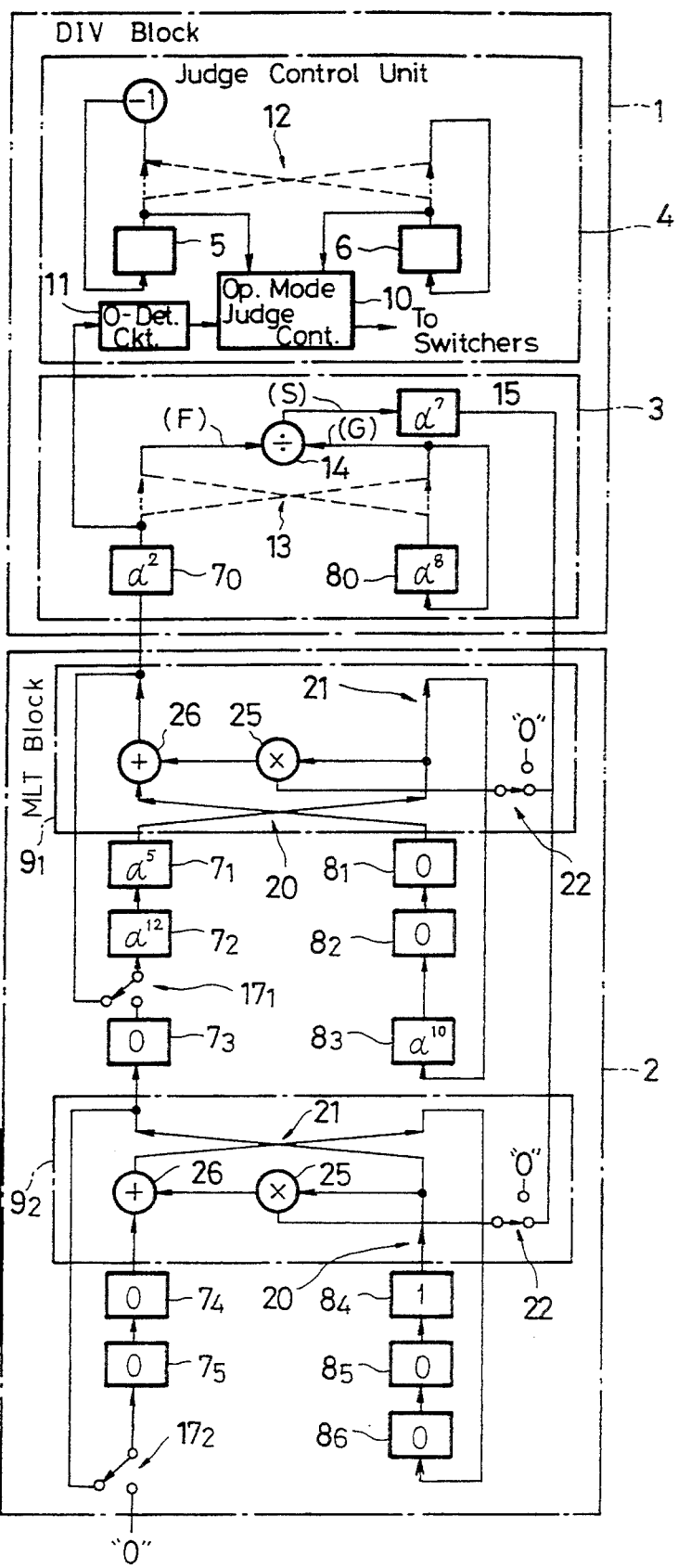
Figure 25:
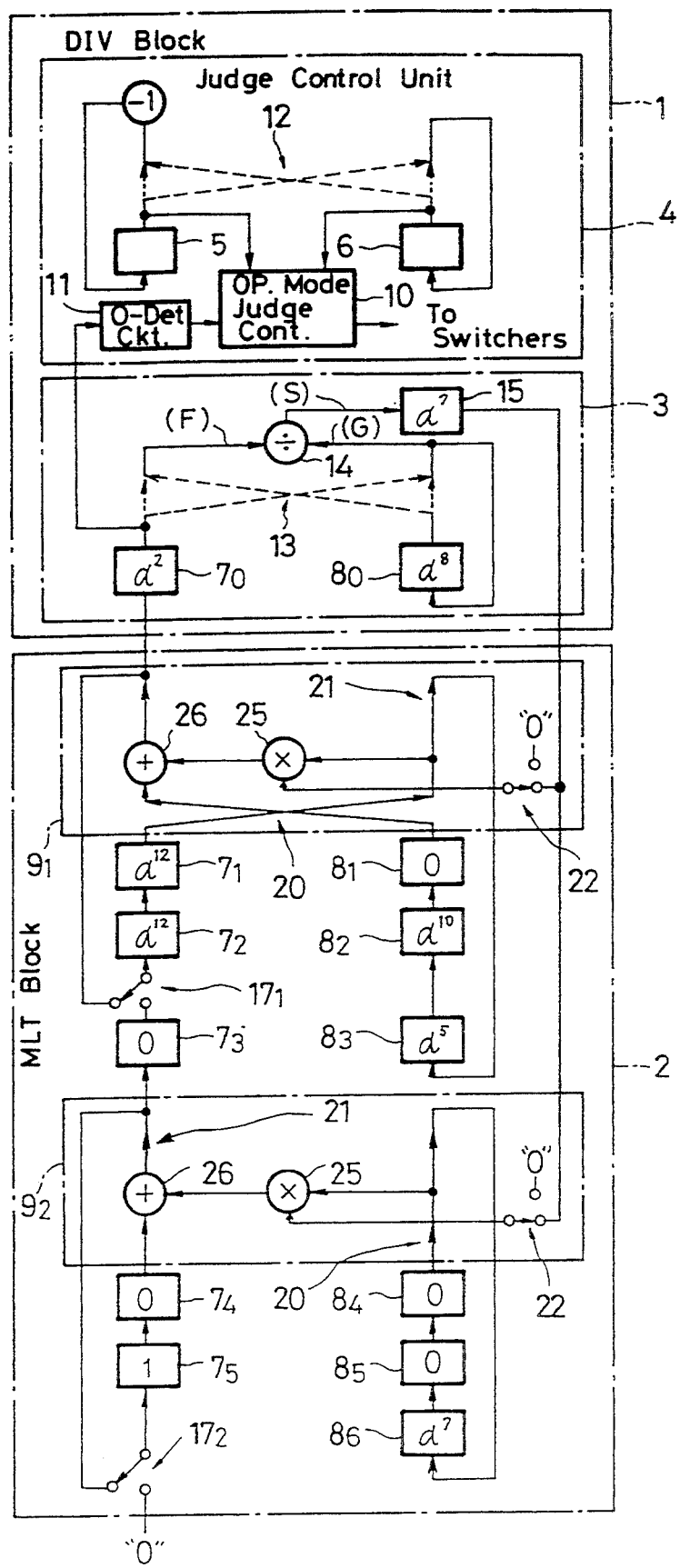

In a first step shown in FIGS. 23 through 25, since the value (dR$_0$) of DR stored in the register 5 is 3, and the value (dQ$_0$) of DQ stored in the register 6 is 4, the condition DR<DQ is satisfied, and the coefficient of degree dR$_0$ of R$_0$(X) stored in the register $141_0$ is $\alpha^8$ which is nonzero. Therefore, the operation mode is determined as the cross mode. The data path switcher 13 on the input side of the divider 14 is switched into the cross state, and the data path switcher 12 on the input side of the registers 5, 6 is switched into the cross state. The divider 14 carries out a calculation $1/\alpha^8$. The result $S=\alpha^7$ of division is output and stored in the register 15.

When the operation mode in the first step is determined as the cross mode, the operation mode and the result S of division stored in the register 15 are maintained during $L_{opt}=3$ clock cycles in which the calculations in the first step are carried out.

According to the table 6-1, the data stored in the registers whose register number is j are calculated in one of three different calculation modes depending on whether the register number j is in the range of $0<j \leq dR_{i-1}$, $dR_{i-1}<j\leq dQ_{i-1}$, or $dQ_{i-1}<j$.

In the first step shown in FIGS. 23 through 25, since dR$_0$=3, dQ$_0$=4, the data stored in the registers $7_1$ through $7_3$, $8_1$ through $8_3$ whose register numbers are 1 through 3 are subjected to calculations indicated by $A'=A\times S+B$ and $B'=A$. For such calculations, in the calculation unit $9_1$, the data path switcher 20 is in the cross state, the data path switcher 21 in the normal state, and the data path switcher 22 in the through state.

The data stored in the registers $7_4$, $8_4$ whose register number is 4 are subjected to calculations indicated by $A'=B$ and $B'=A$. For such calculations, in the calculation unit $9_2$, the data path switcher 20 is in the cross state, the data path switcher 21 in the normal state, and the data path switcher 22 in the clear state.

The data stored in the remaining registers $7_5$, $8_5$, $8_6$ whose register numbers are 5 and 6 are subjected to calculations indicated by $A'=B$ and $B'=B\times S+A$. For such calculations, in the calculation unit $9_2$, the data path switcher 20 is in the normal state, the data path switcher 21 in the cross state, and the data path switcher 22 in the through state.

In the first step, the first clock cycle shown in FIG. 23, the calculation units $9_1$, $9_2$ carry out calculations the coefficients stored in the registers $7_1$, $7_4$, $8_1$, $8_4$ whose register numbers are 1 and 4. Since the calculation unit $9_1$ effects calculations indicated by $A'=A\times S+B$, $B'=A$, the data path switcher 20 is in the cross state, the data path switcher 21 in the normal state, and the data path switcher 22 in the through state. Since the calculation unit $9_2$ effects calculations indicated by $A'=B$, $B'=A$, the data path switcher 20 is in the cross state, the data path switcher 21 in the normal state, and the data path switcher 22 in the clear state.

The data path switchers $17_1$, $17_2$ for the calculation units $9_1$, $9_2$ operate as shown in FIG. 23.

Since FIG. 23 shows the first clock cycle, the data path switchers $17_1$, $17_2$ are switched into the shift state. The results of calculations output from the output terminals A' of the calculation units $9_1$, $9_2$ are stored respectively in the registers $7_0$, $7_3$, and are held thereby for successive 3 clock cycles. Similarly, the register $8_0$ stores the value of the register $7_0$, and holds the stored value for successive 3 clock cycles.

The results of calculations output from the output terminals B' of the calculation units $9_1$, $9_2$ are stored respectively in the registers $8_3$, $8_6$, and are shifted in each clock cycle.

The results of calculations are stored in the registers $7_0$ through $7_5$, $8_0$ through $8_6$ as shown in FIG. 24.

The statuses of the registers shown in FIG. 24, which represent the results of calculations illustrated in FIG. 23, are indicative of only the completed calculations on the data stored in the registers $7_1$, $8_1$ with the register number 1 and the registers $7_4$, $8_4$ with the register number 4 among the calculations in the first step.

In the calculations following those shown in FIG. 24, i.e., in the first step, the second clock cycle, the calculation units $9_1$, $9_2$ effect calculations on the coefficients stored in the registers $7_2$, $8_2$ with the register number 2 and the registers $7_5$, $8_5$ with the register number In order for the calculation unit $9_1$ to effect calculations indicated by $A'=A\times S+B$, $B'=A$ as in the first clock cycle, the data path switcher 20 is switched into the cross state, the data path switcher 21 into the normal state, and the data path switcher 22 into the through state. In order for the calculation unit $9_2$ to effect calculations indicated by $A'-B$, $B'=B\times S+A$, the data path switcher 20 is switched into the normal state, the data path switcher 21 into the cross state, and the data path switcher 22 into the through state.

Since the clock cycle shown in FIG. 24 is not the first clock cycle, the data path switchers $17_1$, $17_2$ are switched into a loop state. The results of calculations output from the output terminals A' of the calculation units $9_1$, $9_2$ are stored respectively in the registers $7_2$, $7_5$, and are shifted in each clock cycle.

The results of calculations output from the output terminals B' of the calculation units $9_1$, $9_2$ are stored respectively in the registers $8_3$, $8_6$ as in the first clock cycle, and are shifted in each clock cycle.

The results of calculations are stored in the registers $7_0$ through $7_5$, $8_0$ through $8_6$ as shown in FIG. 25.

The statuses of the registers shown in FIG. 25, which represent the results of calculations illustrated in FIG. 24, indicate the completed calculations on the data stored in the registers $7_1$, $7_2$, $7_4$, $7_5$, $8_1$, $8_2$, $8_4$, $8_5$ with the register numbers 1, 2, 4, 5 among the calculations in the first step.

The calculations shown in FIG. 25 are those in the first step, the third clock cycle.

The third clock cycle is the final clock cycle in the first step. The calculation unit $9_1$ carries out calculations the coefficients stored in the registers $7_3$, $8_3$ whose register number is 3. Since the calculation unit $9_1$ effects calculations indicated by A'=A×S+B, B'=A as in the first and second clock cycles, the data path switcher 20 is in the cross state, the data path switcher 21 in the normal state, and the data path switcher 22 in the through state.

Since the clock cycle shown in FIG. 25 is not the first clock cycle, the data path switchers $17_1$, $17_2$ are switched into the loop state. The results of calculations are stored respectively in the registers $7_2$, $7_5$.

The register $8_6$ whose register number is 6 stores 0 that is not required to be calculated. Therefore, the data stored in the register $8_6$ may not be calculated. The calculation unit $9_1$ may simply effect calculations indicated by A'=A, B'=B, and the data path switcher 20 may be in the normal state, the data path switcher 21 in the normal state, and the data path switcher 22 in the clear state. The data 0 which is stored in the register $8_6$ which is inserted for the sake of convenience is stored in the register $7_5$.

When the statuses shown in FIG. 26 of the registers $7_0$ through $7_5$, $8_0$ through $8_6$, which indicate the results of the calculations shown in FIG. 25, are reached, the calculations in the first step are finished. Comparison between FIG. 26 and FIG. 17 which shows the statuses after the first step is finished according to the method D indicates that the values of the registers in FIGS. 26 and 17 are the same as each other.

According to the method D, the values in the A-side registers $141_0$ through $141_4$ are shifted once toward the high-order location in each clock cycle. According to the method of the second embodiment, however, the values in the A-side registers $7_0$ through $7_5$ are shifted once for the first time in $L_{opt}=3$ clock cycles.

Figure 27:
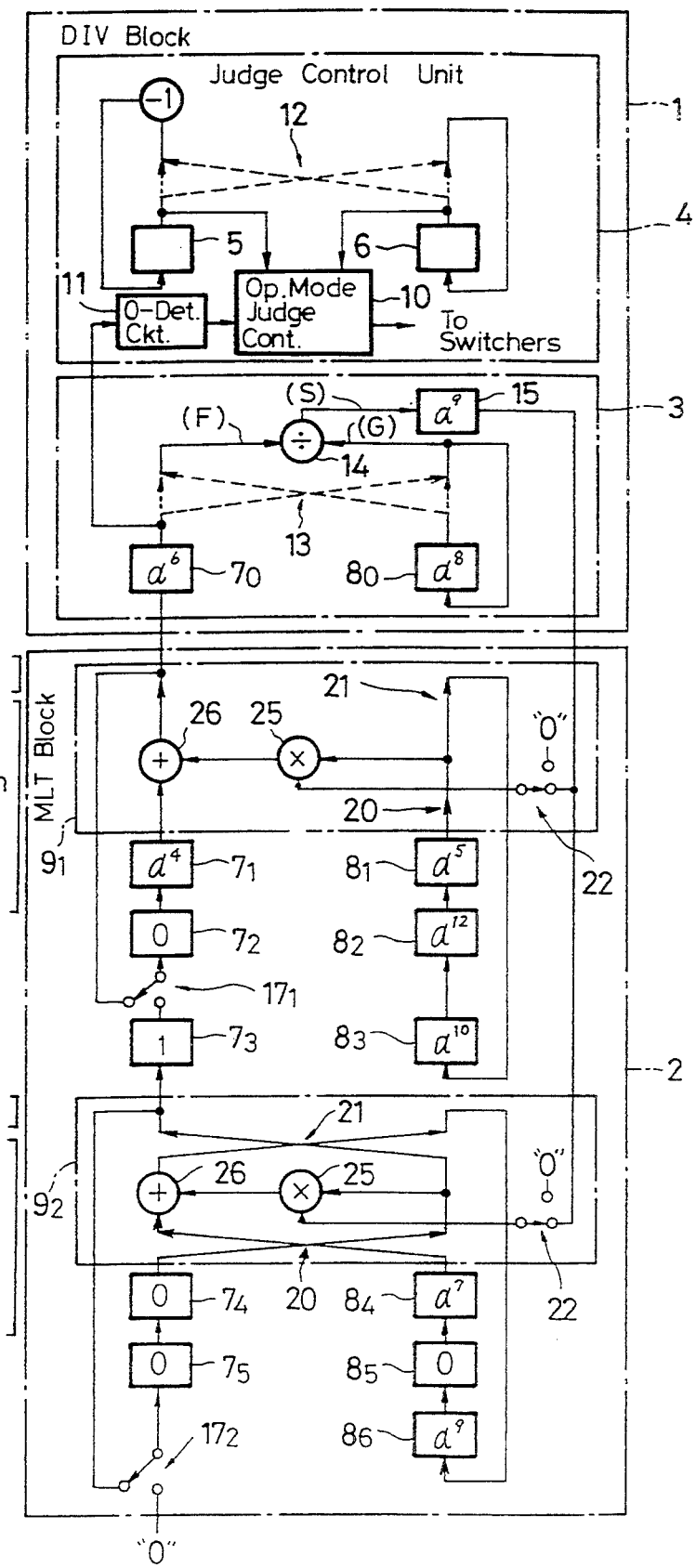

The calculations in the second steps are carried as shown in FIGS. 26 through 28. In the second step, since the value ($dR_1$) in the register 5 is 3 and the value ($dQ_1$) in the register 6 is 3, with DR≧DQ, the operation mode is recognized as the normal mode. The data path switcher 13 on the input side of the divider 14 is switched into the normal state, and the divider 14 carries out a calculation $\alpha^2/\alpha^8$. The result $S=\alpha^9$ of division is output to the calculation units $9_1$, $9_2$.

In FIGS. 26 through 28, the calculations are carried out in the normal mode. Consequently, the calculations are carried out according to the calculation table 6-2 in the normal mode.

In the calculations in the second step shown in FIGS. 26 through 28, the data stored in the registers $7_1$ through $7_3$, $8_1$ through $8_3$ whose register numbers are 1 through 3 are subjected to calculations indicated by A'=B×S+A and B'=B. For such calculations, in the calculation unit $9_1$, the data path switcher 20 is in the normal state, the data path switcher 21 in the normal state, and the data path switcher 22 in the through state.

The data stored in the remaining registers $7_4$, $7_5$, $8_4$, $8_5$, $8_6$ whose register numbers are 4, 5, and 6 are subjected to calculations indicated by A'=A and B'=A×S+B. For such calculations, the data path switcher 20 is in the cross state, the data path switcher 21 in the cross state, and the data path switcher 22 in the through state.

The calculations on the data in the registers $7_0$ through $7_5$, $8_0$ through $8_6$ in the second step are effected separately in three clock cycles. More specifically, the coefficients stored in the registers $7_1$ through $7_3$, $8_1$ through $8_3$ whose register numbers are 1, 2, and 3 are calculated successively in each clock cycle by the calculation unit $9_1$, and the coefficients stored in the registers $7_4$ through $7_6$, $8_4$ through $8_6$ whose register numbers are 4, 5, and 6 are calculated successively in each clock cycle by the calculation unit $9_2$.

FIG. 29 shows the values stored in the registers $7_0$ through $7_5$, $8_0$ through $8_6$ after the calculations in the second step are finished. It can be seen that the stored values are the same as those values which are stored in the registers after the second step is finished according to the method D as shown in FIG. 18.

Figure 30:
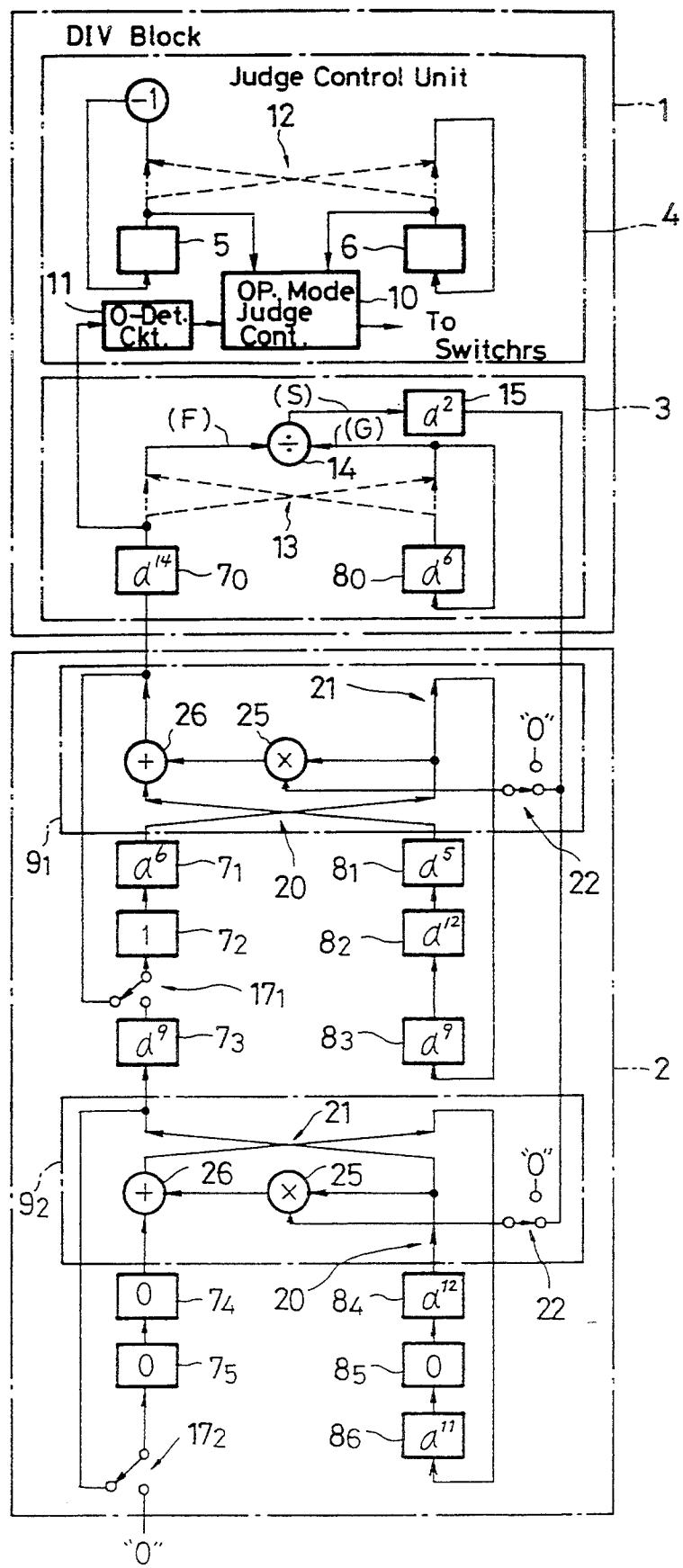
Figure 31:
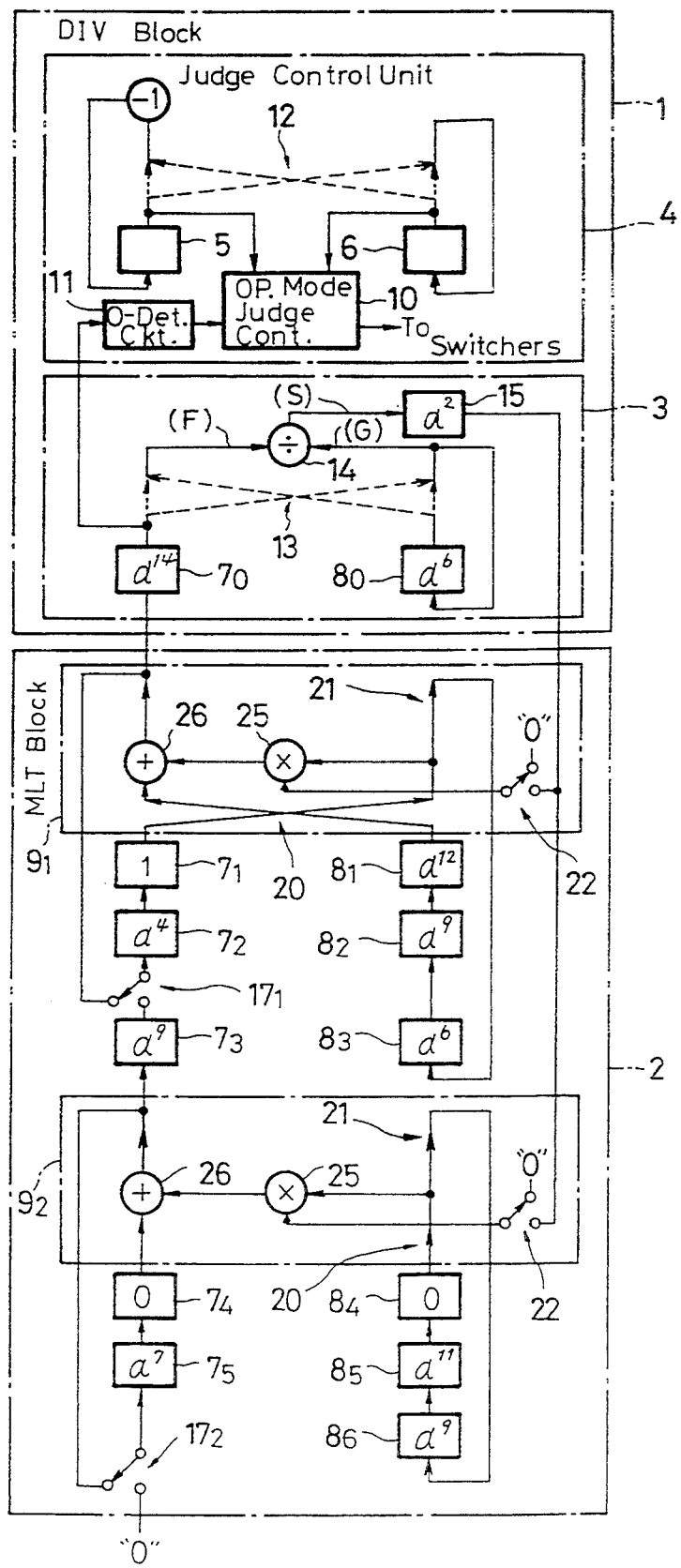
Figure 33:
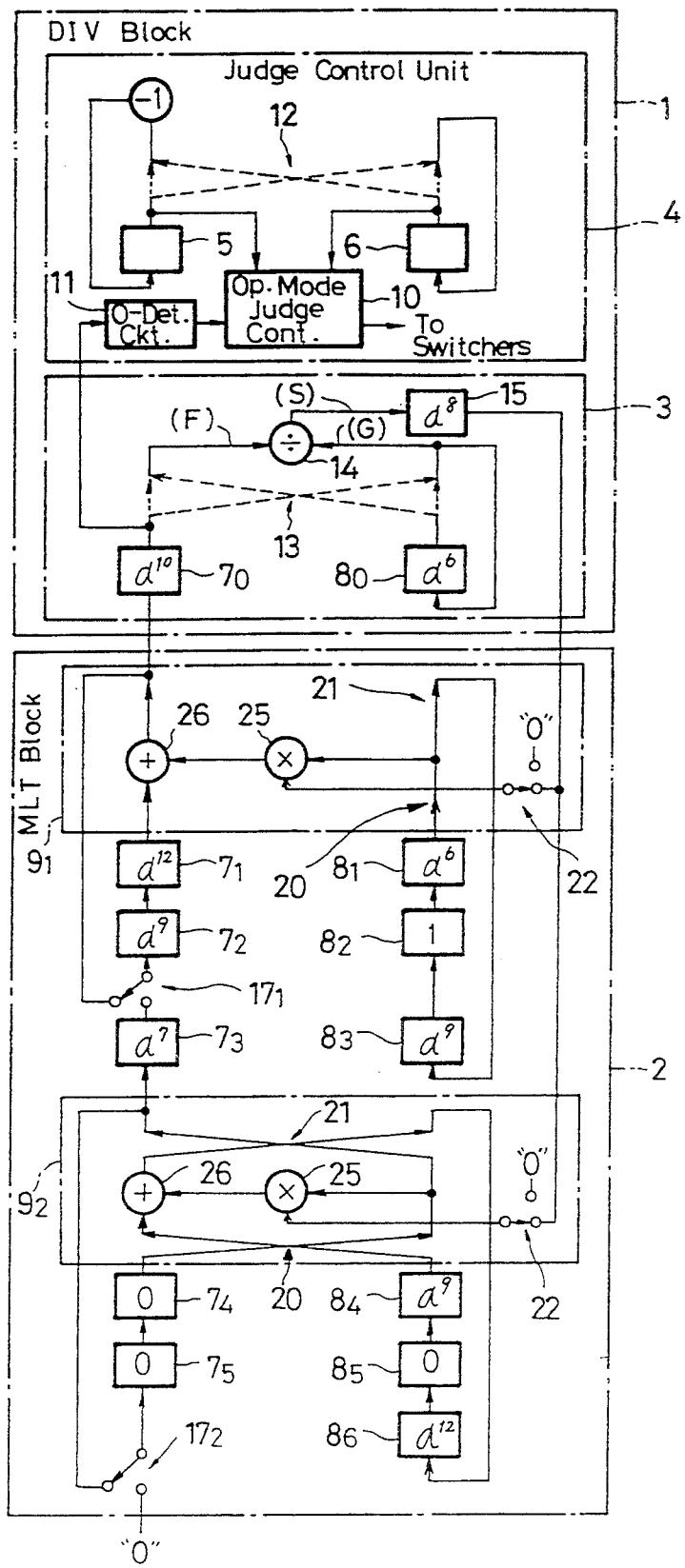
Figure 34:
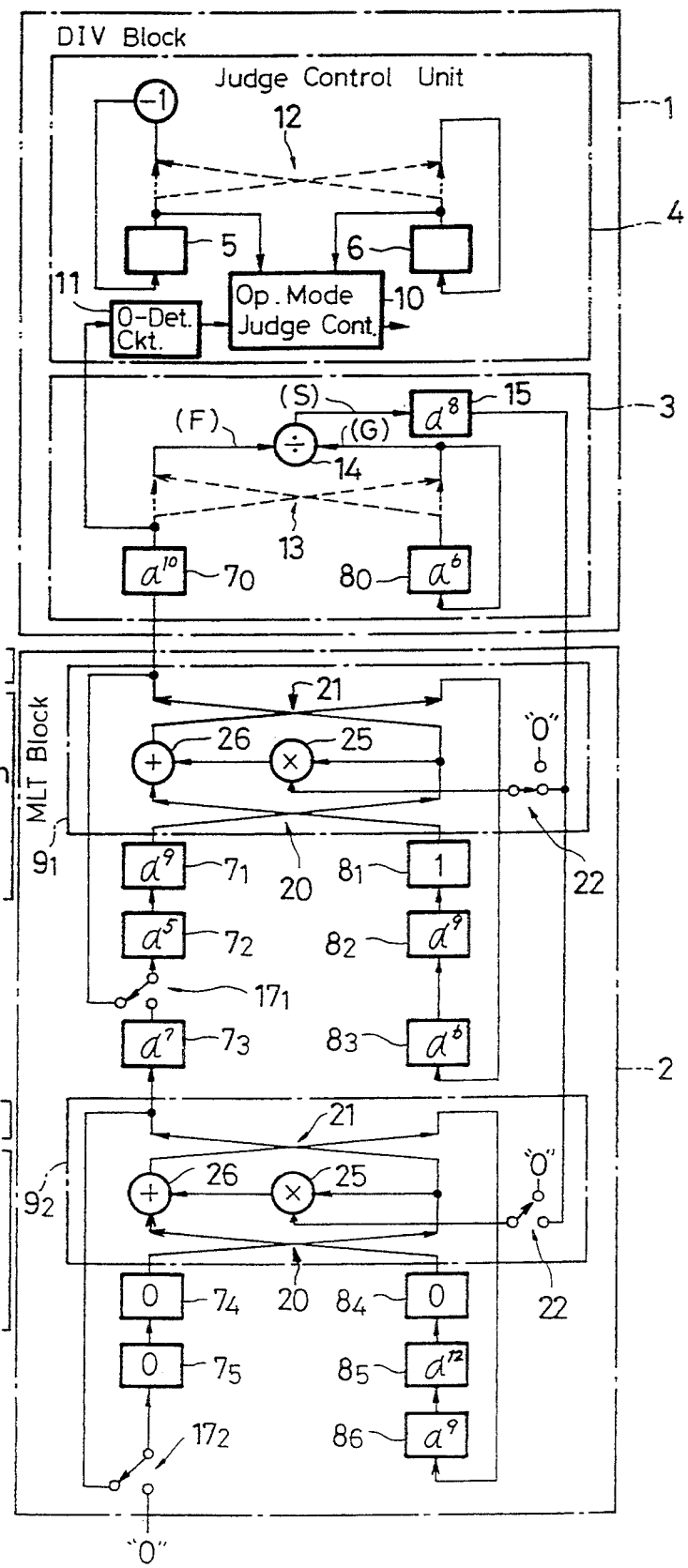
Figure 35:
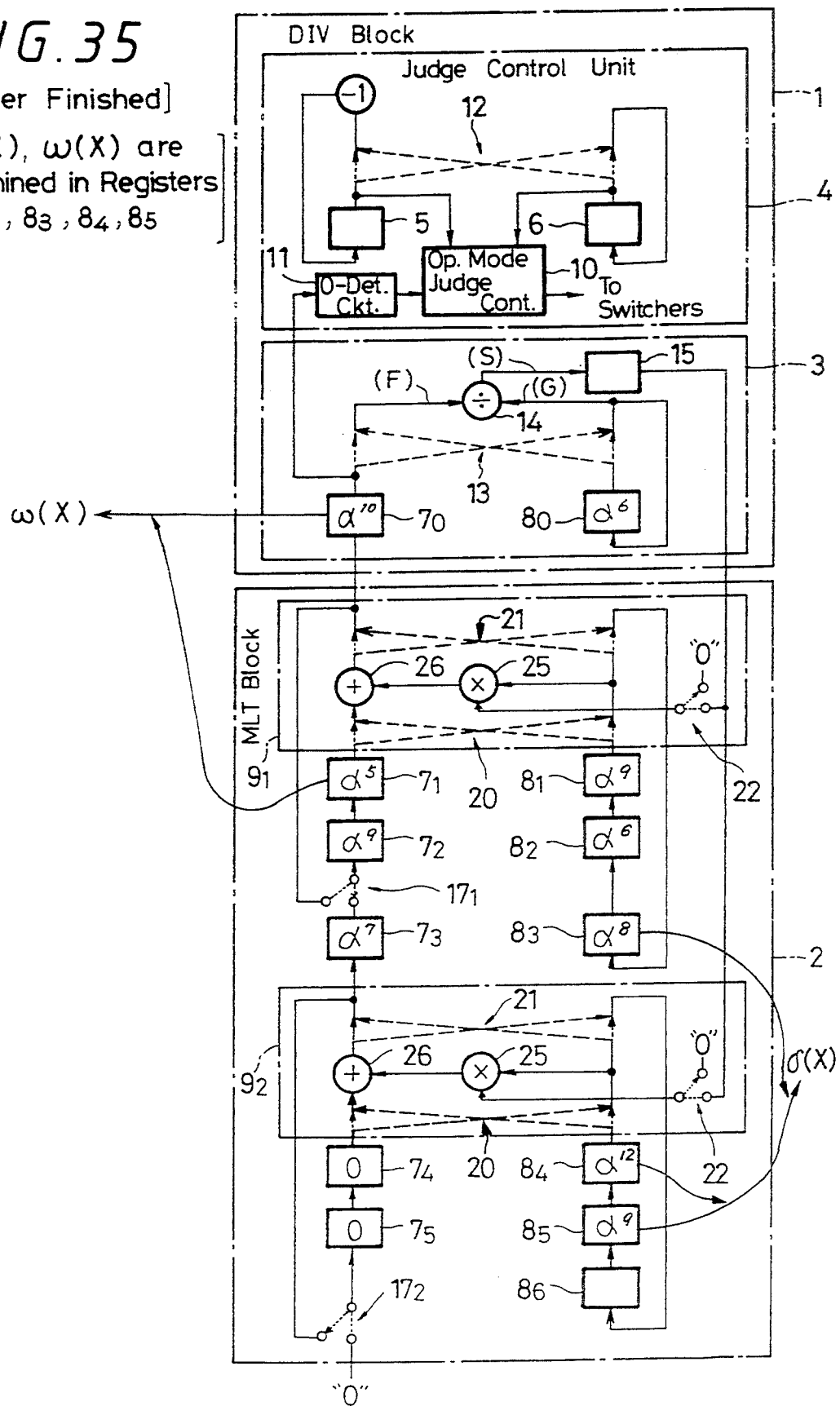

The third step shown in FIGS. 29 through 31 is then performed in the cross mode, and the fourth step shown in FIGS. 32 through 34 is performed in the normal mode, until finally polynomials $\sigma(X)$, $\omega(X)$ are obtained as shown in FIG. 35. It should be noted that the coefficients of the polynomials $\sigma(X)$, $\omega(X)$ thus obtained are identical to the coefficients that are obtained according to the method D as shown in FIG. 20.

The method according to the second embodiment carries out exactly the same calculations as those according to the method D. However, by repeatedly using the calculation units $9_1$ through $9_{Kopt}$ in a time-division multiplexing manner with the degree $L_{opt}$ of multiplexing with respect to the calculations in one step, the calculations are carried out with the number $K_{opt}=[2t/K_{opt}]+1$ of calculation units which is smaller than the number of calculation units according to the method D. Instead, the number of clock cycles required for the calculations in one step increases to $L_{opt}$.

The method according to the second embodiment is the same as the method D in that the algorithm is achieved by (2t+1) calculations, the number of which is greater, by 1, than the minimum number 2t of calculations (multiplications) required in principle per step of the Euclidean mutual division method. However, the calculations are carried out with the number $K_{opt}=[2t/K_{opt}]+1$ of calculation units which is smaller than the number of calculation units according to the method D, by repeatedly using the calculation units in a time-division multiplexing manner with the degree $L_{opt}$ of multiplexing with respect to the calculations in one step.

In the above second embodiment, the degree $L_{opt}$ of multiplexing is $L_{opt}=3$. If the degree $L_{opt}$ of multiplexing is increased, then the number $K_{opt}$ of calculation units is reduced. When the degree $L_{opt}$ of multiplexing varies, the number $L_{opt}$ of calculation units varies as indicated by the following table 7:

TABLE 7

The degree of multiplexing and the number of calculation units

| Degree of multiplexing | Number $K_{opt}$ of calculation units |
|---|---|
| 2 | 3 |
| 3 | 2 |
| 4 | 2 |
| 5 | 1 |

As can be seen from the table 7, as the degree $L_{opt}$ of multiplexing increases, the number $L_{opt}$ of calculation units decreases. Since the number of registers is equal to $4t+3$ at all times, the greater the degree $L_{opt}$ of multiplexing, the smaller the circuit scale of the Euclidean mutual division circuit. According to the method of the second embodiment, the circuit scale can greatly be reduced by selecting an optimum degree $L_{opt}$ of multiplexing according to specifications require for an error-correcting system.

The number $K_{opt}$ of calculation units remains the same if the degree of multiplexing is either 3 or 4. Inasmuch as the number of calculation clock cycles is smaller to greater advantage if the degree $L_{opt}$ of multiplexing is smaller, calculations can be carried out with the same number $K_{opt}$ of calculation units in a smaller number of clock cycles when the degree $L_{opt}$ of multiplexing is set to 3.

According to the second embodiment, the number of registers $7_0$ through $7_5$, $8_0$ through $8_6$ used is greater, by 2, than the number $(4t+3)=11$ which is essentially required. This is only for the sake of convenience for an easier understanding of the calculations. Actually, the register 86 whose register number is 6 stores 0 and hence the data stored in the register $8_6$ is not required to be calculated. Therefore, by slightly modifying the process of controlling the calculation unit $9_2$, it is possible to simply construct the Euclidean mutual division circuit of $(4t+3)$ registers whose number is a minimum number based on the operating principles.

In the method according to the second embodiment, there are various ways of initializing the registers $7_0$ through $7_{2t}$, $8_0$ through $8_{2t+1}$. In this regard, the same description as with the method D applies. More specifically, if selectors are connected to the input terminals of the registers $7_0$ through $7_{2t}$, $8_0$ through $8_{2t+1}$, then it is possible to initialize all the registers at the same time. Alternatively, the registers can be successively initialized by serially inputting initial values of respective polynomials as inputs to low-order registers, i.e., only the registers $7_{2t}$, $8_{2t+1}$, for respective polynomials.

Furthermore, the register 15 for storing the result of division from the divider 14 stores the value once in $L_{opt}$ clock cycles. Inputs F, G to be actually divided by the divider 14 are of constant values in $L_{opt} - 1$ clock cycles before the result of division is stored in the register 15. For example, in FIG. 26, the result $\alpha^9$ of division in the normal mode is stored in the register 15, and $\alpha^2$ and $\alpha^8$ which correspond to the inputs F, G are stored in the registers $7_0$, $8_0$ at the time of FIG. 24 which is $L_{opt}-1 = 2$ clock cycles before. Therefore, the operation mode in the second step may be determined and the division may be started in the second clock cycle in the first step.

Generally, for the degree $L_{opt}$ of multiplexing, the $L_{opt} - 1$ clock cycles may be consumed to determine the operation mode and effect the division.

Usually, the speed of divisions is much lower than the speeds of multiplications and additions. According to the method D, the operation speed is governed by the speed of divisions, and the circuit cannot operate at high speed.

According to the method of the second embodiment, however, by the degree $L_{opt}$ of multiplexing to a suitable value matching the speed of operation of the divider 14, then the calculation units $9_1$ through $9_{Kopt}$ can be used efficiently even if the divider 14 is slow. Therefore, even if a slow divider 14 is used, the entire system can operate at high speed.

As described above, the degree of multiplexing may be increased to reduce the number of calculation units for achieving a large reduction in the circuit scale and for high-speed operation for an increased throughput.

Having described preferred embodiments of the invention with reference to the accompanying drawings, it is to be understood that the invention is not limited to that precise embodiments and that various changes and modifications could, be effected by one skilled in the art without departing from the spirit or scope of the invention as defined in the appended claims.

What is claimed is:

1. A Euclidean mutual division circuit comprising:
a control unit for generating a switching command indicative of one of a normal connection and a cross connection based on a comparison of a predetermined initial value and a value stored in a register in a division unit, and supplying the generated switching command to a plurality of calculation devices and said division unit;
said plurality of calculation devices each composed of two registers for storing coefficients of polynomials $R_i(X)$, $Q_i(X)$, $\lambda_i(X)$, $\mu_i(X)$ and a calculation unit, said plurality of calculation devices being cascaded in a number corresponding to one more than a minimum number of calculations per step of a Euclidean mutual division, for receiving a result of division and a value output from a preceding stage, and responsive to the switching command for effecting one of a normal-connection calculation and a cross-connection calculation; and
said division unit having two registers for storing coefficients of polynomials $R_i(X)$, $Q_i(X)$, $\lambda_i(X)$ and $\mu_i(X)$, and a divider, for receiving a value output from a final stage of said plurality of calculation devices, effecting one of a normal-connection division and a cross-connection division in response to the switching command, and supplying the result of division to each of said plurality of calculation devices.

2. A Euclidean mutual division circuit comprising:
a control unit for generating a switching command indicative of one of a normal connection, a cross connection, and a shift connection based on a comparison of a predetermined value and a value stored in a first register in a division unit, and supplying the generated switching command to an MLT block and a division unit;
said MLT block having a group of A-side registers divided depending on a degree of multiplexing for storing coefficients of polynomials $R_i(X)$ and $Q_i(X)$, a group of B-side registers divided depending on said degree of multiplexing for storing coefficients of polynomials $\lambda_i(X)$, $\mu_i(X)$, and a number of calculation units depending on said degree of multiplexing, said MLT block being capable of receiving a result of division and values output from A-side and B-side registers, and responsive to the switching command for effecting one of a normal-connection calculation, a cross-connection calculation, and a shift-connection calculation during a clock cycle in each step of a Euclidean mutual division; and said division unit having a second register for storing $R_i(X)$, $Q_i(X)$, a third register for storing $\lambda_i(X)$, $\mu_i(X)$ and a divider for dividing coefficients stored in the second and third registers, for receiving a value output from a final stage of said MLT block, effecting one of a normal-connection division and a cross-connection division in response to the switching command, and supplying the result of division to each of said calculation units when a step of said Euclidean mutual division is finished.

3. A Euclidean mutual division circuit according to claim 1 or 2, wherein said division unit includes at least a pair of A-side and B-side registers, and values produced by dividing coefficients stored in said pair of A-side and B-side registers are returned to each of said calculation units.

4. A Euclidean mutual division circuit according to claim 3, wherein said division unit and said control unit each have at least one switcher for switching connections in said division unit and said control unit in response to said switching command.

5. A Euclidean mutual division circuit according to claim 4, wherein said result of division represents values of at least one of an error locator polynomial and an error evaluator polynomial.

6. A Euclidean mutual division circuit according to claim 5, wherein said Euclidean mutual division circuit is used for error-correcting a digital signal, said A-side registers including at least $(2t+1)$ registers and said B-side registers including at least $(2t+2)$ registers, totaling at least $(4t+3)$ registers, where t is the number of symbols that can be error-corrected.

* * * * *